(12) United States Patent
Taura

(10) Patent No.: US 10,887,540 B2
(45) Date of Patent: Jan. 5, 2021

(54) SOLID-STATE IMAGING APPARATUS, METHOD FOR DRIVING SOLID-STATE IMAGING APPARATUS, AND ELECTRONIC EQUIPMENT

(71) Applicant: SONY SEMICONDUCTOR SOLUTIONS CORPORATION, Kanagawa (JP)

(72) Inventor: Tadayuki Taura, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/325,277

(22) PCT Filed: Aug. 8, 2017

(86) PCT No.: PCT/JP2017/028674
§ 371 (c)(1),
(2) Date: Feb. 13, 2019

(87) PCT Pub. No.: WO2018/037902
PCT Pub. Date: Mar. 1, 2018

(65) Prior Publication Data
US 2019/0208151 A1     Jul. 4, 2019

(30) Foreign Application Priority Data

Aug. 22, 2016   (JP) ................................ 2016-161893

(51) Int. Cl.
*H04N 5/378* (2011.01)
*H04N 5/3745* (2011.01)
(Continued)

(52) U.S. Cl.
CPC ............. *H04N 5/378* (2013.01); *G11C 19/28* (2013.01); *H03M 1/34* (2013.01); *H04N 5/379* (2018.08);
(Continued)

(58) Field of Classification Search
CPC .. H04N 5/378; H04N 5/3745; H04N 5/37455; H04N 5/3765; H04N 5/379; H03K 5/2481
See application file for complete search history.

(56) References Cited

U.S. PATENT DOCUMENTS 6,806,744 B1   10/2004   Bell et al.
7,015,844 B1 *   3/2006   Boemler ............... H03M 1/403
                                                                                    341/143
(Continued)

FOREIGN PATENT DOCUMENTS

JP       2010-109937       5/2010
JP       2015-139081       7/2015
WO     WO 2016/009832     1/2016

OTHER PUBLICATIONS

Yang et al., "A Nyquist Rate Pixel Level ADC for CMOS Image Sensors," Proceedings of the IEEE 1998 Custom Integrated Circuits Conference, May 14, 1998, 4 pages.
(Continued)

*Primary Examiner* — Ahmed A Berhan
(74) *Attorney, Agent, or Firm* — Sheridan Ross P.C.

(57) ABSTRACT

The present disclosure relates to a solid-state imaging apparatus, a method for driving the solid-state imaging apparatus, and electronic equipment for improving the determination speed of comparators and allowing the comparators to operate faster. A differential input circuit operates on a first power supply voltage and outputs a signal when a voltage of a pixel signal is higher than a voltage of a reference signal. A voltage conversion circuit converts the output signal from the differential input circuit into a signal corresponding to a second power supply voltage. A positive feedback circuit accelerates a transition rate at which a comparison result signal of a comparison in voltage between the pixel signal and the reference signal is inverted. Multiple time code
(Continued)

transfer sections each include a shift register that transfer a time code. The present disclosure can be applied, for example, to an imaging apparatus including A/D converters disposed in pixels.

20 Claims, 33 Drawing Sheets

(51) Int. Cl.
    *H04N 5/376*     (2011.01)
    *H04N 5/369*     (2011.01)
    *G11C 19/28*     (2006.01)
    *H03M 1/34*     (2006.01)
    *H03K 19/0185*     (2006.01)
    *H03K 5/24*     (2006.01)
    *H03K 3/356*     (2006.01)

(52) U.S. Cl.
    CPC ......... *H04N 5/3745* (2013.01); *H04N 5/3765* (2013.01); *H04N 5/37455* (2013.01); *H03K 3/356147* (2013.01); *H03K 5/2481* (2013.01); *H03K 19/018592* (2013.01)

(56) References Cited

U.S. PATENT DOCUMENTS

| | | | |
|---|---|---|---|
| 8,174,427 B2* | 5/2012 | Mashiyama | H04N 5/378 341/136 |
| 2011/0169681 A1 | 7/2011 | Naka et al. | |
| 2011/0215959 A1 | 9/2011 | Matsuzawa et al. | |
| 2013/0215302 A1 | 8/2013 | Ueno | |
| 2015/0208008 A1 | 7/2015 | Gendai | |
| 2017/0272678 A1 | 9/2017 | Sakakibara et al. | |

OTHER PUBLICATIONS

Extended European Search Report for European Patent Application No. 17843387.6, dated Aug. 1, 2019, 7 pages.
International Search Report prepared by the Japan Patent Office dated Oct. 25, 2017, for International Application No. PCT/JP2017/028674.

* cited by examiner

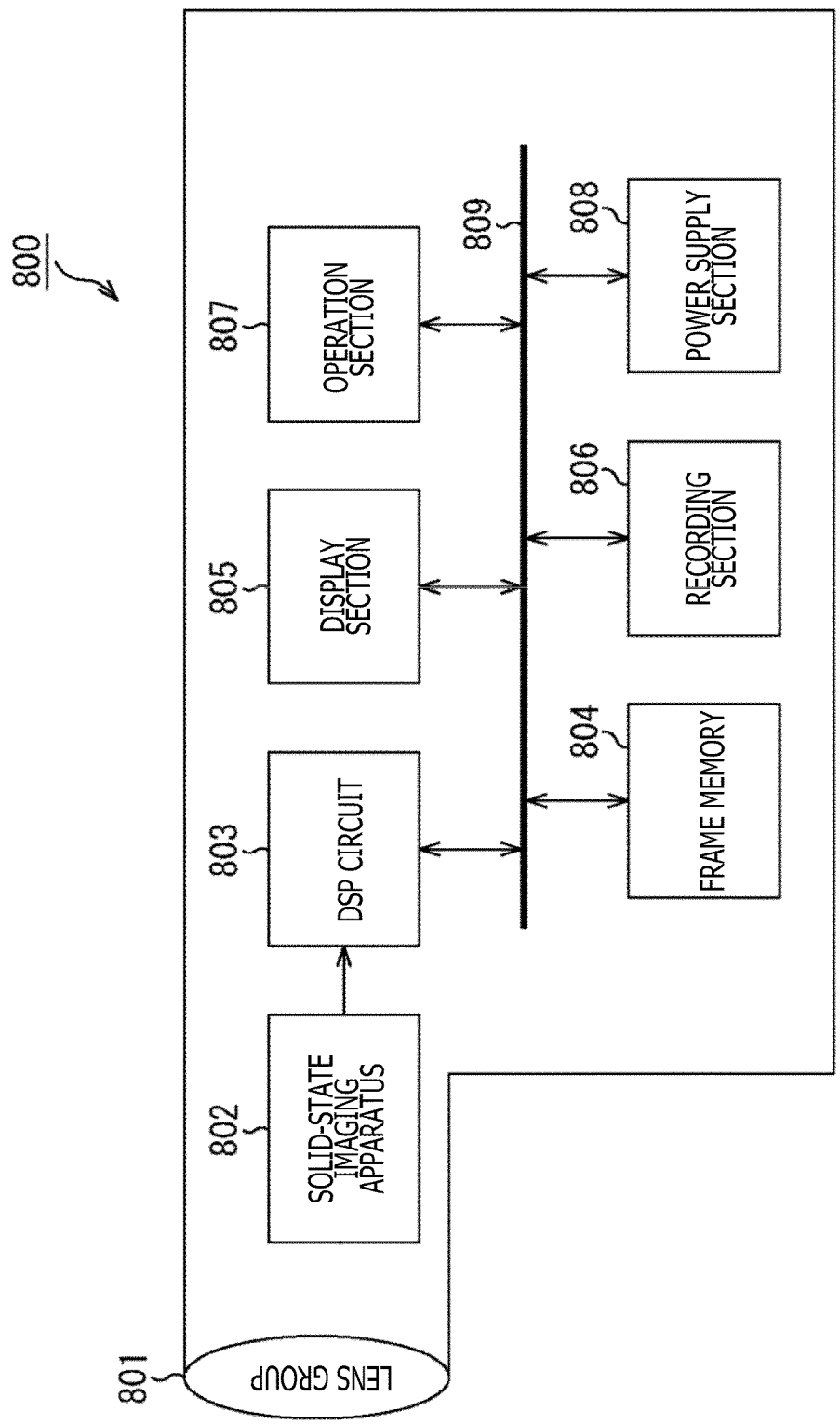

SOLID-STATE IMAGING APPARATUS, METHOD FOR DRIVING SOLID-STATE IMAGING APPARATUS, AND ELECTRONIC EQUIPMENT

CROSS REFERENCE TO RELATED APPLICATIONS

This application is a national stage application under 35 U.S.C. 371 and claims the benefit of PCT Application No. PCT/JP2017/028674 having an international filing date of 8 Aug. 2017, which designated the United States, which PCT application claimed the benefit of Japanese Patent Application No. 2016-161893 filed 22 Aug. 2016, the entire disclosures of each of which are incorporated herein by reference.

TECHNICAL FIELD

The present disclosure relates to a solid-state imaging apparatus, a method for driving the solid-state imaging apparatus, and electronic equipment. More particularly, the disclosure relates to a solid-state imaging apparatus, a method for driving the solid-state imaging apparatus, and electronic equipment for improving the determination speed of comparators and allowing the comparators to operate faster.

BACKGROUND ART

In the case where A/D conversion is to be executed in a limited area such as inside a pixel of a solid-state imaging apparatus, the signal readout method offering the highest area efficiency is the integration type (slope type) A/D conversion method that involves comparators and digital circuits downstream thereof.

NPL 1 proposes techniques involving the use of the integration type A/D conversion method to implement A/D conversion in limited areas. The method of NPL 1 uses, for example, a circuit configuration in which the downstream digital circuits form a single DRAM circuit for inputting a slope signal to the comparator multiple times. If, for example, 8-bit A/D conversion is to be executed, the same slope signal is input to the comparator repeatedly 8 times. Then the operation of causing the DRAM circuit to store a "0" or "1" code at the time the output of the comparator is inverted is repeated 8 times. When the comparison over the whole area is completed, the signal is read out.

CITATION LIST

Non Patent Literature

[NPL 1]
D. Yang, B. Fowler, and A. El Gamal, "A Nyquist rate pixel level ADC for CMOS image sensors," in Proc. IEEE 1998 Custom Integrated Circuits Conf., Santa Clara, Calif., May 1998, pp. 237-240

SUMMARY

Technical Problem

Unlike cases where the degree of freedom in terms of area is relatively high, such as the parallel column layout in which an A/D converter is arranged for each pixel column, the area for housing the circuits is limited in the case where an A/D converter is arranged in each pixel. This makes it difficult to manufacture comparators that fully meet the requirements of the limited circuit housing area. The comparators might be caused to reduce their determination speed, for example.

The present disclosure has been made in view of the above circumstances. An object of the disclosure is therefore to provide techniques for improving the determination speed of comparators.

Solution to Problem

According to a first aspect of the present disclosure, there is provided a solid-state imaging apparatus including an A/D converter and multiple time code transfer sections. The A/D converter includes: a differential input circuit configured to operate on a first power supply voltage and to output a signal when a voltage of a pixel signal is higher than a voltage of a reference signal; a positive feedback circuit configured to operate on a second power supply voltage lower than the first power supply voltage and to accelerate a transition rate at which a comparison result signal indicative of the result of a comparison in voltage between the pixel signal and the reference signal is inverted, on the basis of the output signal from the differential input circuit; a voltage conversion circuit configured to convert the output signal from the differential input circuit into a signal corresponding to the second power supply voltage; and a data storage section configured to store a time code at the time the comparison result signal is inverted. The multiple time code transfer sections each include a shift register configured to transfer the time code.

According to a second aspect of the present disclosure, there is provided a method for driving a solid-state imaging apparatus that has an A/D converter and multiple time code transfer sections. The A/D converter includes a differential input circuit configured to operate on a first power supply voltage, a positive feedback circuit configured to operate on a second power supply voltage lower than the first power supply voltage, a comparator having a voltage conversion circuit, and a data storage section. The multiple time code transfer sections each include a shift register. The method includes: causing the differential input circuit to output a signal when a voltage of a pixel signal is higher than a voltage of a reference signal; causing the voltage conversion circuit to convert the output signal from the differential input circuit into a signal corresponding to the second power supply voltage; causing the positive feedback circuit to accelerate a transition rate at which a comparison result signal indicative of the result of a comparison in voltage between the pixel signal and the reference signal is inverted, on the basis of the output signal of the differential input circuit converted by the voltage conversion circuit; causing the data storage section to store a time code at the time the comparison result signal is inverted; and causing each of the multiple time code transfer sections to transfer the time code.

According to a third aspect of the present disclosure, there is provided electronic equipment including a solid-state imaging apparatus that has an A/D converter and multiple time code transfer sections. The A/D converter includes: a differential input circuit configured to operate on a first power supply voltage and to output a signal when a voltage of a pixel signal is higher than a voltage of a reference signal; a positive feedback circuit configured to operate on a second power supply voltage lower than the first power supply voltage and to accelerate a transition rate at which a comparison result signal indicative of the result of a comparison in voltage between the pixel signal and the reference signal is inverted, on the basis of the output signal from the differential input circuit; a voltage conversion circuit configured to convert the output signal from the differential input circuit into a signal corresponding to the second power supply voltage; and a data storage section configured to store a time code at the time the comparison result signal is inverted. The multiple time code transfer sections each include a shift register configured to transfer the time code.

Thus according to the first through the third aspects above of the present disclosure, the differential input circuit outputs a signal when the voltage of the pixel signal is higher than that of the reference signal. The voltage conversion circuit converts the output signal from the differential input circuit into a signal corresponding to the second power supply voltage. On the basis of the output signal of the differential input circuit converted by the voltage conversion circuit, the positive feedback circuit accelerates the transition rate at which the comparison result signal indicative of the result of the comparison in voltage between the pixel signal and the reference signal is inverted. The data storage section stores the time code at the time the comparison result signal is inverted. The multiple time code transfer sections transfer the time code.

The solid-state imaging apparatus and the electronic equipment may each be an independent apparatus or a module to be incorporated in some other apparatus.

Advantageous Effect of Invention

According to the first through the third aspects above of the present disclosure, comparators are improved in determination speed and are allowed to operate faster.

Note that the advantageous effect outlined above is only example and not limitative of the present disclosure. Further advantages will become apparent from a reading of the present disclosure.

BRIEF DESCRIPTION OF DRAWINGS

FIG. 33 is a block diagram depicting a configuration example of an imaging apparatus as electronic equipment embodying the present disclosure.

DESCRIPTION OF EMBODIMENTS

Figure 1:
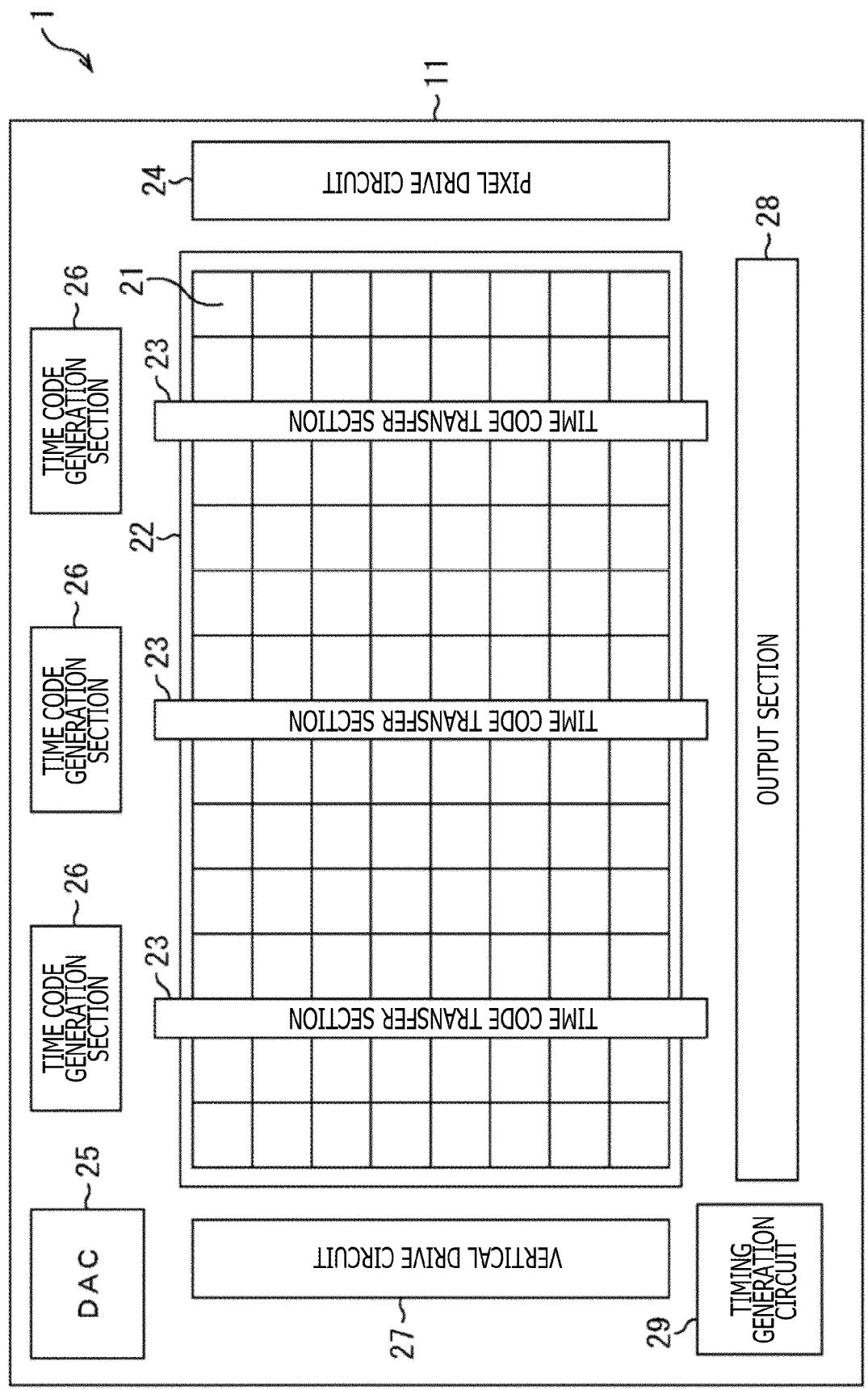
FIG. 1 is a schematic diagram depicting an overall configuration of a solid-state imaging apparatus embodying the present disclosure.

Embodiments for implementing the present disclosure (referred to as the embodiments) are described below. Note that the description is given under the following headings:
1. Overall configuration example of the solid-state imaging apparatus
2. Detailed configuration example of the pixel
3. Configuration example of the comparison circuit
4. Configuration example in the case of sharing by pixels
5. First configuration example of the data storage section and the time code transfer section
6. Second configuration example of the data storage section and the time code transfer section
7. Third configuration example of the data storage section and the time code transfer section
8. Fourth configuration example of the data storage section and the time code transfer section
9. Fifth configuration example of the data storage section and the time code transfer section
10. Sixth configuration example of the data storage section and the time code transfer section
11. Seventh configuration example of the data storage section and the time code transfer section
12. Multiple-substrate configuration: case 1
13. Multiple-substrate configuration: case 2
14. Example of application to electronic equipment <1. Overall Configuration Example of the Solid-State Imaging Apparatus>

FIG. 1 depicts an overall configuration of a solid-state imaging apparatus embodying the present disclosure.

A solid-state imaging apparatus 1 in FIG. 1 has a pixel array section 22 with pixels 21 arranged in a two-dimensional array on a semiconductor substrate 11 using silicon (Si) as a semiconductor material, for example. The pixel array section 22 also has time code transfer sections 23 that transfer to each pixel a time code generated by a time code generation section 26. A pixel drive circuit 24, a DAC (D/A Converter) 25, the time code generation section 26, a vertical drive circuit 27, an output section 28, and a timing generation circuit 29 are formed around the pixel array section 22 on the semiconductor substrate 11.

The pixels 21 arranged in a two-dimensional array are each provided with a pixel circuit 41 and an ADC 42, as will be discussed later with reference to FIG. 2. Each pixel 21 generates a charge signal reflecting the intensity of light received by a light receiving element (e.g., photodiode) inside the pixel, converts the charge signal to a digital pixel signal SIG, and outputs the pixel signal SIG.

The pixel drive circuit 24 drives the pixel circuit 41 (FIG. 2) in the pixel 21. The DAC 25 generates a reference signal (reference voltage signal) REF, which is a slope signal whose level (voltage) drops monotonously over time, and supplies the generated reference signal to each pixel 21. The time code generation section 26 generates a time code used by each pixel 21 at the time of converting an analog pixel signal SIG to a digital signal (in A/D conversion), and supplies the generated time code to the corresponding time code transfer section 23. Multiple time code generation sections 26 are provided for the pixel array section 22. In the pixel array section 22, there are as many time code transfer sections 23 as the number of time code generation sections 26. That is, there exists a one-to-one correspondence between the time code generation sections 26 and the time code transfer sections 23 that transfer the time codes generated by the time code generation sections 26.

The vertical drive circuit 27 performs control to output to the output section 28 the digital pixel signals SIG, which are generated in the pixels 21, in a predetermined sequence based on a timing signal supplied from the timing generation circuit 29. The digital pixel signals SIG from the pixels 21 are output by the output section 28 to the outside of the solid-state imaging apparatus 1. The output section 28 performs predetermined digital signal processing such as a black level adjustment process for adjusting the black level and a CDS (Correlated Double Sampling) process on the signals as needed, before outputting the processed signals to the outside.

The timing generation circuit 29 includes a timing generator that generates various timing signals. The timing generation circuit 29 supplies the generated timing signals to the pixel drive circuit 24, DAC 25, and vertical drive circuit 27, among others.

The solid-state imaging apparatus 1 is configured as outlined above. Note that it was explained above with reference to FIG. 1 that all circuits in the solid-state imaging apparatus 1 are formed on a single semiconductor substrate 11. Alternatively, as will be discussed later, the circuits in the solid-state imaging apparatus 1 may be configured to be separately arranged on multiple semiconductor substrates 11.

<2. Detailed Configuration Example of the Pixel>

Figure 2:
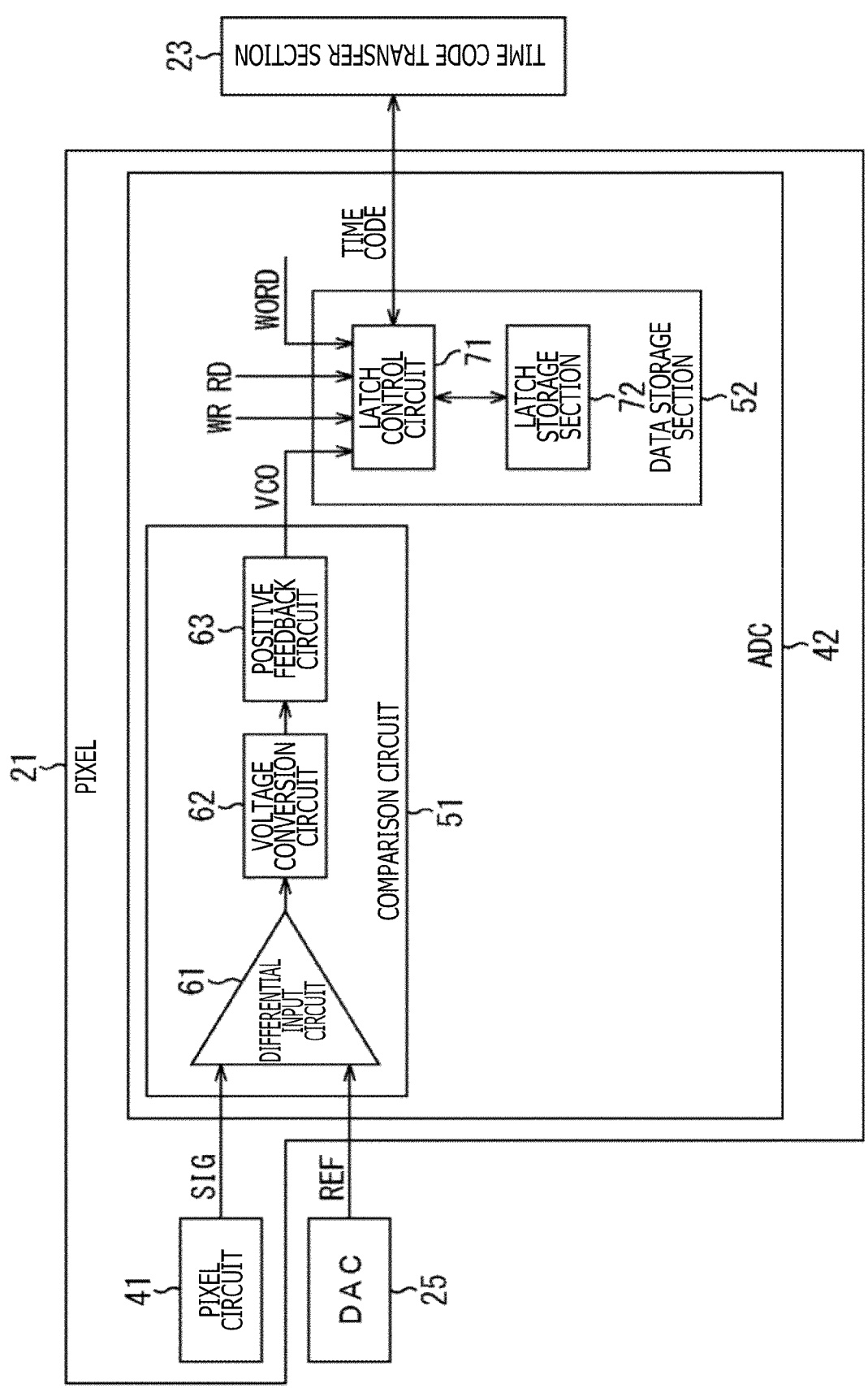
FIG. 2 is a block diagram depicting a detailed configuration example of a pixel.

FIG. 2 is a block diagram depicting a detailed configuration example of a pixel 21.

The pixel 21 includes the pixel circuit 41 and the ADC (A/D Converter) 42.

The pixel circuit 41 outputs to the ADC 42 a charge signal reflecting the intensity of received light as an analog pixel signal SIG. The ADC 42 converts the analog pixel signal SIG supplied from the pixel circuit 41 into a digital signal.

The ADC 42 includes a comparison circuit 51 and a data storage section 52.

The comparison circuit 51 compares a reference signal REF supplied from the DAC 25 with the pixel signal SIG, and outputs an output signal VCO as a comparison result signal indicative of the comparison result. When the pixel signal SIG becomes equal to the reference signal REF (in voltage), the comparison circuit 51 inverts the output signal VCO.

The comparison circuit 51 includes a differential input circuit 61, a voltage conversion circuit 62, and a positive feedback circuit (PFB) 63. The comparison circuit 51 will be discussed later in detail with reference to FIG. 3.

Besides receiving input of the output signal VCO from the comparison circuit 51, the data storage section 52 is supplied from the vertical drive circuit 27 with a WR signal representing a pixel signal write operation (the signal is also referred to as the write control signal WR hereunder), with an RD signal representing a pixel signal read operation (the signal is also referred to as the read control signal RD), and with a WORD signal for controlling the readout timing of the pixel 21 during the pixel signal read operation. The data storage section 52 is also supplied via the time code transfer section 23 with a time code generated by the time code generation section 26.

The data storage section 52 includes a latch control circuit 71 and a latch storage section 72. The latch control circuit 71 controls time code write and read operations on the basis of the WR and RD signals. The latch storage section 72 stores the time code.

In the time code write operation, the latch control circuit 71 causes the latch storage section 72 to store the time code that is supplied from the time code transfer section 23 and updated at intervals of a unit time while a Hi (High)-level output signal VCO is being input from the comparison circuit 51. When the pixel signal SIG becomes equal to the reference signal REF (in voltage), with the output signal VCO from the comparison circuit 51 inverted to Lo (Low), the latch control circuit 71 stops writing (updating) the supplied time code and causes the latch storage section 72 to retain the time code most recently stored therein. The time code stored in the latch storage section 72 represents the time at which the pixel signal SIG became equal to the reference signal REF. The time code is the data indicative of the pixel signal SIG being equal to the reference voltage at the time, i.e., a digitized light intensity value.

Following a sweep of the reference signal REF, with the time code stored into the latch storage section 72 of every pixel 21 in the pixel array section 22, the operation on the pixels 21 is switched from the write operation to a read operation.

In the time code read operation, the latch control circuit 71 outputs the time code (digital pixel signal SIG) stored in the latch storage section 72 to the time code transfer section 23 when the read timing of the pixel 21 is reached on the basis of the WORD signal for controlling the read timing. The time code transfer section 23 successively transfers the supplied time codes in the column direction (in the vertical direction), thereby supplying the output section 28 with the time codes.

In the description that follows, the digitized pixel data, which indicates that the pixel signal SIG was equal to the reference voltage at that time and which is an inverted time code given by inversion of the output signal VCO read from the latch storage section 72 during the time code read operation, will also be called the A/D converted pixel data. The naming is intended to distinguish the pixel data from the time code to be written to the latch storage section 72 in the time code write operation.

<3. Configuration Example of the Comparison Circuit>

Figure 3:
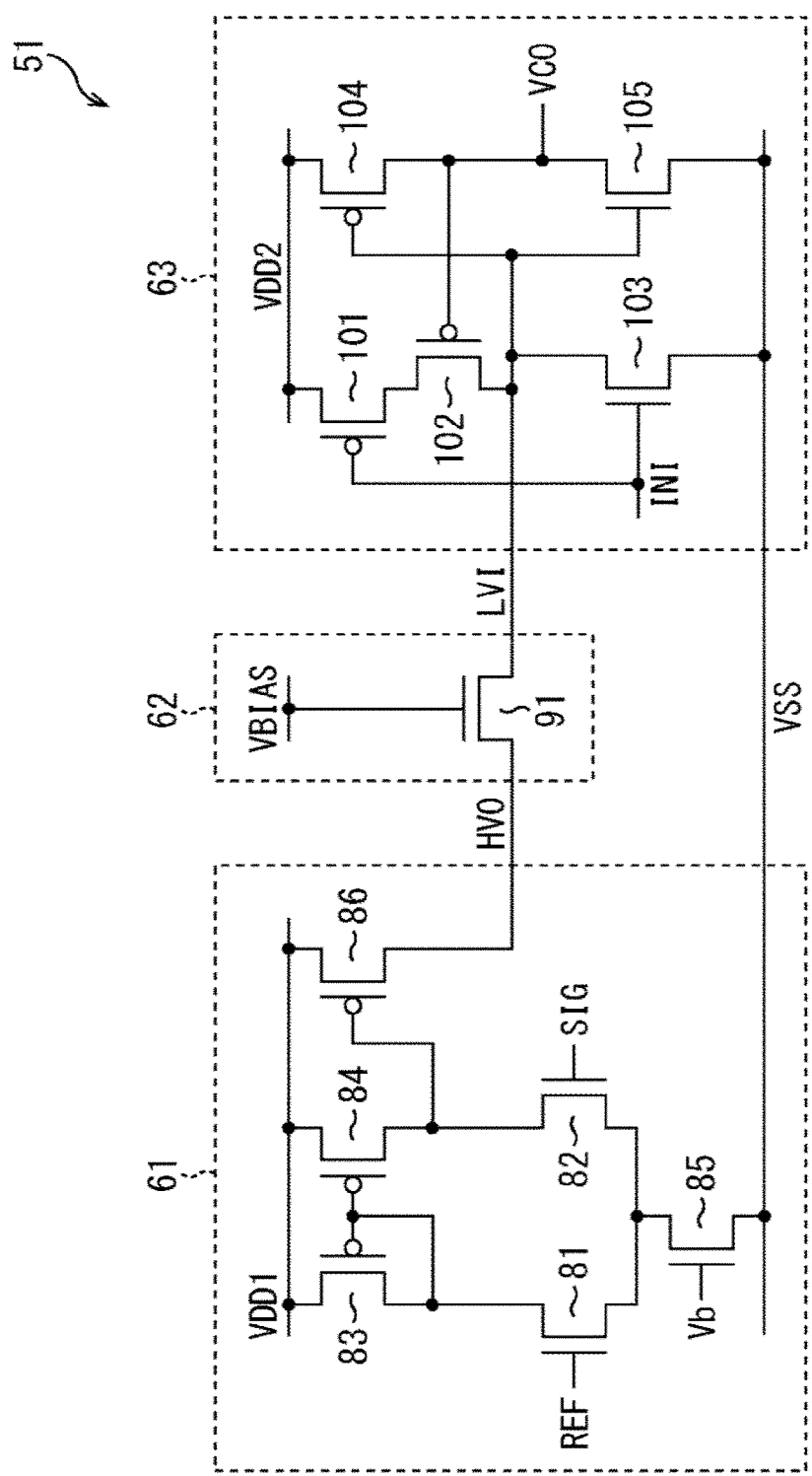
FIG. 3 is a block diagram depicting a detailed configuration example of a comparison circuit.

FIG. 3 is a circuit diagram depicting a detailed configuration example of the differential input circuit 61, voltage conversion circuit 62, and positive feedback circuit 63 included in the comparison circuit 51.

The differential input circuit 61 compares the pixel signal SIG output from the pixel circuit 41 in the pixel 21 with the reference signal REF output from the DAC 25 and, if the pixel signal SIG is higher than the reference signal REF, outputs a predetermined signal (current).

The differential input circuit 61 includes transistors 81 and 82 making up a differential pair, transistors 83 and 84 constituting a current mirror, a transistor 85 as a constant current source that supplies a current IB corresponding to an input bias current Vb, and a transistor 86 that outputs an output signal HVO of the differential input circuit 61.

The transistors 81, 82 and 85 include NMOS (Negative Channel MOS) transistors, whereas the transistors 83, 84 and 86 include PMOS (Positive Channel MOS) transistors.

Of the transistors 81 and 82 making up the differential pair, the transistor 81 has its gate receiving input of the reference signal REF output from the DAC 25. The transistor 82 has its gate receiving input of the pixel signal SIG output from the pixel circuit 41 in the pixel 21. The sources of the transistors 81 and 82 are connected with the drain of the transistor 85. The source of the transistor 85 is connected with a predetermined voltage VSS (VSS<VDD2<VDD1).

The drain of the transistor 81 is connected with the gates of the transistor 83 and 84 including the current mirror circuit and with the drain of the transistor 83. The drain of the transistor 82 is connected with the drain of the transistor 84 and with the gate of the transistor 86. The sources of the transistors 83, 84 and 86 are connected with a first power supply voltage VDD1.

The voltage conversion circuit 62 includes an NMOS type transistor 91, for example. The drain of the transistor 91 is connected with the drain of the transistor 86 in the differential input circuit 61. The source of the transistor 91 is connected with a predetermined connection point in the positive feedback circuit 63. The gate of the transistor 86 is connected with a bias voltage VBIAS.

The transistors 81 to 86 in the differential input circuit 61 constitute a circuit that operates on a high voltage up to the first power supply voltage VDD1. The positive feedback circuit 63 operates on a second power supply voltage VDD2 lower than the first power supply voltage VDD1. The voltage conversion circuit 62 converts the output signal HVO input from the differential input circuit 61 into a low-voltage signal (converted signal) LVI on which the positive feedback circuit 63 can operate, the voltage conversion circuit 62 further feeding the low-voltage signal LVI to the positive feedback circuit 63.

It is sufficient that the bias voltage VBIAS be a voltage permitting conversion to a voltage that will not destroy transistors 101 to 105 in the positive feedback circuit 63 operating on a constant voltage. For example, the bias voltage VBIAS may be equal to the second power supply voltage VDD2 for the positive feedback circuit 63 (VBIAS=VDD2).

On the basis of the converted signal LVI obtained by converting the output signal HVO from the differential input circuit 61 into a signal corresponding to the second power supply voltage VDD2, the positive feedback circuit 63 outputs a comparison result signal that is inverted when the pixel signal SIG is higher than the reference signal REF. Also, the positive feedback circuit 63 increases the transition rate at which the output signal VCO output as the comparison result signal is inverted.

The positive feedback circuit 63 includes five transistors 101 to 105. Here, the transistors 101, 102 and 104 include PMOS transistors, whereas the transistors 103 and 105 include NMOS transistors.

The source of the transistor 91 at the output end of the voltage conversion circuit 62 is connected with the drains of the transistors 102 and 103 and with the gates of the transistors 104 and 105. The sources of the transistors 101 and 104 are connected with the second power supply voltage VDD2. The drain of the transistor 101 is connected with the source of the transistor 102. The gate of the transistor 102 is connected with the drains of the transistors 104 and 105 that constitute the output end of the positive feedback circuit 63. The sources of the transistors 103 and 105 are connected with a predetermined voltage VSS. An initialization signal INI is supplied to the gates of the transistors 101 and 103.

The transistors 104 and 105 form an inverter circuit. A connection point between the drains of the two transistors 104 and 105 constitutes the output end from which the comparison circuit 51 outputs the output signal VCO.

Figure 4:
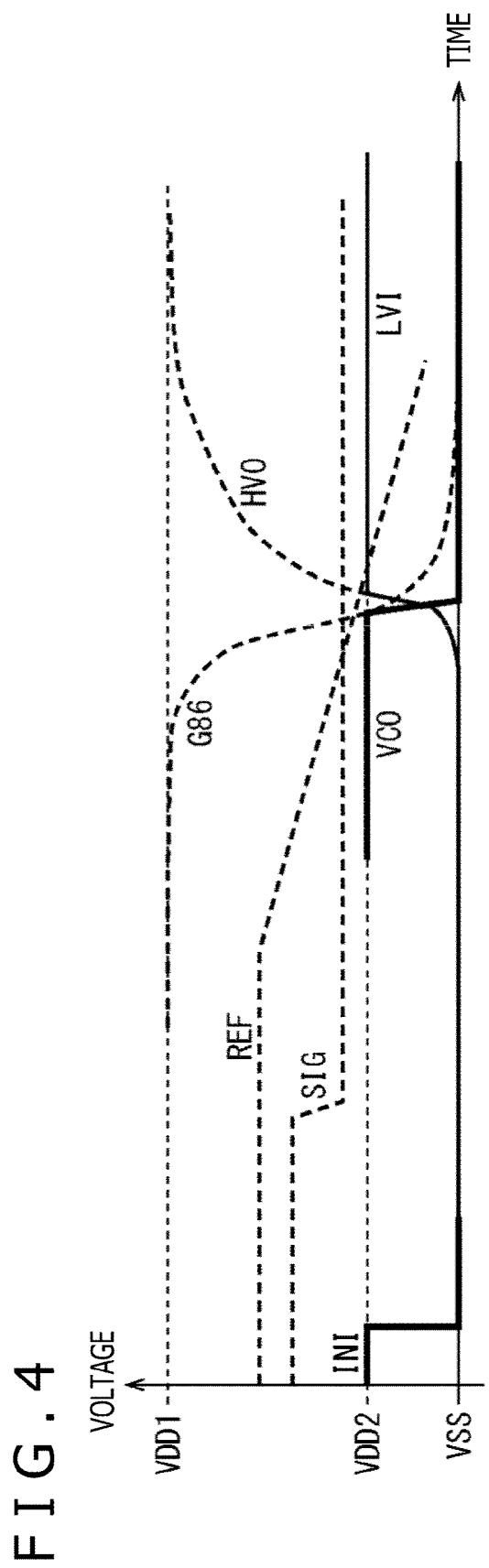
FIG. 4 is a schematic diagram depicting transitions of signals at the time the comparison circuit is in operation.

What follows is an explanation of how the comparison circuit 51 configured as described above operates. FIG. 4 depicts transitions of signals at the time the comparison circuit 51 is in operation. Note that, in FIG. 4, "G86" represents the gate potential of the transistor 86.

First, the reference signal REF is set to be higher than the pixel signals SIG of all pixels 21. At the same time, the initialization signal INI is brought High to initialize the comparison circuit 51.

More specifically, the reference signal REF and the pixel signal SIG are impressed to the gates of the transistors 81 and 82, respectively. When the reference signal REF is higher in voltage than the pixel signal SIG, most of the current output from the transistor 85 as the current source flows via the transistor 81 to a diode-connected transistor 83. The channel resistance of the transistor 84 that shares its gate with the transistor 83 is sufficiently low to keep the gate of the transistor 86 approximately on the level of the first power supply voltage VDD1, which blocks the transistor 86. Thus even if the transistor 91 in the voltage conversion circuit 62 conducts, the positive feedback circuit 63 as a charging circuit will not charge the converted signal LVI. Meanwhile, since the initialization signal INI is supplied as a high-level signal, the transistor 103 conducts, causing the positive feedback circuit 63 to discharge the converted signal LVI. Also, with the transistor 101 blocked, the positive feedback circuit 63 does not charge the converted signal LVI via the transistor 102. As a result, the converted signal LVI is discharged down to the level of the predetermined voltage VSS. In the positive feedback circuit 63, the transistors 104 and 105 including an inverter output the high-level output signal VCO, which initializes the comparison circuit 51.

Following initialization, the initialization signal INI is brought Low to start a sweep of the reference signal REF.

During a period in which the reference signal REF is higher than the pixel signal SIG in voltage, the transistor 86 is cut off and blocked, with the output signal VCO brought High. This causes the transistor 102 to be also cut off and blocked. Since the initialization signal INI is Low, the transistor 103 is also blocked. The converted signal LVI maintains the predetermined voltage VSS while in the high-impedance state, allowing the high-level output signal VCO to be output.

When the reference signal REF becomes lower than the pixel signal SIG, the output current from the transistor 85 as the current source does not flow through the transistor 81. The gate potential of the transistors 83 and 84 is increased, raising the channel resistance of the transistor 84. At this point, a current flowing in via the transistor 82 triggers a voltage drop to lower the gate potential of the transistor 86, which allows the transistor 91 to conduct. The output signal HVO from the transistor 86 is converted by the transistor 91 of the voltage conversion circuit 62 into the converted signal LVI, before being supplied to the positive feedback circuit 63. The positive feedback circuit 63 as a charging circuit charges the converted signal LVI, causing the potential to approach the second power supply voltage VDD2 up from the low voltage VSS.

Then when the voltage of the converted signal LVI exceeds a threshold voltage of the inverter including the transistors 104 and 105, the output signal VCO is brought Low, which allows the transistor 102 to conduct. Impressed with the low-level initialization signal INI, the transistor 101 is also conducting. The positive feedback circuit 63 rapidly charges the converted signal LVI via the transistors 101 and 102, thus quickly boosting the potential up to the second power supply voltage VDD2.

In the voltage conversion circuit 62, the transistor 91 with its gate impressed with the bias voltage VBIAS is blocked when the voltage of the converted signal LVI reaches a voltage value that is lower than the bias voltage VBIAS by as much as a transistor threshold value. Even if the transistor 86 is still conducting, the converted signal LVI is no longer charged. The voltage conversion circuit 62 also functions as a voltage clamp circuit.

Charging of the converted signal LVI by conduction of the transistor 102 is triggered by the increase of the converted signal LVI up to the inverter threshold value in a positive feedback operation for charge acceleration. The transistor 85 as the current source for the differential input circuit 61 has the current per circuit set to a very small current because there exist a very large number of circuits operating parallelly in the solid-state imaging apparatus 1. Further, the sweep of the reference signal REF is performed very slowly because the voltage that varies at intervals of the unit time in which the time code is changed serves as an LSB step for A/D conversion. Consequently, the change in the gate potential of the transistor 86 is also slow, and so is the change in the output current of the transistor 86 driven by the gate potential. However, the converted signal LVI charged with the output current is subjected downstream to positive feedback, which allows the output signal VCO to transition in a sufficiently rapid manner. Preferably, the transition time of the output signal VCO is a fraction of the unit time for the time code, typically 1 ns or less. The comparison circuit 51 of the present disclosure attains this output transition time by simply having a small current of 0.1 uA, for example, set to the transistor 85 acting as the current source.

<Detailed Configuration Example of the Pixel Circuit>

A detailed configuration of the pixel circuit 41 is explained below with reference to FIG. 5.

Figure 5:
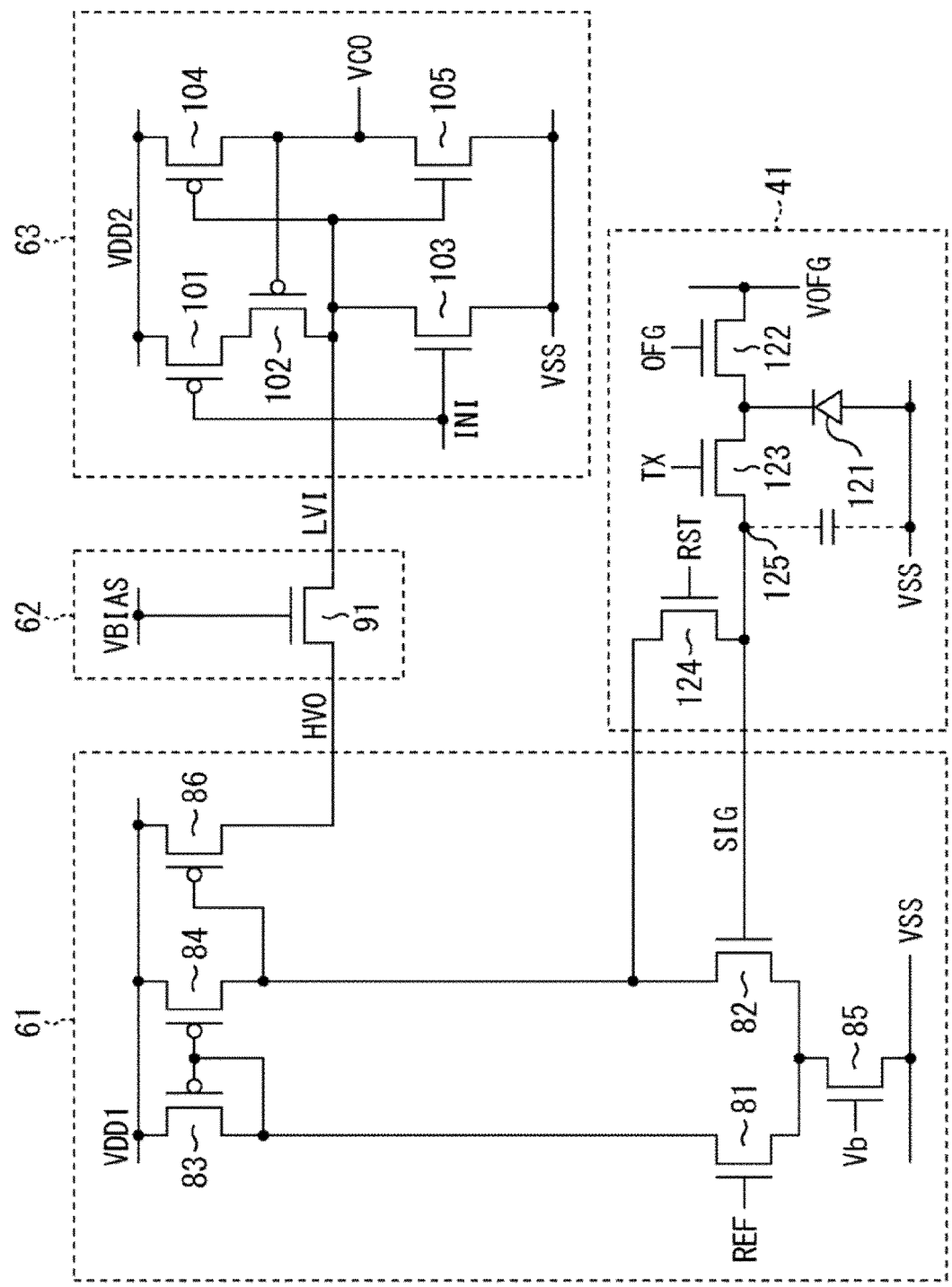
FIG. 5 is an explanatory diagram explaining a detailed configuration of a pixel circuit.

FIG. 5 is a circuit diagram given by supplementing the comparison circuit 51 in FIG. 3 with details of the pixel circuit 41.

The pixel circuit 41 includes a photodiode (PD) 121 as a photoelectric conversion element, a discharge transistor 122, a transfer transistor 123, a reset transistor 124, and a FD (floating diffusion layer) 125.

The discharge transistor 122 is used to adjust exposure period. Specifically, when it is desired to start the exposure period at a desired timing, turning on the discharge transistor 122 discharges the electrical charge accumulated in the photodiode 121 up to that point. Thus the exposure time is started after the discharge transistor 122 is turned off.

The transfer transistor 123 transfers the electrical charge generated by the photodiode 121 to the FD 125. The reset transistor 124 resets the electrical charge retained in the FD 125. The FD 125 is connected with the gate of the transistor 82 in the differential input circuit 61. This allows the transistor 82 in the differential input circuit 61 to function as an amplification transistor for the pixel circuit 41 as well.

The source of the reset transistor 124 is connected with the gate of the transistor 82 in the differential input circuit 61 and with the FD 125. The drain of the reset transistor 124 is connected with the drain of the transistor 82. That means there is no fixed reset voltage for resetting the electrical charge in the FD 125. The reason for this is that the circuit state of the differential input circuit 61 is controlled so that the reset voltage for resetting the FD 125 may be set as desired using the reference signal REF.

<Timing Chart of the Pixel Section>

Figure 6:
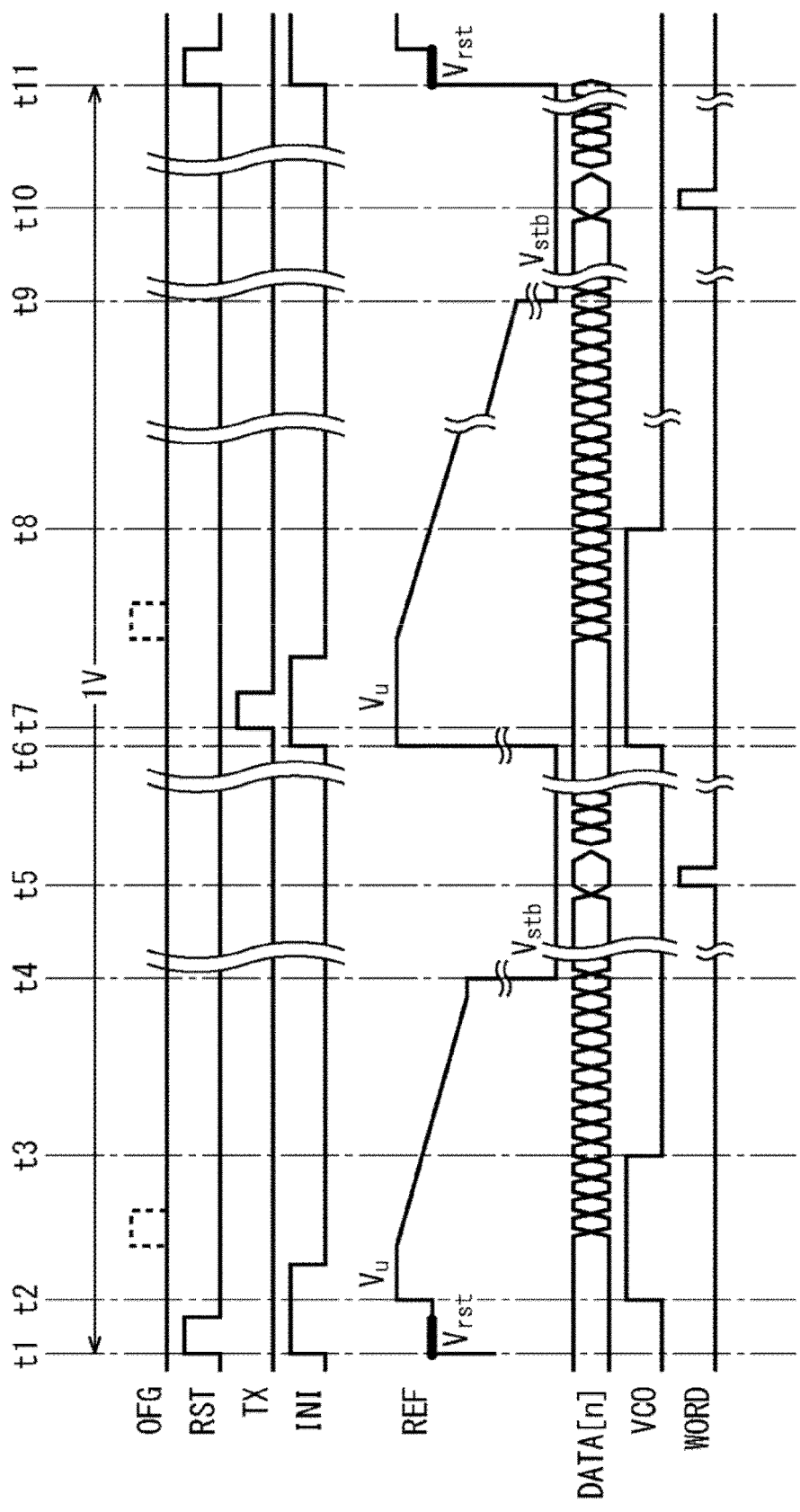
FIG. 6 is a timing chart explaining the operation of the pixel.

The operation of the pixel 21 in FIG. 5 is explained below with reference to the timing chart in FIG. 6.

First at time t1, the reference signal REF is switched from the current standby voltage $V_{stb}$ to a reset voltage $V_{rst}$ for resetting the electrical charge in the FD 125. Turning on the reset transistor 124 resets the electrical charge in the FD 125. Also at time t1, the initialization signal INI supplied to the gates of the transistors 101 and 103 in the positive feedback circuit 63 is brought High, which initializes the positive feedback circuit 63.

At time t2, the reference signal REF is raised to a predetermined voltage $V_u$, and a comparison between the reference signal REF and the pixel signal SIG (i.e., a sweep of the reference signal REF) is started. At this point, the output signal VCO is High because the reference signal REF is higher than the pixel signal SIG.

At time t3 when it is determined that the reference signal REF is equal to the pixel signal SIG, the output signal VCO is inverted (brought Low). With the output signal VCO inverted, the inversion of the output signal VCO is accelerated by the positive feedback circuit 63 as described above. In the data storage section 52, the time data at the time the output signal VCO is inverted (i.e., N-bit time codes DATA [1] to DATA[N]) is latched and stored.

With the signal write period terminated, at time t4 when a signal read period is started, the voltage of the reference signal REF supplied to the gate of the transistor 81 in the comparison circuit 51 is brought down to a level at which the transistor 81 is turned off (i.e., to the standby voltage $V_{stb}$). This suppresses a consumption current of the comparison circuit 51 during the signal read period.

At time t5, the WORD signal for controlling the read timing is brought High, causing the latched and stored N-bit time codes DATA[1] to DATA[N] to be output from the latch control circuit 71 of the data storage section 52. The time code acquired at this point constitutes P-phase data at a reset level applicable to the CDS (Correlated Double Sampling) process.

At time t6, the reference signal REF is raised up to the predetermined voltage $V_u$. At the same time, the initialization signal INI supplied to the gates of the transistors 101 and 103 is brought High, which again initializes the positive feedback circuit 63.

At time t7, a high-level transfer signal TX turns on the transfer transistor 123 in the pixel circuit 41, transferring the electrical charge generated by the photodiode 121 to the FD 125.

After the initialization signal INI is again brought Low, a comparison between the reference signal REF and the pixel signal SIG is started (sweep of the reference signal REF). At this point, the output signal VCO is High because the reference signal REF is higher than the pixel signal SIG.

Then at time t8 when it is determined that the reference signal REF is equal to the pixel signal SIG, the output signal VCO is inverted (brought Low). With the output signal VCO inverted, the positive feedback circuit 63 accelerates the inversion of the output signal VCO. The time data at the time the output signal VCO is inverted (N-bit time codes DATA [1] to DATA[N]) is latched and stored in the data storage section 52.

With the signal write period terminated, at time t9 when a signal read period is started, the voltage of the reference signal REF supplied to the gate of the transistor 81 in the comparison circuit 51 is brought down to the level at which the transistor 81 is turned off (i.e., to the standby voltage $V_{stb}$). This suppresses a consumption current of the comparison circuit 51 during the signal read period.

At time t10, the WORD signal for controlling the read timing is brought High, causing the latched and stored N-bit time codes DATA[1] to DATA[N] to be output from the latch control circuit 71 of the data storage section 52. The time code acquired at this point constitutes D-phase data at a signal level applicable to CDS processing. At time t11, the same state as at the above-described time t1 occurs, which drives the next 1V (one vertical scanning period).

With the pixel 21 driven as described above, the P-phase data at the reset level is first acquired and read out. Then the D-phase data at the signal level is acquired and read out.

In the manner described above, all pixels 21 in the pixel array section 22 of the solid-state imaging apparatus 1 are reset and exposed simultaneously in what is known as a global shutter operation. Because all pixels are exposed and subjected to the read operation simultaneously, there is no need for a charge retention section that is usually provided in each pixel to retain its electrical charge until the charge is read out. The configuration of the pixel 21 also eliminates the need for a selection transistor that has been required by a column parallel readout type solid-state imaging apparatus for selecting the pixels that output the pixel signal SIG.

In the driving of the pixel 21 explained above with reference to FIG. 6, the discharge transistor 122 is controlled to be always turned off. However, as indicated by broken lines in FIG. 6, a desired exposure period may be set when a discharge signal OFG is brought High to turn on the discharge transistor 122 temporarily before turning it off at a desired time.

<4. Configuration Example in the Case of Sharing by Pixels>

The above-described comparison circuit 51 is configured to have a single ADC 42 arranged in each pixel 21. Alternatively, a single ADC 42 may be shared by multiple pixels 21.

Figure 7:
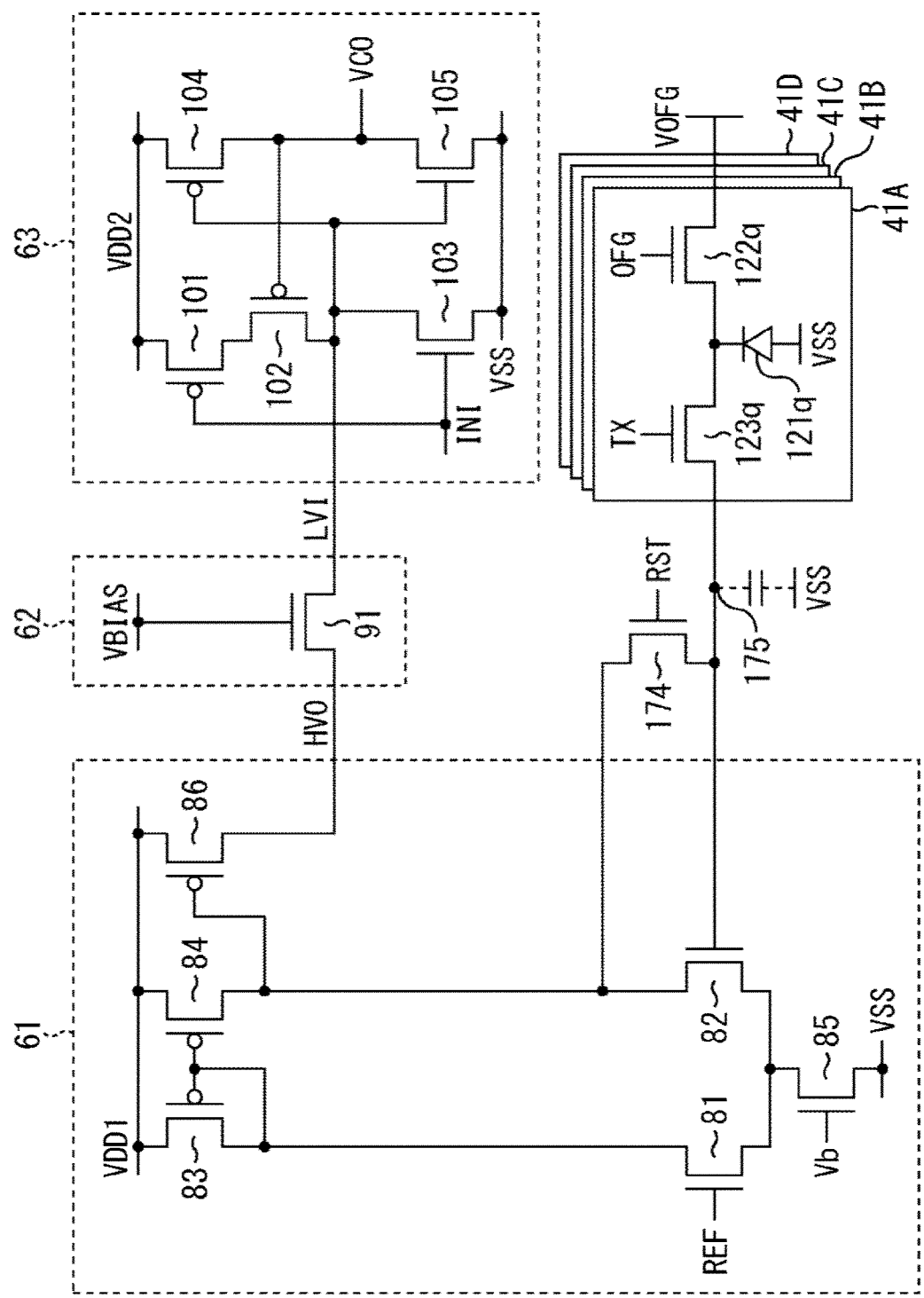
FIG. 7 is a circuit diagram depicting a configuration example of the comparison circuit in the case of sharing by pixels.

FIG. 7 is a circuit diagram depicting a configuration example of the comparison circuit 51 having a single ADC 42 shared by multiple pixels 21.

FIG. 7 illustrates a configuration example of the comparison circuit 51 in which four pixels 21A, 21B, 21C and 21D share a single ADC 42.

In FIG. 7, as in the configuration depicted in FIG. 3, the comparison circuit 51 includes the differential input circuit 61, voltage conversion circuit 62, and positive feedback circuit 63.

In FIG. 7, the four pixels 21A to 21D are provided with pixel circuits 41A to 41D, respectively. The pixel circuits 41A to 41D are each provided with a photodiode $121q$, a discharge transistor $122q$, and a transfer transistor $123q$. Meanwhile, a reset transistor 174 and an FD 175 are shared by the four pixels 21A to 21D.

<5. First Configuration Example of the Data Storage Section and the Time Code Transfer Section>

The controls for writing and reading the time code are explained below.

Figure 8:
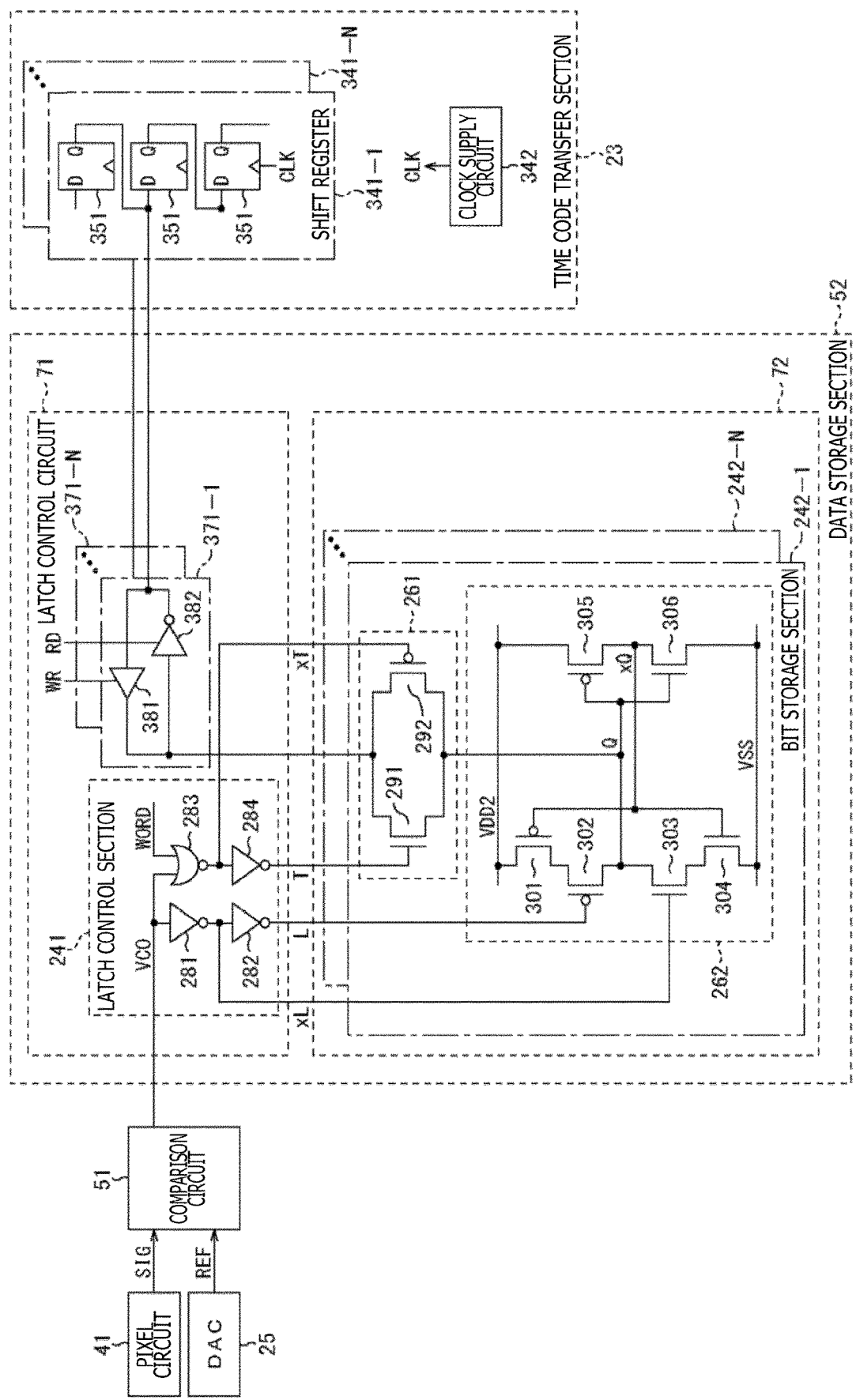
FIG. 8 is a circuit diagram depicting a first configuration example of a time code transfer section and a data storage section.

FIG. 8 is a circuit diagram depicting a first configuration example of the time code transfer section 23 and the data storage section 52.

The time code transfer section 23 includes N shift registers 341-1 to 341-N corresponding to N-bit time codes DATA[1] to DATA[N], respectively, and a clock supply circuit 342. The N shift registers 341-1 to 341-N each include multiple D-F/Fs (D-type flip-flops) 351. The clock supply circuit 342 supplies a clock signal CLK to the clock input of each of the D-F/Fs 351 in the shift registers 341.

The latch control circuit 71 in the data storage section 52 includes a latch control section 241 and N bidirectional buffer circuits 371-1 to 371-N.

The latch storage section 72 in the data storage section 52 includes N bit storage sections 242-1 to 242-N.

The N bidirectional buffer circuits 371-1 to 371-N are provided to correspond to the N shift registers 341-1 to 341-N in the time code transfer section 23, on a one-to-one basis. The bidirectional buffer circuits 371 are each connected with a single D-F/F 351 in the corresponding shift register 341.

A buffer circuit 381 in the bidirectional circuit 371-n (0<n<N+1) is supplied with the write control signal WR that is brought High in a time code write operation. An inverter circuit 382 in the bidirectional circuit 371-n is supplied with the read control signal RD that is brought High in a time code read operation. The bidirectional buffer circuit 371-n switches between the time code write operation and the time code read operation performed on the bit storage section 242-n on the basis of the write control signal WR and the read control signal RD.

The latch control section 241 includes two inverters 281 and 282 serially connected with each other and a NOR circuit 283 and an inverter 248 that are also connected serially with each other.

The bit storage section 242-n in the data storage section 52 includes a transfer gate 261 and a latch storage section 262.

The transfer gate 261 includes two transistors 291 and 292 that are an NMOS transistor and a PMOS transistor, respectively.

The latch storage section 262 has a static latch circuit that includes transistors 301 to 306. The transistors 301, 302 and 305 are PMOS transistors, whereas the transistor 303, 304 and 306 are NMOS transistors.

The output signal VCO from the comparison circuit 51 is input to the inverter 281 and to one input of the NOR circuit 283. The other input of the NOR 283 is supplied with the WORD signal. The output of the inverter 281 is supplied to the inverter 282 and to the gate of the transistor 303 in the latch storage section 262. The output of the inverter 282 is supplied to the gate of the transistor 302 in the latch storage section 262. The output of the NOR circuit 283 is supplied to the inverter 284 and to the gate of the transistor 292 in the transfer gate 261. The output of the inverter 284 is supplied to the gate of the transistor 291 in the transfer gate 261.

In the time code write operation, the WORD signal is brought Low for all pixels. The transfer gate 261 conducts when the output signal VCO is High and is blocked when the output signal VCO is Low. The feedback of the latch storage section 262 (i.e., output xQ with respect to input Q) is blocked when the output signal VCO is High and conducts when the output signal VCO is Low. Consequently, the latch storage section 262 enters a write state (transparent state) to have the n-th bit time code written thereto when the output signal VCO is High. The latch storage section 262 enters a hold state (latch state) to hold the time code written thereto via the bidirectional buffer circuit 371-n when the output signal VCO is Low.

In the time code read operation, the WORD signal is supplied only to the latch control section 241 in the pixel 21 targeted for the read operation. Because the output signal VCO is Low, the transfer gate 261 conducts only when the high-level WORD signal is input. This causes the time code held in the latch storage section 262 to be output to the time code transfer section 23 via the bidirectional buffer circuit 371-n.

During an A/D conversion period in which a sweep of the reference signal REF is carried out, the N shift registers 341 in the time code transfer section 23 transfer the time code supplied from the time code generation section 26 by use of a shift clock in a clock cycle defined by the unit time of the time code.

In the time code write operation, the high-level write control signal WR and the low-level read control signal RD are supplied to the bidirectional buffer circuit 371. The bidirectional buffer circuit 371 supplies the time code fed from a predetermined D-F/F 351 in the shift register 341 to the bit storage section 242 via the transfer gate 261. The bit storage section 242 stores the supplied time code.

In the next time code read operation, the low-level write control signal WR and the high-level read control signal RD are supplied to the bidirectional buffer circuit 371. The time code stored in the bit storage section 242 is supplied to a predetermined D-F/F 351 in the shifter register 341 of the time code transfer section 23 via the bidirectional buffer circuit 371. The shift registers 341 successively transfer to the output section 28 the time data supplied to each of the D-F/Fs 351, the time data being output from the output section 28.

More specifically, each of the D-F/Fs 351 in the shift registers 341 is configured to enter the high-impedance state (called the Hi-Z state hereunder) when the clock signal CLK supplied to the clock input is brought either High or Low. For example, as will be discussed below with reference to FIGS. 9 and 10, the D-F/F 351 is configured to enter the Hi-Z state when the clock signal CLK is Low.

During the period in which each D-F/F 351 in the shift register 341 is in the Hi-Z state, the bidirectional buffer circuit 371 is supplied with the high-level read control signal RD. At the same time, the WORD signal is brought High. This causes the time code stored in the bit storage section 242 to be supplied via the bidirectional buffer circuit 371 to the predetermined D-F/F 351 in the shift register 341 of the time code transfer section 23.

After the read control signal RD is again brought Low, each D-F/F 351 in the shift register 341 is supplied with the shift clock. The shift registers 341 successively transfer to the output section 28 the time data supplied to each of the D-F/Fs 351, the time data being output from the output section 28.

<Configuration Examples of the D-F/F>

Figure 9:
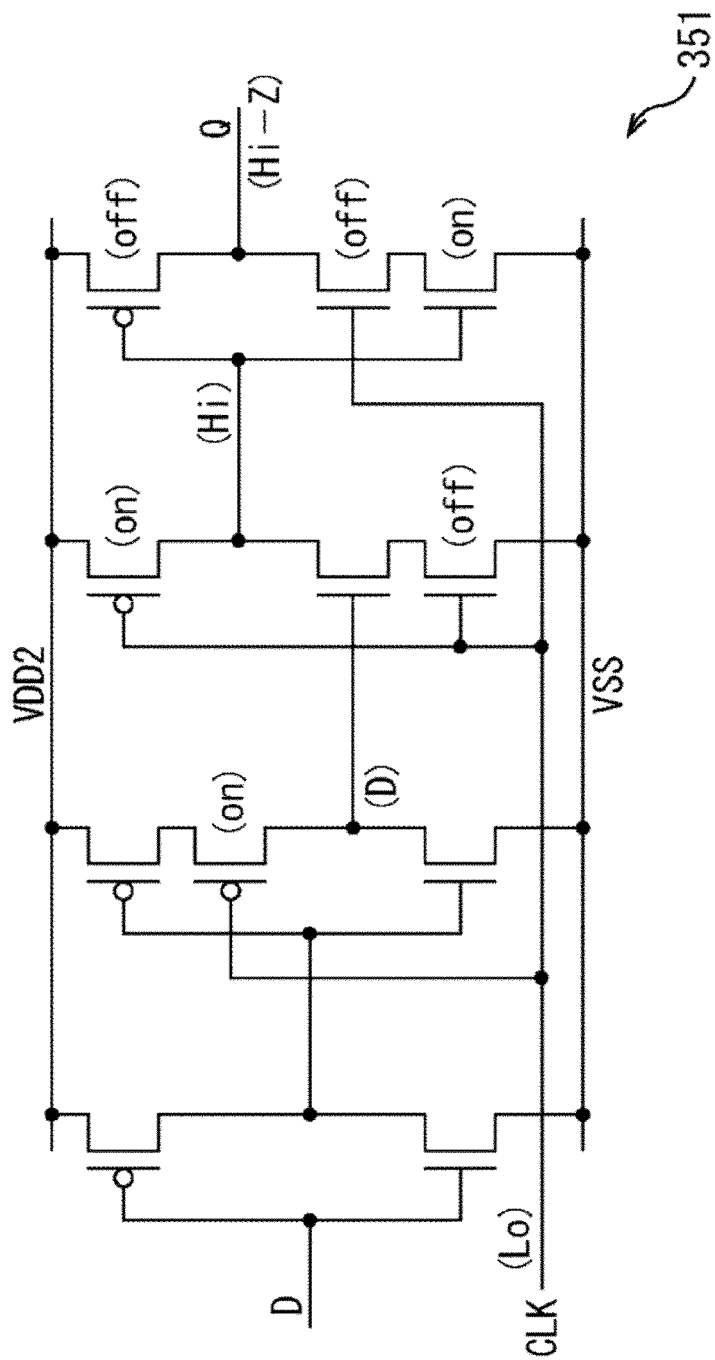
FIG. 9 is a schematic diagram depicting a first configuration example of a D-F/F in a shift register.

FIG. 9 depicts a first configuration example of a D-F/F 351 in the shift register 341.

In FIG. 9, the parenthesized characters such as (on) and (off) near transistors and signal lines indicate the potential states of these transistors and signal lines at the time the low-level clock signal CLK is input to the clock input.

As depicted in FIG. 9, in the case where the low-level clock signal CLK is input to the D-F/F 351, the D-F/F 351 enters the Hi-Z state.

Figure 10:
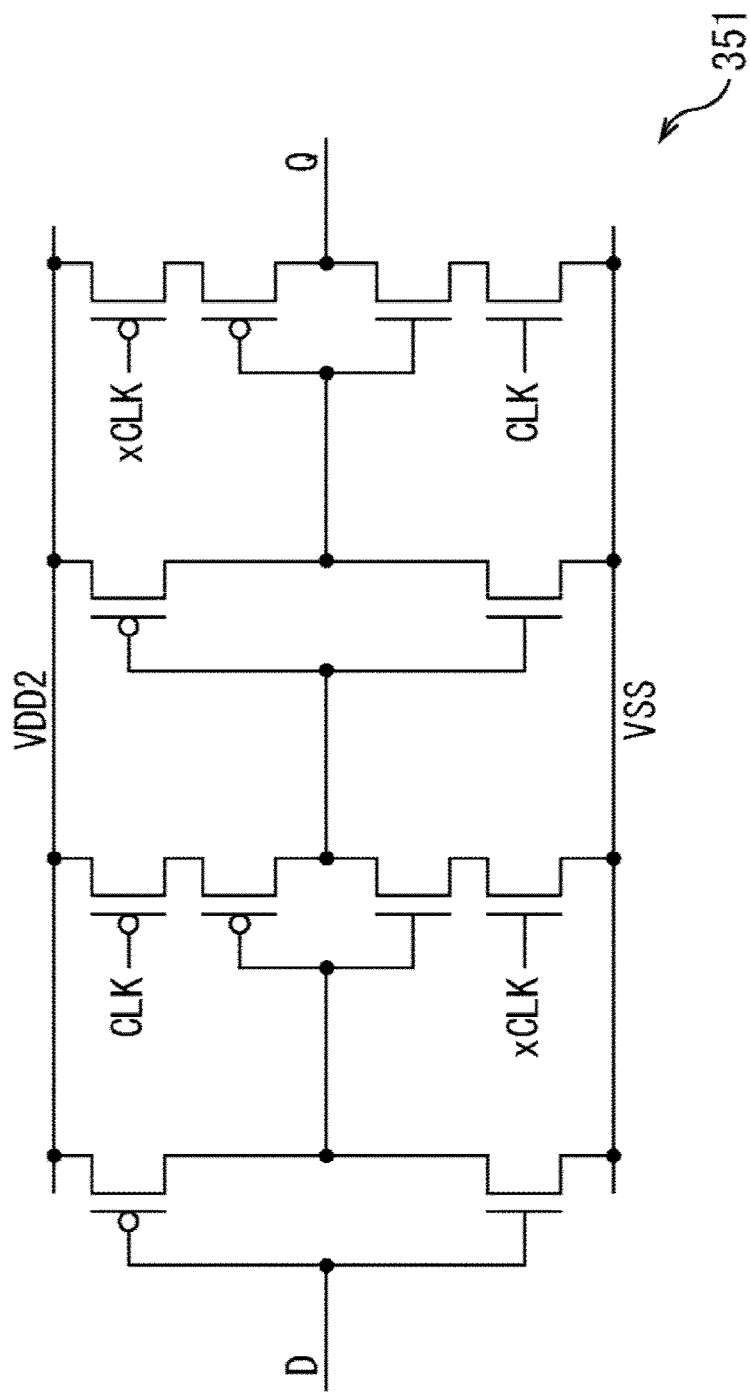
FIG. 10 is a schematic diagram depicting a second configuration example of the D-F/F in the shift register.

FIG. 10 depicts a second configuration example of the D-F/F 351 in the shift register 341.

The D-F/F 351 has two clocked inverters using complementary clock signals CLK and xCLK and two continuously operating inverters. This is a flip-flop that has a clocked inverter, a continuously operating inverter, another locked inverter, and another continuously operating inverter connected in that order from the input side. The D-F/F 351 in FIG. 10 enters the Hi-Z state when the clock signal CLK is Low and the inverted clock signal xCLK is High.

<Configuration Examples of the Bidirectional Buffer Circuit>

Figure 11:
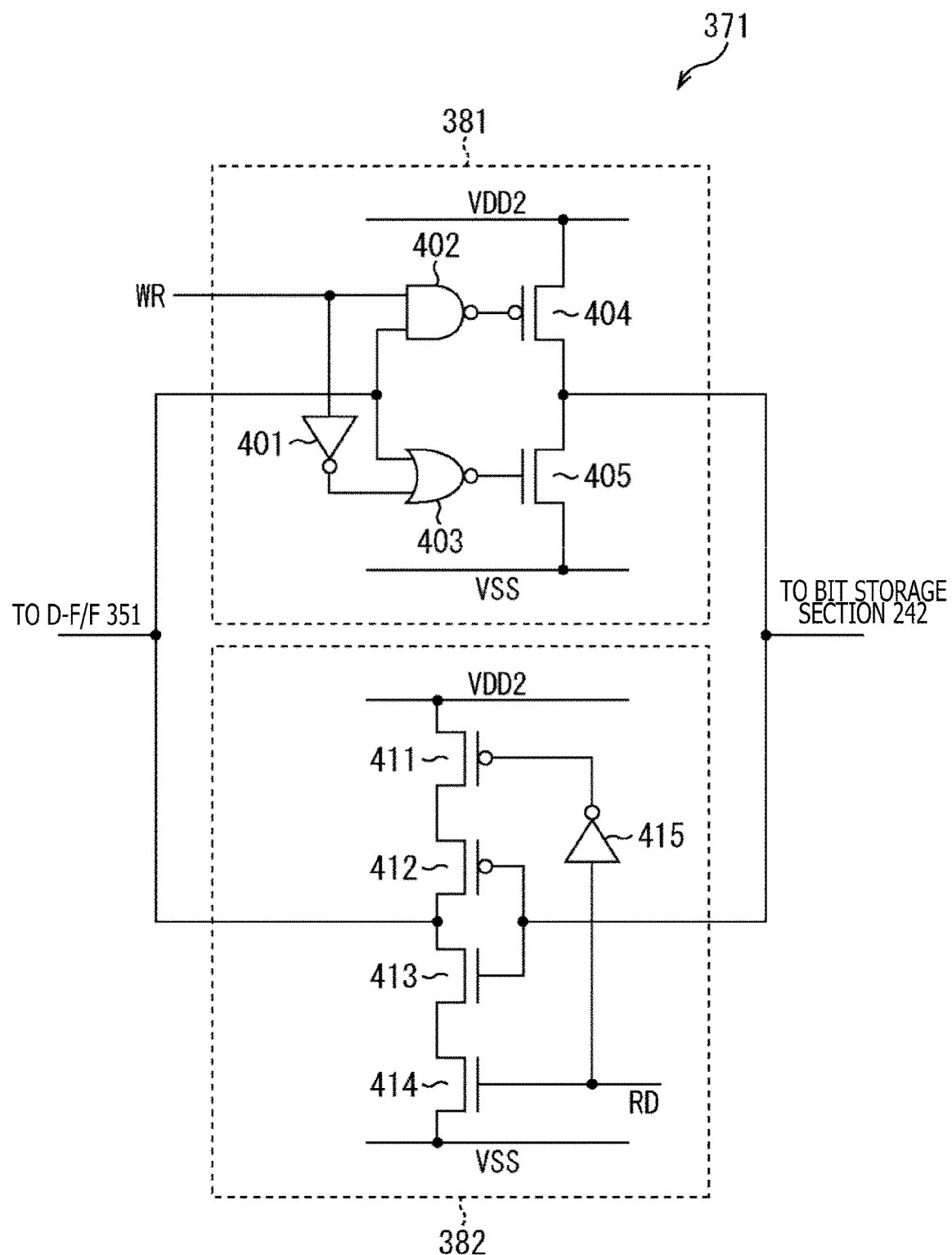
FIG. 11 is a schematic diagram depicting a first configuration example of a bidirectional buffer circuit.

FIG. 11 depicts a first configuration example of the bidirectional buffer circuit 371.

The bidirectional buffer circuit 371 depicted in FIG. 11 includes a buffer circuit 381 and an inverter circuit 382.

The buffer circuit 381 includes an inverter 401, a NAND circuit 402, a NOR circuit 403, a PMOS transistor 404, and an NMOS transistor 405.

In the buffer circuit 381, when the write control signal WR is High, the output of the NAND circuit 402 and the output of the NOR circuit 403 both become an inverted time code of the time code supplied from the D-F/F 351 in the time code transfer section 23. The output of the buffer circuit 381 becomes a time code obtained by further inverting the inverted time code. Consequently, the output of the buffer circuit 381 becomes equal to the time code supplied from the D-F/F 351. When the write control signal WR is Low, the output of the NAND circuit 402 is High and the output of the NOR circuit 403 is Low. This causes the buffer circuit 381 to output the Hi-Z state.

Meanwhile, the inverter circuit 382 has a clocked inverter configuration that includes two PMOS transistors 411 and 412, two NMOS transistors 413 and 414, and an inverter 415.

In the inverter circuit 382, when the read control signal RD is High, the clocked inverter becomes active. The inverter circuit 382 inverts the time code supplied from the bit storage section 242 and outputs the inverted time code. When the read control signal RD is Low, the clocked inverter becomes inert (inactive), and the inverter circuit 382 outputs the Hi-Z state.

Figure 12:
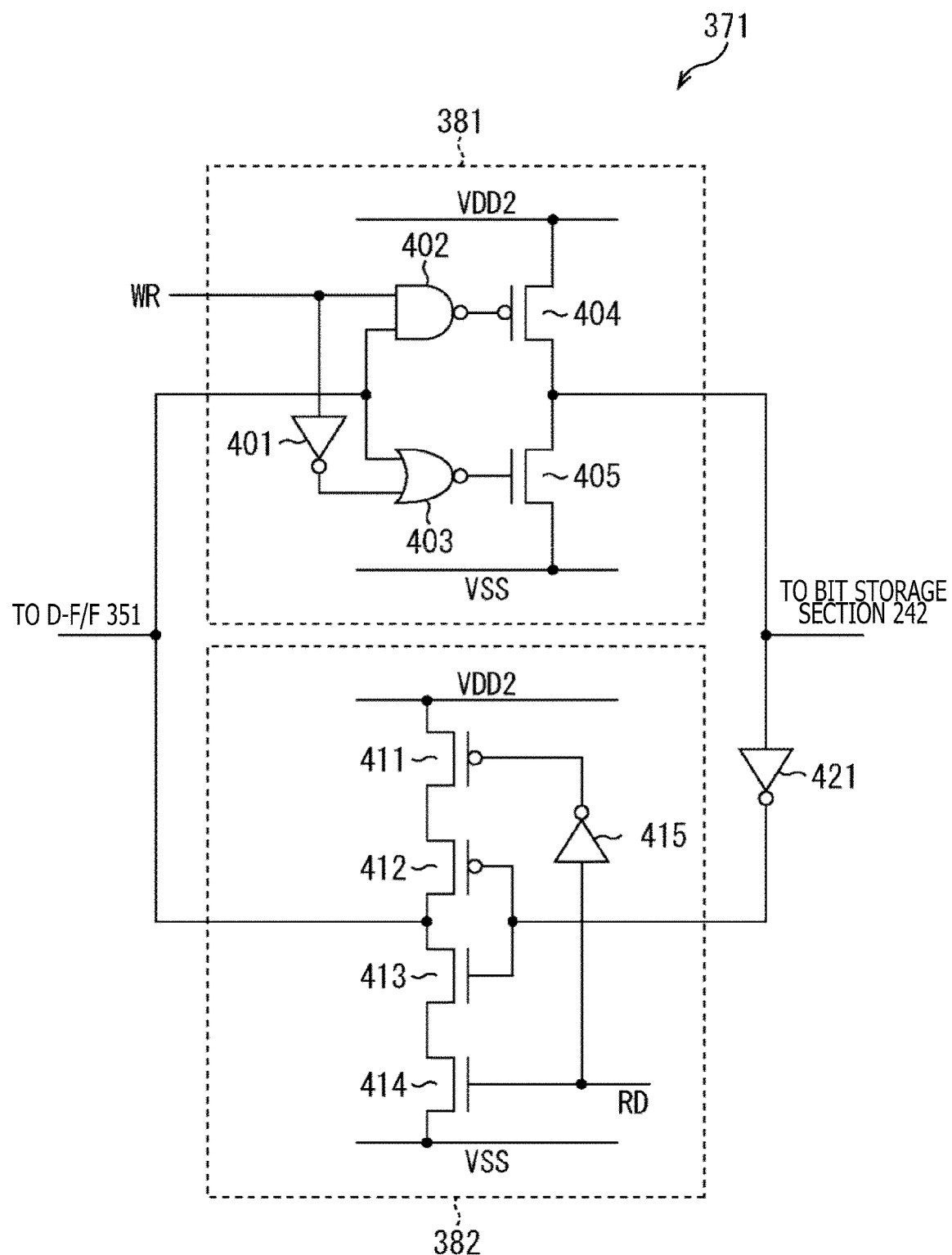
FIG. 12 is a schematic diagram depicting a second configuration example of the bidirectional buffer circuit.

FIG. 12 depicts a second configuration example of the bidirectional buffer circuit 371.

The bidirectional buffer circuit 371 depicted in FIG. 12 has an inverter 421 disposed upstream of the inverter circuit 382 in addition to the buffer circuit 381 and the inverter circuit 382 illustrated in FIG. 11.

In the first configuration example of the bidirectional buffer circuit 371 in FIG. 11, as described above, the time code supplied from the D-F/F 351 in the time code transfer section 23 is not inverted in polarity when written to the bit storage section 242 because the time code has the same value as the time code supplied from the D-F/F 351. The time code stored in the bit storage section 242 is inverted in polarity when read therefrom. Consequently, the read-out time code (A/D converted pixel data) is the data obtained by inverting the supplied time code.

Thus in the second configuration example of the bidirectional buffer circuit 371 depicted in FIG. 12, the inverter 421 is disposed upstream of the inverter circuit 382 so that the time code read from the bit storage section 242 will be output with the same polarity as that of the supplied time code.

The buffer circuit configuration adopted in FIG. 12 has the inverter 421 disposed upstream of the inverter circuit 382 so as to output a signal having the same polarity as the input signal also in the direction in which the time code is read out. The configuration of this buffer circuit may also be adopted for the buffer circuit 381 in the direction in which the time code is written. Conversely, the configuration having the inverter disposed upstream of the buffer circuit 381 in the time code writing direction may be used as the configuration of the inverter circuit 382 in the time code writing direction. Alternatively, some other suitable configuration may be adopted as the configuration of the buffer circuit 381 and the inverter circuit 382.

<Explanation of the D-F/F Count>

Figure 13:
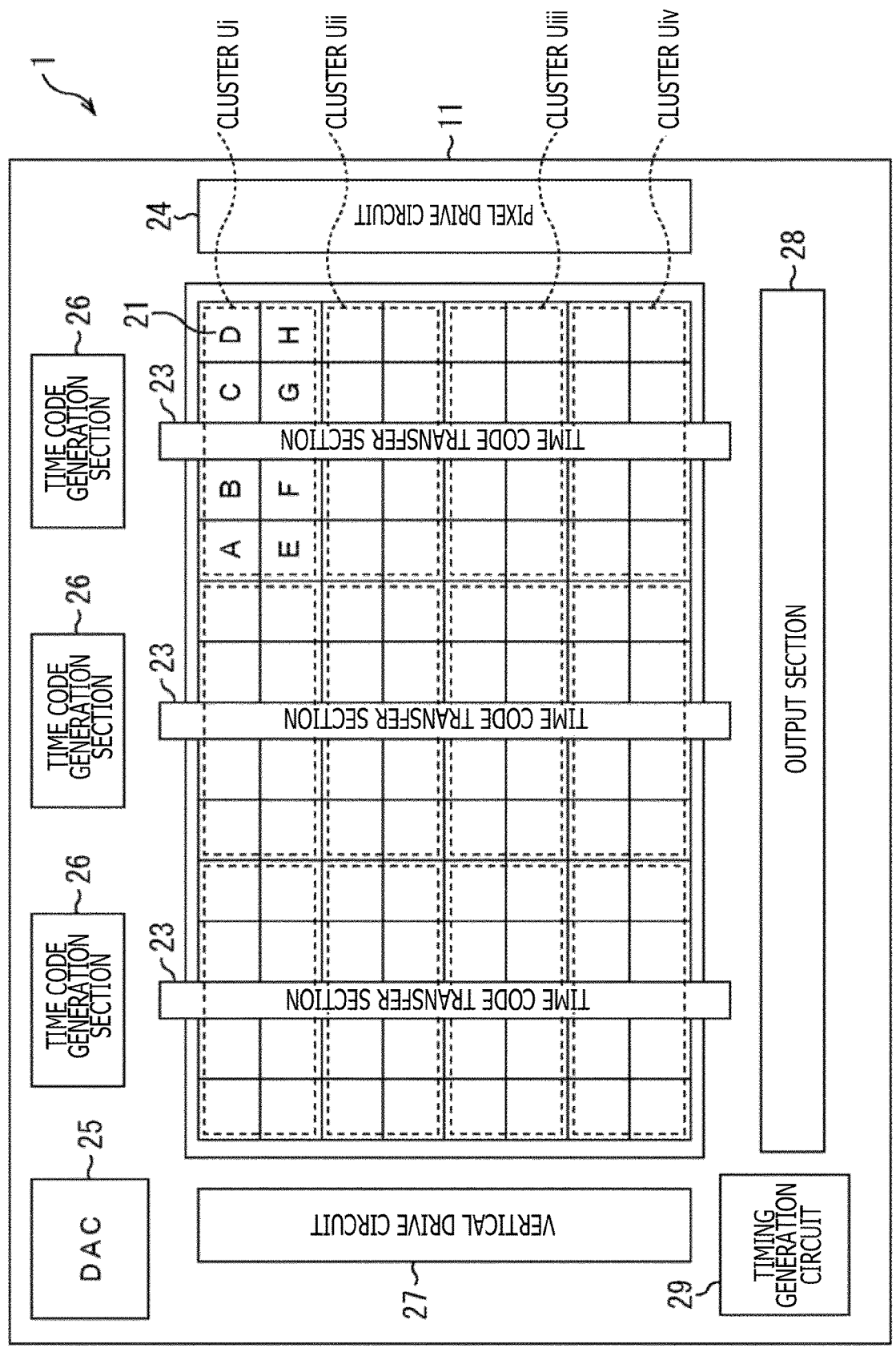
FIG. 13 is a schematic diagram explaining the number of D-F/Fs included in the shift register.

Explained next with reference to FIG. 13 is the number of D-F/Fs 351 in each shift register 341 of the time code transfer section 23 illustrated in FIG. 8.

It was explained above that the time code transfer section 23 has N shift registers 341-1 to 341-N corresponding to the N-bit time codes DATA[1] to DATA[N] and that each shift register 341 (shift registers 341-n) has multiple D-F/Fs 351.

It is assumed, for example, that the pixel array section 22 includes a total of 96 pixels 21 in 8 rows and 12 columns (in the vertical and horizontal directions) as depicted in FIG. 13 and that the pixel array section 22 as a whole is divided into four parts vertically and three parts horizontally, i.e., into 12 clusters U.

Where the pixel array section 22 is divided into multiple clusters U as assumed above, four clusters U in the same horizontal position, i.e., the clusters U grouped in the column direction (vertical direction), are provided with a single time code generation section 26 and a single time code transfer section 23.

In each of the time code transfer sections 23 provided to correspond individually to the time code generation sections 26, the shift register 341 in the time code transfer section 23 includes as many D-F/Fs 351 as the number of clusters U arrayed in the column direction.

Thus in the case where the pixel array section 22 is divided into four clusters U in the column direction as depicted in FIG. 13, the shift register 341 in each time code transfer section 23 includes four D-F/Fs 351.

Note that, in the description that follows, the four clusters U arrayed in the column direction are distinguished, for purpose of explanation, as cluster Ui, cluster Uii, cluster Uiii, and cluster Uiv from near the time code generation section 26 as depicted in FIG. 13. There will also be cases below where eight pixels 21 in a single cluster U may be distinguished as pixels 21A to 21H corresponding to locations "A" to "H" noted in the cluster Ui in FIG. 13.

Figure 14:
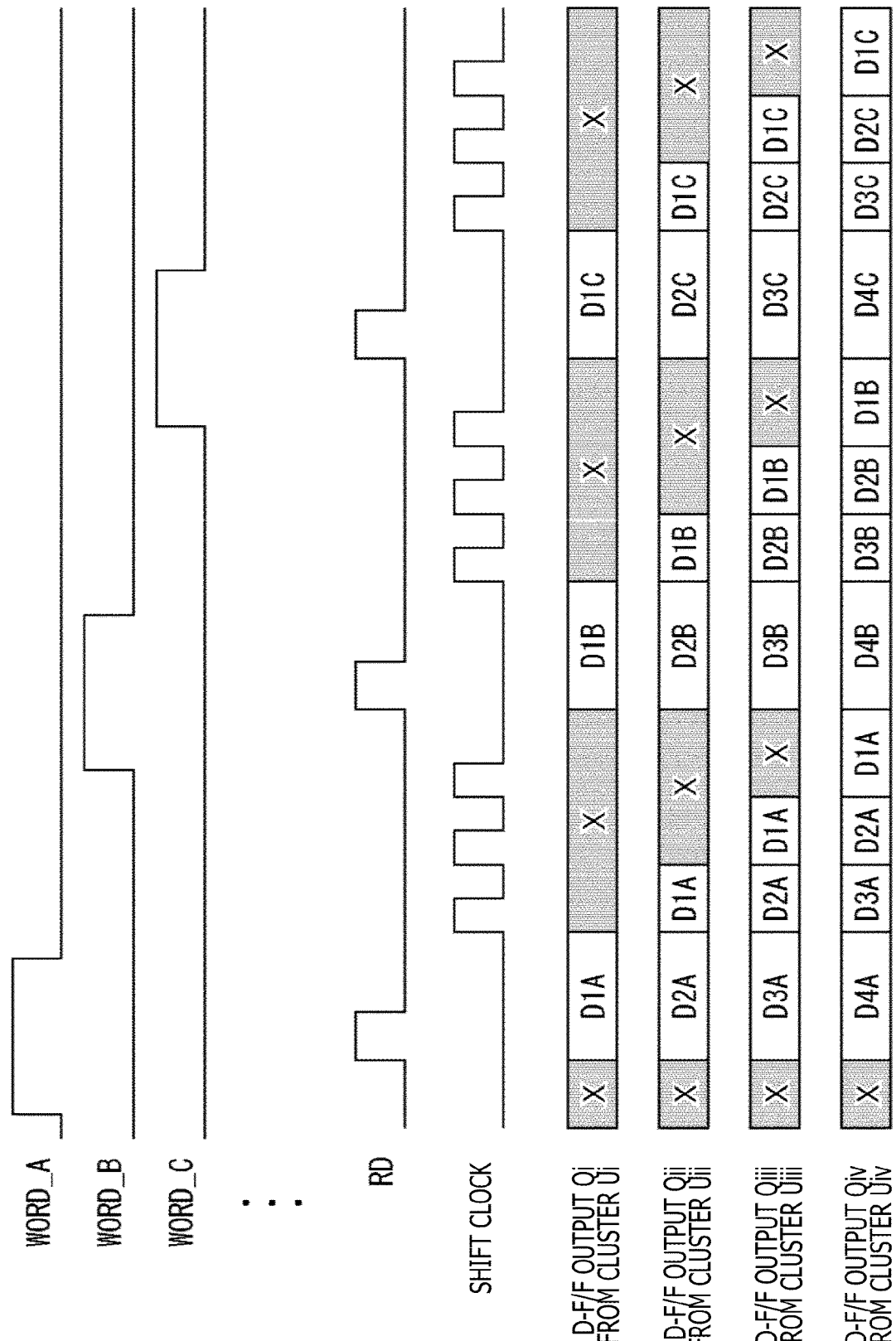
FIG. 14 is a timing chart explaining the flow of data output from four D-F/Fs included in the shift register.

FIG. 14 is a timing chart explaining the flow of data output from four D-F/Fs 351 included in the shift register 341 in each time code transfer section 23.

As described above, the WORD signal for the pixel 21A (WORD_A) is brought High in each of the four clusters Ui to Uiv arrayed in the column direction, and the read control signal RD supplied to the bidirectional buffer circuit 371 is temporarily brought High. This causes the pixel 21A in each of the four clusters Ui to Uiv to output A/D converted pixel data.

More specifically, the A/D converted pixel data D1A from the pixel 21A in the cluster Ui is supplied to the D-F/F 351 connected with the cluster Ui in the time code transfer section 23, and is output. The A/D converted pixel data D2A from the pixel 21A in the cluster Uii is supplied to the D-F/F 351 connected with the cluster Uii in the time code transfer section 23, and is output. The A/D converted pixel data D3A from the pixel 21A in the cluster Uiii is supplied to the D-F/F 351 connected with the cluster Uiii in the time code transfer section 23, and is output. The A/D converted pixel data D4A from the pixel 21A in the cluster Uiv is supplied to the D-F/F 351 connected with the cluster Uiv in the time code transfer section 23, and is output. The data from the D-F/F 351 connected with the cluster Uiv is output to the output section 28.

Thereafter, a three-pulse shift clock is supplied to the clock input of each D-F/F 351 in the time code transfer section 23. This causes the four D-F/Fs 351 in the shift register 341 to successively transfer the A/D converted pixel data D1A from the pixel 21A in the cluster Ui, the A/D converted pixel data D2A from the pixel 21A in the cluster Uii, the A/D converted pixel data D3A from the pixel 21A in the cluster Uiii, and the A/D converted pixel data D4A from the pixel 21A in the cluster Uiv. As a result, the output section 28 receives input of the A/D converted pixel data D4A from the pixel 21A in the cluster Uiv, the A/D converted pixel data D3A from the pixel 21A in the cluster Uiii, the A/D converted pixel data D2A from the pixel 21A in the cluster Uii, and the A/D converted pixel data D1A from the pixel 21A in the cluster Ui, in that order, from the D-F/F 351 connected with the cluster Uiv.

Next, the WORD signal for the pixel 21B (WORD B) is brought High in each of the four clusters Ui to Uiv arrayed in the column direction, and the read control signal RD supplied to the bidirectional buffer circuit 371 is temporarily brought High. This causes the pixel 21B in each of the four clusters Ui to Uiv to output A/D converted pixel data to the time code transfer section 23. The shift register 341 in the time code transfer section 23 then transfers the A/D converted pixel data from the pixel 21B in each of the four clusters Ui to Uiv to the output section 28.

In like manner, the A/D converted pixel data from the pixel 21C in each of the four clusters Ui to Uiv, as well as the A/D converted pixel data from the pixel 21D in each of the four clusters Ui to Uiv, are transferred from these pixels in the clusters U to the time code transfer section 23, before being further transferred from there to the output section 28.

FIG. 14 depicts an example in which a single cluster U includes four pixels 21A to 21D. This case is similar to the example above in which each cluster U includes eight pixels 21A to 21H. A similar configuration is also available where each cluster U includes any number K of pixels. Although the High periods of the WORD signal and of the RD signal are made to overlap in FIG. 14, they need not always overlap.

<6. Second Configuration Example of the Data Storage Section and the Time Code Transfer Section>

Figure 15:
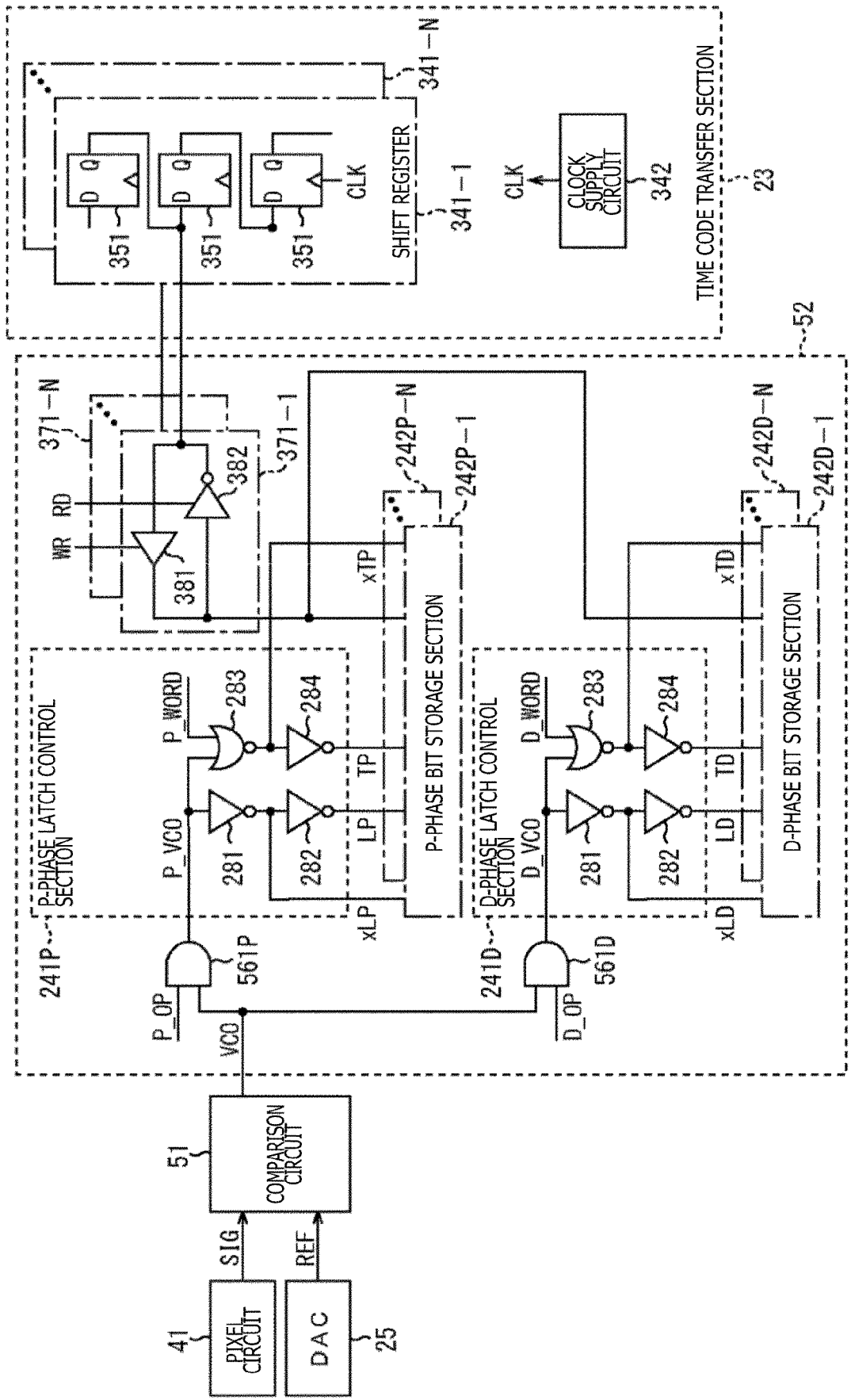
FIG. 15 is a circuit diagram depicting a second configuration example of the time code transfer section and the data storage section.

FIG. 15 is a circuit diagram depicting a second configuration example of the time code transfer section 23 and the data storage section 52.

The solid-state imaging apparatus 1 converts the pixel signal SIG at the reset level from analog to digital form to obtain P-phase data. Thereafter, the solid-state imaging apparatus 1 converts the pixel signal SIG at the signal level from analog to digital form to acquire D-phase data. The solid-state imaging apparatus 1 then performs the CDS process by which the difference between the P-phase data and the D-phase data is output as a video signal.

Comparing the second configuration of the data storage section 52 in FIG. 15 with the first configuration of the data storage section 52 in FIG. 8 reveals that the latch control section 241 in FIG. 8 is replaced with two control sections, i.e., a P-phase control section 241P for use with P-phase data and a P-phase control section 241D for use with D-phase data in FIG. 15.

Also, the bit storage sections 242-1 to 242-N in FIG. 8 are replaced with a set of P-phase bit storage sections 242P-1 to 242P-N for use with P-phase data and a set of D-phase bit storage sections 242D-1 to 242D-N for use with D-phase data. The detailed configuration of the P-phase bit storage sections 242P-1 to 242P-N and of the D-phase bit storage sections 242D-1 to 242D-N is the same as that of the bit storage sections 242-1 to 242-N in FIG. 8.

Two AND circuits 561P and 561D are added anew to the data storage section 52. One of the two inputs of each of the AND circuits 561P and 561D receives input of the output signal VCO from the comparison circuit 51. The other input of the AND circuit 561P receives input of a P-phase selection signal P_OP that goes High during an A/D conversion period for P-phase data. The other input of the AND circuit 561D receives input of a D-phase selection signal D_OP that goes High during an A/D conversion period for D-phase data.

In the first configuration of the data storage section 52 depicted in FIG. 8, the acquisition of D-phase data needs to be started after completion of the transfer of the acquired P-phase data. In other words, the acquisition of D-phase data must wait for the transfer of P-phase data to be completed.

In the second configuration of the data storage section 52 depicted in FIG. 15, the high-level P-phase selection signal P_OP and the low-level D-phase selection signal D_OP are supplied to the data storage section 52 during the first A/D conversion period for P-phase data. The P-phase data is stored into the P-phase bit storage sections 242P-1 to 242P-N.

During the next A/D conversion period for D-phase data, the low-level P-phase selection signal P_OP and the high-level D-phase selection signal D_OP are supplied to the data storage section 52, causing the D-phase data to be stored into the D-phase bit storage sections 242D-1 to 242D-N. Thereafter, the P-phase data and the D-phase data are output successively to the time code transfer section 23.

In the manner described above, the second configuration of the data storage section 52 in FIG. 15 shortens the time interval in which to acquire P-phase data and D-phase data, thereby improving the offset and noise canceling effects in CDS processing. Because the D-phase data and P-phase data are output successively to the time code transfer section 23, there is no need for the output section 28 to have a memory section for temporarily storing the P-phase data.

Note that the configuration of the time code transfer section 23 in FIG. 15 is the same as that of the time code transfer section 23 in FIG. 8.

<7. Third Configuration Example of the Data Storage Section and the Time Code Transfer Section>

Figure 16:
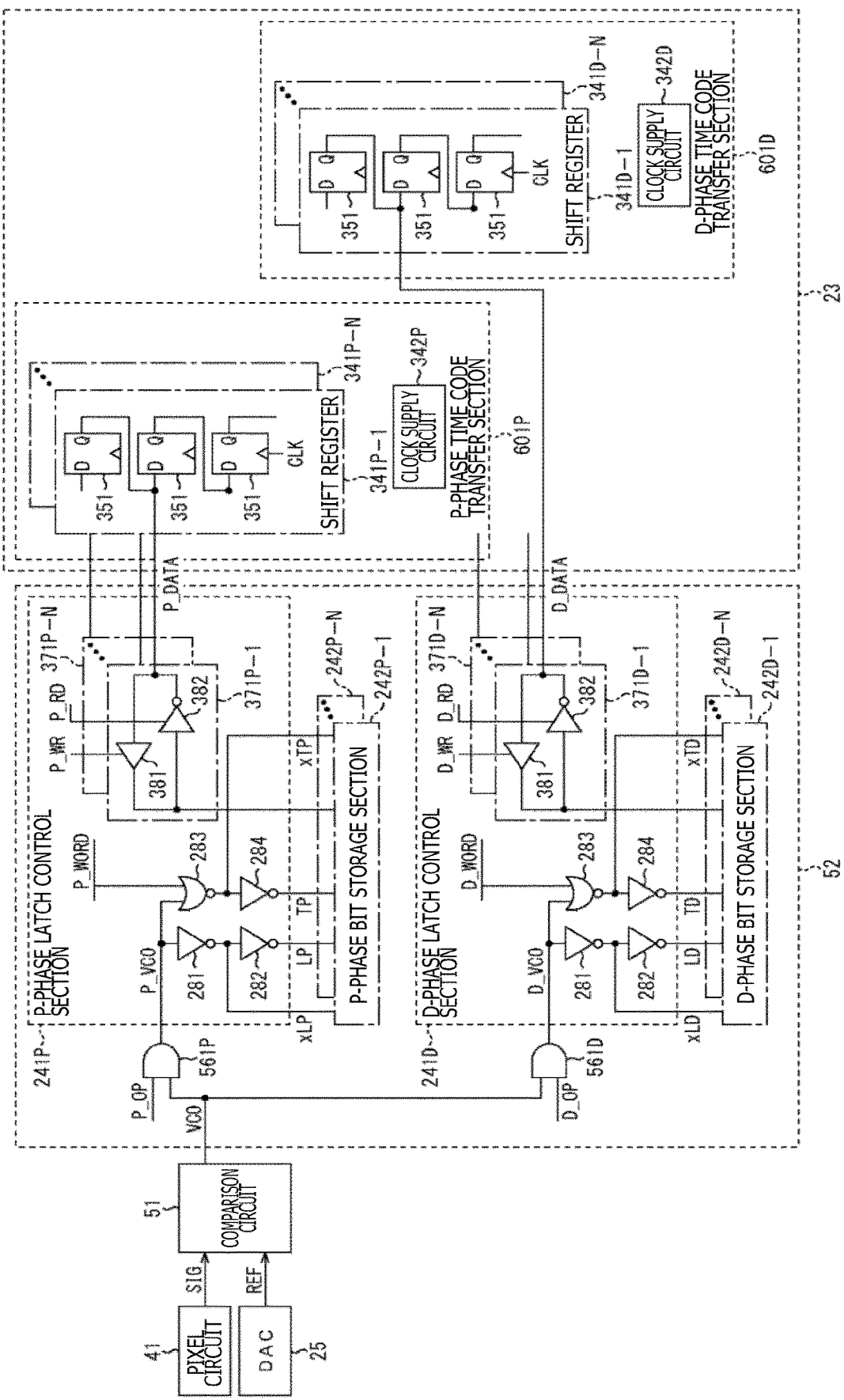
FIG. 16 is a circuit diagram depicting a third configuration example of the time code transfer section and the data storage section.

FIG. 16 is a circuit diagram depicting a third configuration example of the time code transfer section 23 and the data storage section 52.

Comparing the third configuration of the time code transfer section 23 depicted in FIG. 16 with the second configuration of the time code transfer section 23 in FIG. 15 reveals that the third configuration in FIG. 16 has two sets of the same configuration as that of the time code transfer section 23 in the second configuration in FIG. 15, one for use with P-phase data and the other for use with D-phase data.

That is, the time code transfer section 23 in the third configuration has a P-phase time code transfer section 601P for use with P-phase data and a D-phase time code transfer section 601D for use with D-phase data. The P-phase time code transfer section 601P includes N shift registers 341P-1 to 341P-N and a clock supply circuit 342P. The D-phase time code transfer section 601D includes N shift registers 341D-1 to 341D-N and a clock supply circuit 342D.

The data storage section 52 has two configurations, one including a set of N bidirectional buffer circuits 371-1 to 371-N corresponding to the P-phase time code transfer section 601P for use with P-phase data, the other including another set of N bidirectional buffer circuits 371-1 to 371-N corresponding to the D-phase time code transfer section 601D for use with D-phase data.

That is, the data storage section 52 in the third configuration includes N bidirectional buffer circuits 371P-1 to 371P-N corresponding to the P-phase time code transfer section 601P for use with P-phase data and N bidirectional buffer circuits 371D-1 to 371D-N corresponding to the D-phase time code transfer section 601D for use with D-phase data. The bidirectional buffer circuits 371P-1 to 371P-N for use with P-phase data are connected with the P-phase bit storage sections 242P-1 to 242P-N. The N bidirectional buffer circuits 371D-1 to 371D-N for use with D-phase data are connected with the D-phase bit storage sections 242D-1 to 242D-N.

The P-phase time code transfer section 601P is used to transfer the time code as P-phase data for write and read operations. The D-phase time code transfer section 601D is used to transfer the time code as D-phase data for write and read operations.

The rest of the third configuration is similar to the second configuration depicted in FIG. 15.

<Timing Chart of the Pixel Section>

Figure 17:
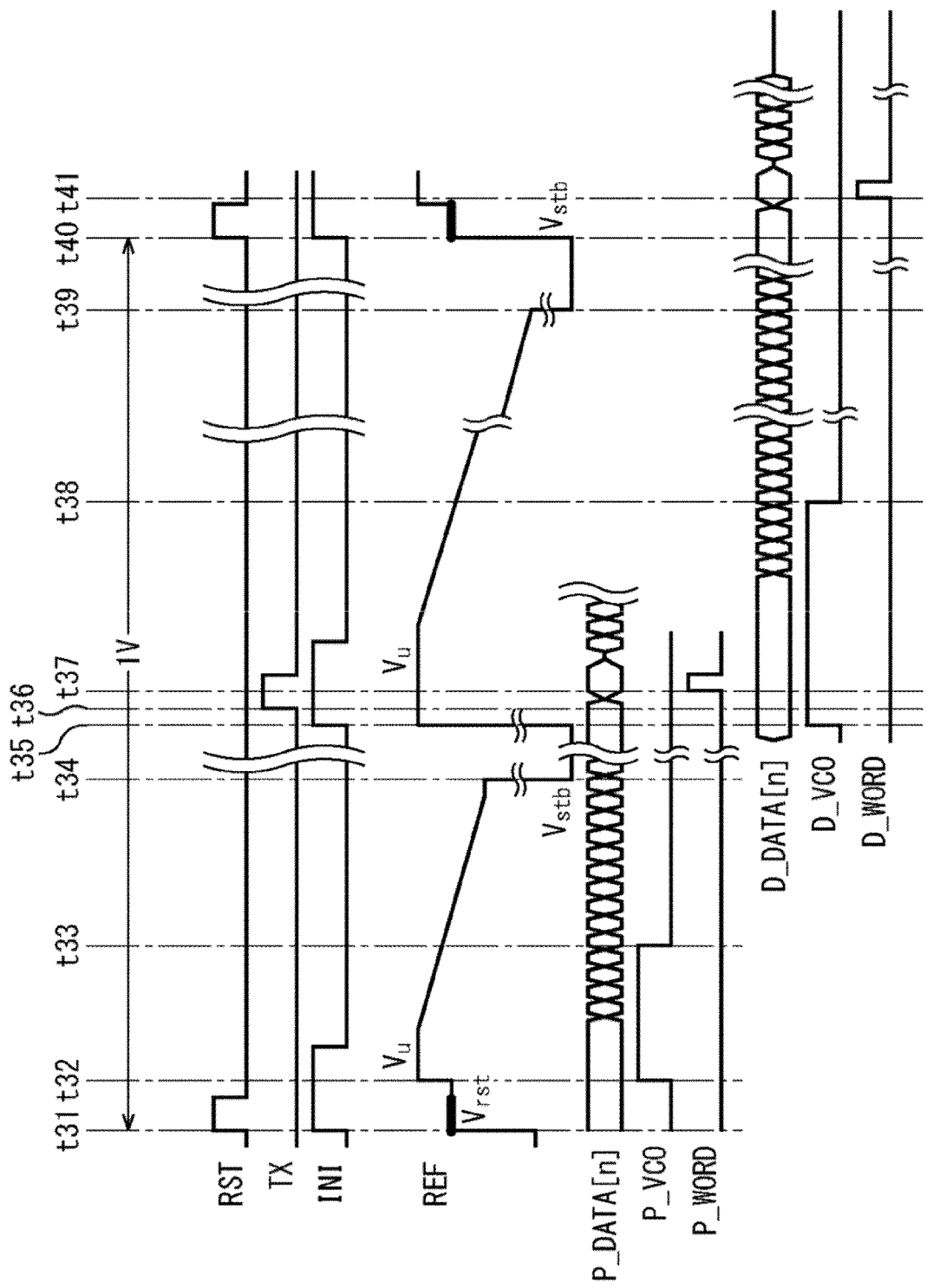
FIG. 17 is a timing chart explaining the operation of the pixel in the third configuration example.

FIG. 17 is a timing chart explaining the operation of the pixel 21 in the third configuration in FIG. 16.

First at time t31, the reference signal REF is switched from the current standby voltage $V_{stb}$ to the reset voltage $V_{rst}$ for resetting the electrical charge in the FD 125. Turning on the reset transistor 124 resets the electrical charge in the FD 125. Also at time t31, the initialization signal INI supplied to the gates of the transistors 101 and 103 in the positive feedback circuit 63 is brought High, which initializes the positive feedback circuit 63.

At time t32, the reference signal REF is raised to a predetermined voltage $V_u$, and a comparison between the reference signal REF and the pixel signal SIG (i.e., a sweep of the reference signal REF) is started. At this point, the output signal P_VCO is High because the reference signal REF is higher than the pixel signal SIG.

At time t33 when it is determined that the reference signal REF is equal to the pixel signal SIG, the output signal P_VCO is inverted (brought Low). With the output signal P_VCO inverted, the inversion of the output signal P_VCO is accelerated by the positive feedback circuit 63. The time data at the time the output signal P_VCO is inverted (i.e., N-bit time codes P_DATA[1] to P_DATA[N]) is stored into the P-phase bit storage sections 242P-1 to 242P-N in the data storage section 52.

With the signal write period terminated, at time t34, the voltage of the reference signal REF supplied to the gate of the transistor 81 in the comparison circuit 51 is brought down to a level at which the transistor 81 is turned off (i.e., to the standby voltage $V_{stb}$).

At time t35, the reference signal REF is raised up to the predetermined voltage $V_u$. At the same time, the initialization signal INI supplied to the gates of the transistors 101 and 103 is brought High, which again initializes the positive feedback circuit 63. At this point, the output signal D_VCO is High because the reference signal REF is higher than the pixel signal SIG.

At time t36, a high-level transfer signal TX turns on the transfer transistor 123 in the pixel circuit 41, transferring the electrical charge generated by the photodiode 121 to the FD 125.

At time t37, a P_WORD signal for controlling the read timing of P-phase data is brought High. This causes the P-phase bit storage sections 242P-1 to 242P-N in the data storage section 52 to output N-bit time codes P_DATA[1] to P_DATA[N]. The time codes P_DATA[1] to P_DATA[N] acquired at this point constitute the reset-level P-phase data for CDS processing.

At time t38 when it is determined that the reference signal REF is equal to the pixel signal SIG, the output signal D_VCO is inverted (brought Low). With the output signal D_VCO inverted, the inversion of the output signal D_VCO is accelerated by the positive feedback circuit 63. The time data at the time the output signal D_VCO is inverted (i.e., N-bit time codes D_DATA[1] to D_DATA[N]) is stored into the D-phase bit storage sections 242D-1 to 242D-N in the data storage section 52.

At time t39 when the write period for the D-phase data is terminated, the voltage of the reference signal REF supplied to the gate of the transistor 81 in the comparison circuit 51 is brought down to the level at which the transistor 81 is turned off (i.e., to the standby voltage $V_{stb}$).

At time t40, the next 1V (one vertical scanning period) starts to be driven. Later at t41, a D_WORD signal for controlling the read timing of D-phase data is brought High. This causes the D-phase bit storage sections 242D-1 to 242D-N in the data storage section 52 to output N-bit time codes D_DATA[1] to D_DATA[N]. The N-bit time codes D_DATA[1] to D_DATA[N] acquired at this point constitute the D-phase data at the signal level for CDS processing.

In the driving of the pixel 21 of the above-described third configuration, during the D-phase data write period started at time t35, the reading of D-phase data is carried out in parallel. During the P-phase data write period started at time t40, the reading of D-phase data is performed in parallel.

Consequently, the writing of D-phase data can be started, for example, with no need to wait for the reading of the P-phase data from all pixels to be completed. That means the period between time t34 and time t35 in FIG. 17 is made shorter than the period between time t4 and time t6 in FIG. 6. This permits imaging at higher speeds.

<8. Fourth Configuration Example of the Data Storage Section and the Time Code Transfer Section>

Figure 18:
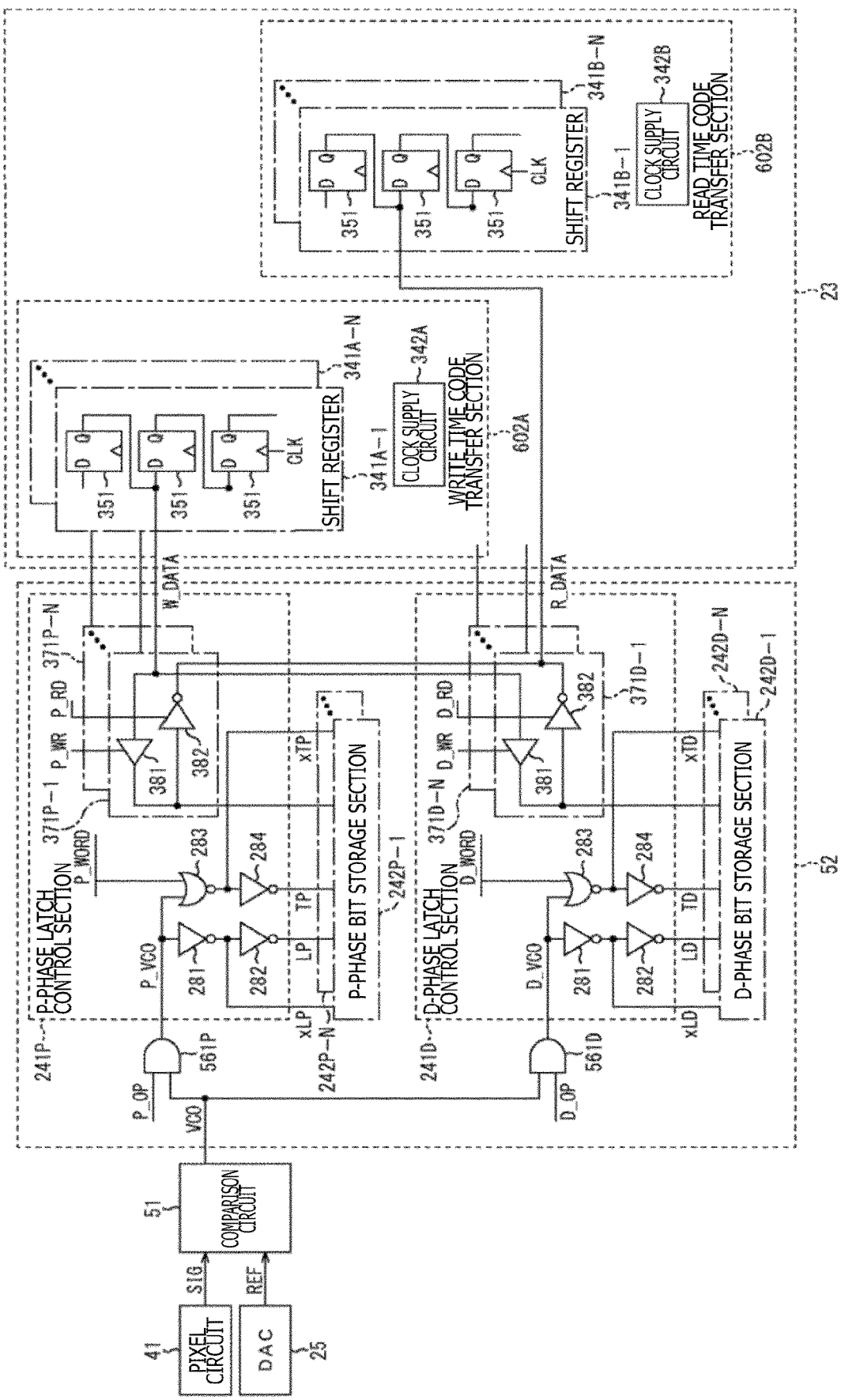
FIG. 18 is a circuit diagram depicting a fourth configuration example of the time code transfer section and the data storage section.

FIG. 18 is a circuit diagram depicting a fourth configuration example of the time code transfer section 23 and the data storage section 52.

Comparing the fourth configuration of the time code transfer section 23 depicted in FIG. 18 with the second configuration of the time code transfer section 23 in FIG. 15 reveals that the fourth configuration in FIG. 18 has two sets of the same configuration as the second configuration of the time code transfer section 23 in FIG. 15, one being destined for use in time code writing and the other for use in time code reading.

That is, the time code transfer section 23 of the fourth configuration includes a write time code transfer section 602A for use in time code writing and a read time code transfer section 602B for use in time code reading. The write time code transfer section 602A includes N shift registers 341A-1 to 341A-N and a clock supply circuit 342A. The read time code transfer section 602B includes N shift registers 341B-1 to 341B-N and a clock supply circuit 342B.

As with the third configuration depicted in FIG. 16, the configuration of the data storage section 52 includes the N bidirectional buffer circuits 371P-1 to 371P-N for use with P-phase data and the N bidirectional buffer circuits 371D-1 to 371D-N for use with D-phase data. However, it is to be noted that in the fourth configuration in FIG. 18, the bidirectional buffer circuits 371P-1 to 371P-N and the bidirectional buffer circuits 371D-1 to 371D-N are connected with components different from those in the third configuration in FIG. 16.

Specifically, in the third configuration illustrated in FIG. 16, the N bidirectional buffer circuits 371P-1 to 371P-N for use with P-phase data in the buffer circuit 381 and the inverter circuit 382 are both connected with a single time code transfer section (P-phase time code transfer section 601P) in the time code transfer section 23.

In the fourth configuration in FIG. 18, by contrast, the N bidirectional buffer circuits 371P-1 to 371P-N for use with P-phase data in the buffer circuit 381 are connected with one of the two time code transfer sections (write time code transfer section 602A) in the time code transfer section 23, and the inverter circuit 382 is connected with the other time code transfer section (read time code transfer section 602B).

The same applies to the bidirectional buffer circuits 371D-1 to 371D-N for use with D-phase data. That is, in the third configuration depicted in FIG. 16, the bidirectional buffer circuits 371D-1 to 371D-N for use with D-phase data in the buffer circuit 381 and the inverter circuit 382 are both connected with a single time code transfer sections (D-phase time code transfer section 601D) in the time code transfer section 23.

In the fourth configuration in FIG. 18, by contrast, the N bidirectional buffer circuits 371D-1 to 371D-N for use with D-phase data in the buffer circuit 381 are connected with one of the two time code transfer sections (write time code transfer section 602A) in the time code transfer section 23, and the inverter circuit 382 is connected with the other time code transfer section (read time code transfer section 602B).

The write time code transfer section 602A is used for write transfers of P-phase data time codes and D-phase data time codes. The read time code transfer section 602B is used for read transfers of P-phase data time codes and D-phase data time codes.

The rest of the fourth configuration is similar to the second configuration depicted in FIG. 15.

The pixel 21 in the above-described fourth configuration is driven in a manner similar to that in which the pixel in the third configuration explained above with reference to FIG. 17 is driven. Thus during the write period for D-phase data, the reading of P-phase data is performed in parallel; during the read period for P-phase data, the reading of D-phase data is carried out in parallel.

Consequently, the writing of D-phase data can be started, for example, with no need to wait for the reading of the P-phase data from all pixels to be completed. This permits imaging at higher speeds.

<9. Fifth Configuration Example of the Data Storage Section and the Time Code Transfer Section>

Figure 19:
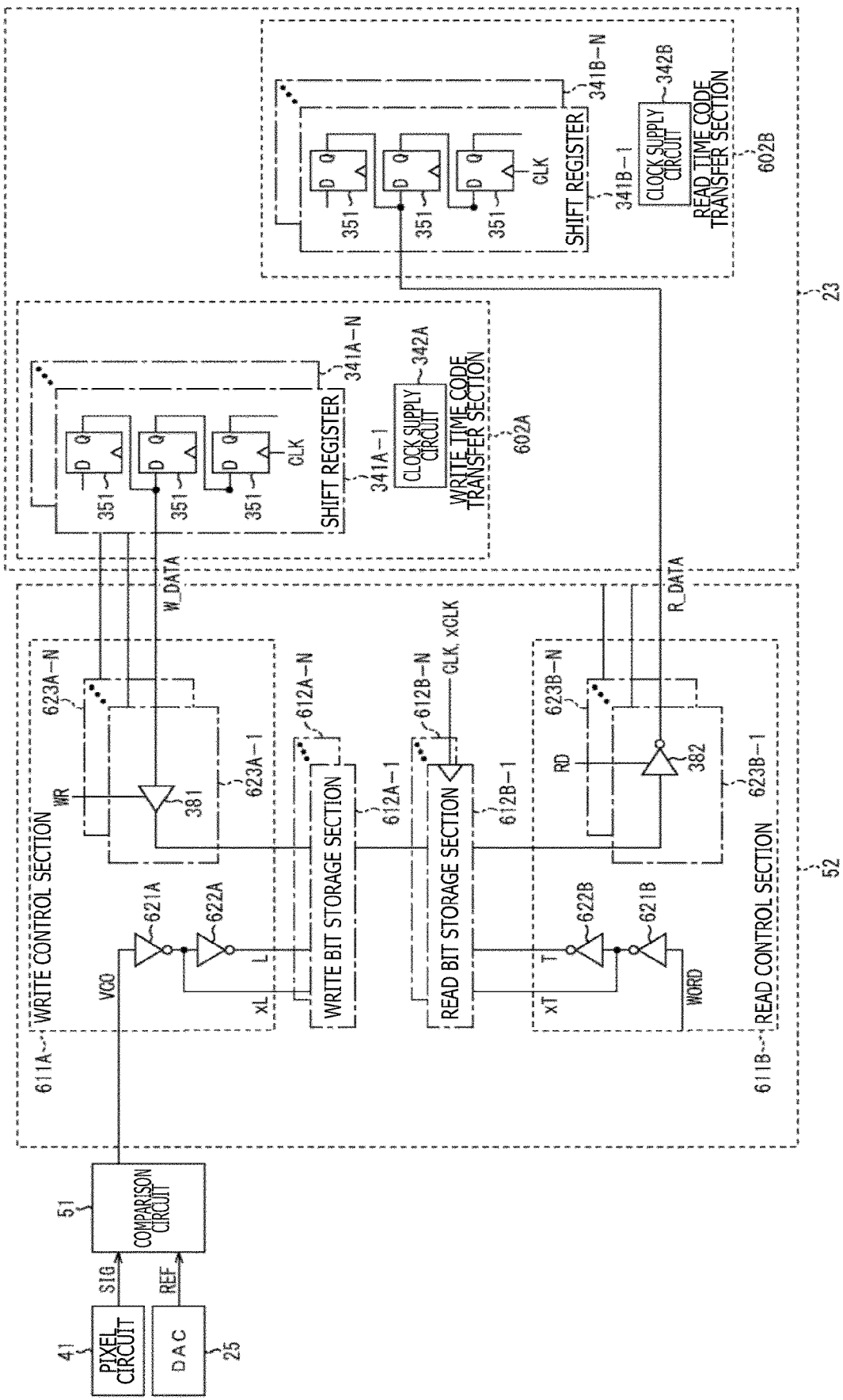
FIG. 19 is a circuit diagram depicting a fifth configuration example of the time code transfer section and the data storage section.

FIG. 19 is a circuit diagram depicting a fifth configuration example of the time code transfer section 23 and the data storage section 52.

The fifth configuration of the time code transfer section 23 in FIG. 19 is similar to the fourth configuration depicted in FIG. 18. That is, the time code transfer section 23 in the fifth configuration includes the write time code transfer section 602A for use in time code writing and the read time code transfer section 602B for use in time code reading.

Meanwhile, comparing the configuration of the data storage section 52 between the fifth configuration in FIG. 19 and the fourth configuration in FIG. 18 reveals that in the fourth configuration in FIG. 18, the latch control section and the bit storage section are each divided in two for use with P-phase data and D-phase data.

In the fifth configuration in FIG. 19, by contrast, the bit storage section is divided in two for use in time code writing and time code reading.

Specifically, the data storage section 52 in FIG. 19 includes a write control section 611A, a read control section 611B, N write bit storage sections 612A-1 to 612A-N, and N read bit storage sections 612B-1 to 612B-N.

The write control section 611A causes the time code supplied from the write time code transfer section 602A to be stored into the write bit storage sections 612A-1 to 612A-N on the basis of the output signal VCO from the comparison circuit 51.

The write control section 611A includes two serially connected inverters 621A and 622A and N time code input circuits 623A-1 to 623A-N.

The two inverters 621A and 622A supply the output signal VCO from the comparison circuit 51 and an inverted signal of the output signal VCO to the write bit storage section 612A. The two inverters 621A and 622A provide the function similar to that of the inverters 281 and 282 in the first to the fourth configurations discussed above.

The N time code input circuits 623A-1 to 623A-N each include the same buffer circuit 381 as that on the time code write side of the bidirectional buffer circuits 371-1 to 371-N in the above-described first to fourth configurations. The buffer circuit 381 is connected with a predetermined D-F/F 351 in the write time code transfer section 602A. While being supplied with the high-level write control signal WR, the buffer circuit 381 supplies the write bit storage section 612A with the time code supplied from the D-F/Fs 351.

The write bit storage sections 612A-1 to 612A-N are connected with the read bit storage sections 612B-1 to 612B-N, respectively. The write bit storage sections 612A-1 to 612A-N transfer the time codes stored therein to the read bit storage sections 612B-1 to 612B-N in a suitably timed manner.

The read bit storage sections 612B-1 to 612B-N acquire and store the time codes from the write bit storage sections 612A-1 to 612A-N at a predetermined timing based on the input clock signals CLK and xCLK.

On the basis of the WORD signal for controlling the read timing, the read control section 611B reads the time codes as the A/D converted pixel data stored in the read bit storage sections 612B-1 to 612B-N. The read control section 611B outputs the read time codes to the read time code transfer section 602B.

The read control section 611B includes two serially connected inverters 621B and 622B and N time code output circuits 623B-1 to 623B-N. The two inverters 621B and 622B supply the WORD signal for controlling the read timing and an inverted signal of the WORD signal to the read bit storage sections 612B-1 to 612B-N.

The N time code output circuits 623B-1 to 623B-N each include the same inverter circuit 382 as that on the time code readout side of the bidirectional buffer circuits 371-1 to 371-N in the first to the fourth configurations described above. The inverter 382 is connected with a predetermined D-F/F 351 in the read time code transfer section 602B. While being supplied with the high-level read control signal RD, the inverter circuit 382 supplies the time codes (A/D converted pixel data) stored in the read bit storage sections 612B-1 to 612B-N to the D-F/Fs 351 in the read time code transfer section 602B.

A detailed configuration of the write bit storage section 612A-n and the read bit storage section 612B-n is explained below with reference to FIG. 20.

Figure 20:
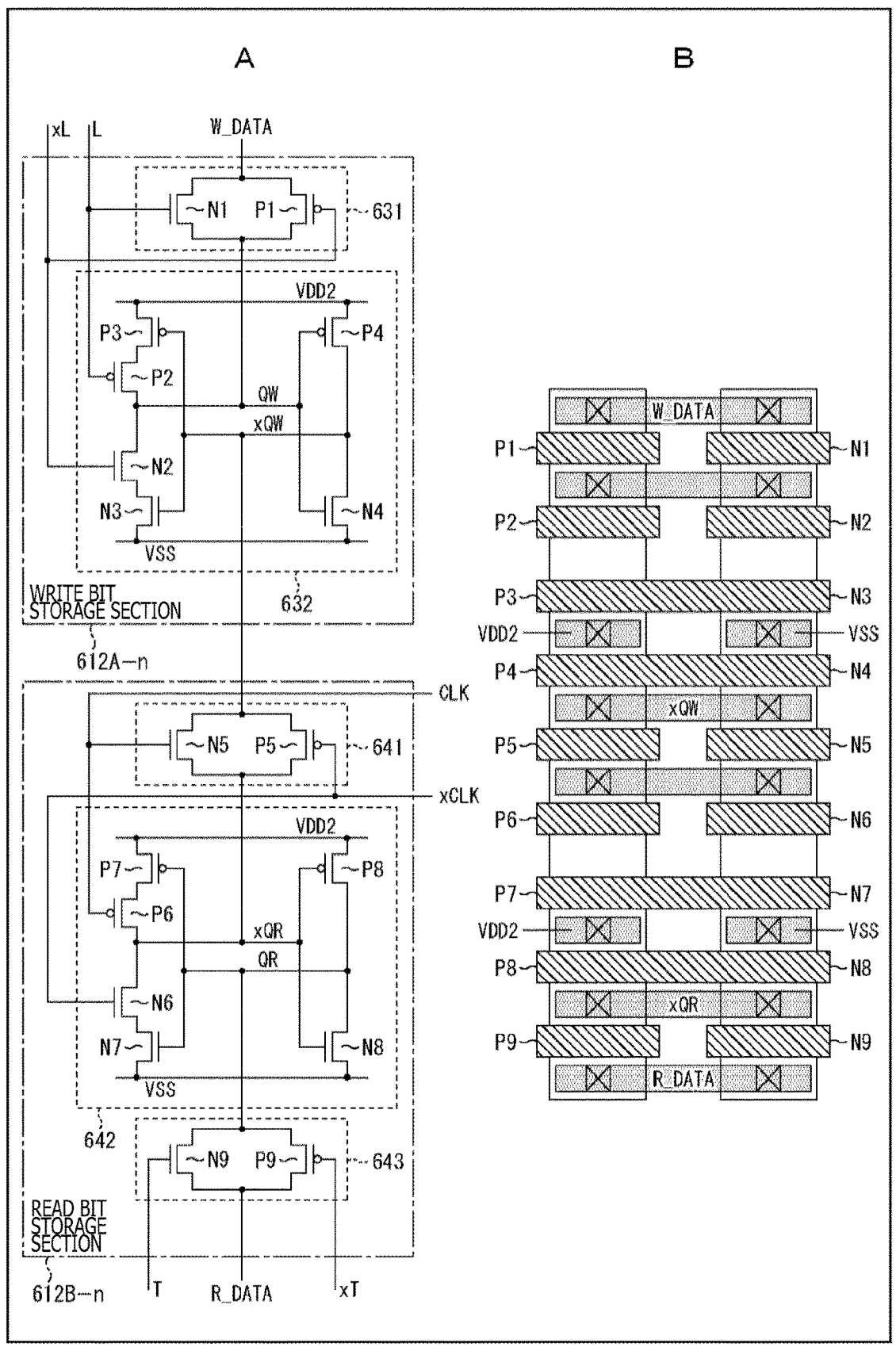
FIG. 20 is a circuit diagram depicting a detailed configuration example of a write bit storage section and a read bit storage section included in FIG. 19.

Subfigure A in FIG. 20 is a typical circuit diagram of the write bit storage section 612A-n and the read bit storage section 612B-n.

As with the bit storage section 242-n in FIG. 8, the write bit storage section 612A-n includes a transfer gate 631 and a latch storage section 632.

The transfer gate 631 includes an NMOS transistor N1 and a PMOS transistor P1. The latch storage section 632 includes a static latch circuit including NMOS transistors N2 to N4 and PMOS transistors P2 to P4. The connections of the transistors and the input signals supplied thereto are similar to those of the bit storage section 242-n in FIG. 8.

In the time code write operation, the transfer gate 631 conducts when the output signal VCO (input L in FIG. 20) is High and is blocked when the output signal VCO is Low. The feedback of the latch storage section 632 (output xQW with regard to input QW) is blocked when the output signal VCO is High and conducts when the output signal VCO is Low. Consequently, the latch storage section 632 enters a write state (transparent state) to have the n-th bit time code written thereto when the output signal VCO is High; the latch storage section 632 enters a hold state (latch state) to hold the time code written thereto via the time code input circuit 623A-n (FIG. 19) when the output signal VCO is Low.

The read bit storage section 612B-n includes a transfer gate 641, a latch storage section 642, and a transfer gate 643.

The transfer gate 641 includes an NMOS transistor N5 and a PMOS transistor P5.

The latch storage section 642 includes a static latch circuit including NMOS transistors N6 to N8 and PMOS transistors P6 to P8.

The transfer gate 643 includes an NMOS transistor N9 and a PMOS transistor P9.

The clock signal CLK for controlling the timing of time code transfers from the write bit storage section 612A-n to the read bit storage section 612B-n is supplied to the gate of the NMOS transistor N5 in the transfer gate 641 and to the gate of the PMOS transistor P6 in the latch storage section 642. The inverted signal xCLK of the clock signal CLK is supplied to the gate of the PMOS transistor P5 in the transfer gate 641 and to the gate of the NMOS transistor N6 in the latch storage section 642.

In the read bit storage section 612B-n, the transfer gate 641 conducts when the input clock signal CLK is High. This causes the time code stored in the latch storage section 632 of the write bit storage section 612A-n to be transferred to and held in the latch storage section 642.

The WORD signal for controlling the read timing (input T in FIG. 20) is supplied to the gate of the NMOS transistor N9 in the transfer gate 643. An inverted signal of the WORD signal is supplied to the gate of the PMOS transistor P9 in the transfer gate 643.

The transfer gate 643 conducts only when the high-level WORD signal is input. This causes the time code held in the latch storage section 642 to be output to the read time code transfer section 602B via the time code output circuit 623B-n (FIG. 19).

Subfigure B in FIG. 20 depicts a typical transistor layout of the write bit storage section 612A-n and read bit storage section 612B-n.

As depicted in Subfigure B in FIG. 20, the write bit storage sections 612A-n and the read bit storage section 612B-n are formed by having PMOS transistors P1 to P9 arranged in a single column and NMOS transistors N1 to N9 arranged adjacent thereto in a single column. The lines for transmitting write time code W_DATA and read time code R DATA are shared by another adjacent cluster U.

The characteristics of the above-described first to fifth configurations of the time code transfer section 23 and the data storage section 52 are explained below with reference to FIG. 21.

Figure 21:
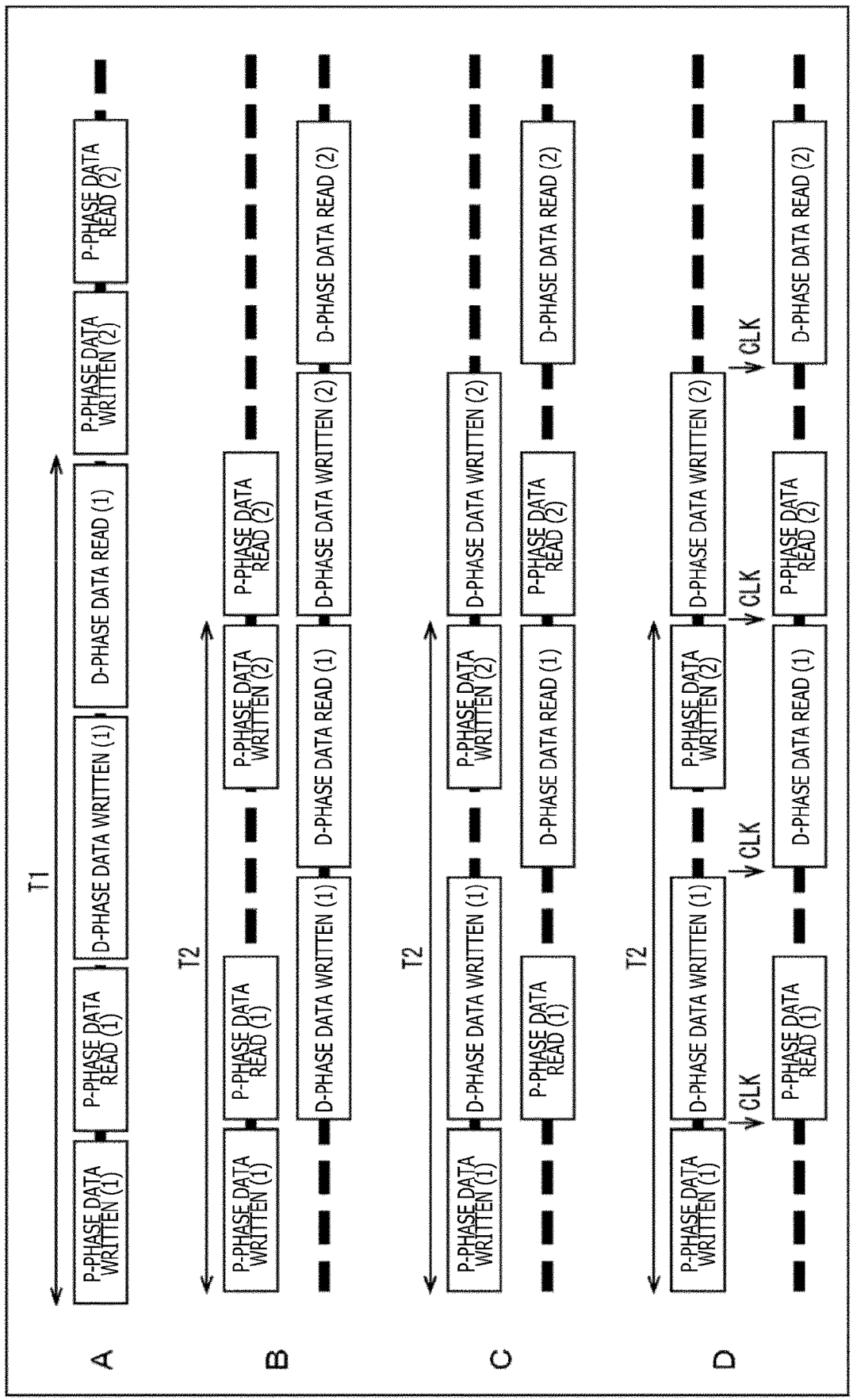
FIG. 21 is a schematic diagram explaining the characteristics of the first through the fifth configuration examples.

FIG. 21 illustrates the time code transfer operations for writing and reading P-phase data and D-phase data to and from some pixels in the first to the fifth configurations discussed above, with the horizontal direction of the drawing indicating the time axis.

Subfigure A in FIG. 21 depicts the time code transfer operation of the time code transfer section 23 and data storage section 52 in the first and the second configurations (FIGS. 8 and 15).

Subfigure B in FIG. 21 depicts the time code transfer operation of the time code transfer section 23 and data storage section 52 in the third configuration (FIG. 16).

Subfigure C in FIG. 21 depicts the time code transfer operation of the time code transfer section 23 and data storage section 52 in the fourth configuration (FIG. 18).

Subfigure D in FIG. 21 depicts the time code transfer operation of the time code transfer section 23 and data storage section 52 in the fifth configuration (FIG. 19).

In FIG. 21, the time data (P-phase data or D-phase data) with different parenthesized numbers represent time data of different pixels. The write time for P-phase data is shorter than the write time for D-phase data. The read time is equal for both P-phase data and D-phase data, or is shorter for either P-phase data or D-phase data than for the other type of data depending on the system. Note that, in Subfigures A to D in FIG. 21, thick broken lines each denote a single time code transfer path constituted by a single shift register 341.

In the first and the second configurations of the time code transfer section 23 and the data storage section 52, there is only one time code transfer path for the time code transfer section 23. For this reason, as depicted in Subfigure A in FIG. 21, the writing of P-phase data, reading of P-phase data, writing of D-phase data, and reading of D-phase data are serially carried out. In other words, a downstream write or read operation cannot be performed until the upstream write or read operation is completed.

In the first and the second configurations, the time required from the time P-phase data is written to a single pixel until the time D-phase data is completely read therefrom amounts to a time T1 indicated in Subfigure A in FIG. 21.

In the third configuration, by contrast, P-phase data and D-phase data are transferred along separate time code transfer paths as depicted in Subfigure B in FIG. 21. It follows that upon completion of the writing of P-phase data, the writing of D-phase data can be started immediately with no need to wait for the reading of P-phase data to be completed.

The time required from the time P-phase data is written to a single pixel until the time D-phase data is completely read therefrom amounts to a time T2 indicated in Subfigure B in FIG. 21, the time T2 being shorter than the time T1 in the first and the second configurations. Thus the third configuration permits imaging at higher speeds than the first or the second configuration.

Also, because the time interval between acquisition of the P-phase data and acquisition of the D-phase data is shortened, the noise canceling effect at the time of CDS processing is improved.

As with the third configuration, the fourth configuration allows P-phase data and D-phase data to be transferred through separate time code transfer paths as depicted in Subfigure C in FIG. 21. Thus upon completion of the writing of P-phase data, the writing of D-phase data can be immediately started with no need to wait for the reading of the P-phase data to be completed.

The time required from the time P-phase data is written to a single pixel until the time D-phase data is completely read therefrom is the time T2 that is shorter than the time T1. As a result, imaging is performed at higher speeds.

Also, because the time interval between acquisition of the P-phase data and acquisition of the D-phase data is shortened, the noise canceling effect at the time of CDS processing is improved.

The difference between the third configuration and the fourth configuration is this: that the time codes transferred using a single time code transfer path are separated for use with P-phase data and D-phase data in the third configuration, whereas the time codes are separated for use in writing and reading with the fourth configuration. Thus in the fourth configuration, the time code at the time of writing P-phase data and the time code at the time of writing D-phase data pass through the same time code transfer path.

The CDS processing requires that correlations be high between the time code at the time of writing P-phase data and the time code at the time of writing D-phase data.

Because the time code transfer paths are relatively long, there may occur variations in time code arrival time depending on parasitic CR and variations in transistor characteristics. The third configuration thus requires that its circuit size and its circuit layout be devised to make such variations negligible.

In the fourth configuration, by contrast, the time code at the time of writing P-phase data and the time code at the time of writing D-phase data pass through the same time code transfer path. Thus the fourth configuration has no need to deal with variations in time code arrival time due to the use of different time code transfer paths.

Consequently, the fourth configuration allows the correlations between the time code at the time of writing P-phase data and the time code at the time of writing D-phase data to be higher than the third configuration.

In the case of the fifth configuration, the workings of the two time code transfer paths are the same as those of the fourth configuration as depicted in Subfigure D in FIG. 21. The time code transfer paths are switched when the write bit storage section 612A transfers the time code to the read bit storage section 612B.

The fifth configuration allows the correlations between the time code at the time of writing P-phase data and the time code at the time of writing D-phase data to be still higher than the fourth configuration. That is because the path along which to transmit the output signal VCO from the comparison circuit 51 is used in common as is evident in FIG. 19.

Furthermore, the inside of the data storage section 52 is divided for use in time code writing and time code reading. This simplifies the circuit configuration, lowers the number of the elements involved, and reduces the circuit area.

<10. Sixth Configuration Example of the Data Storage Section and the Time Code Transfer Section>

Figure 22:
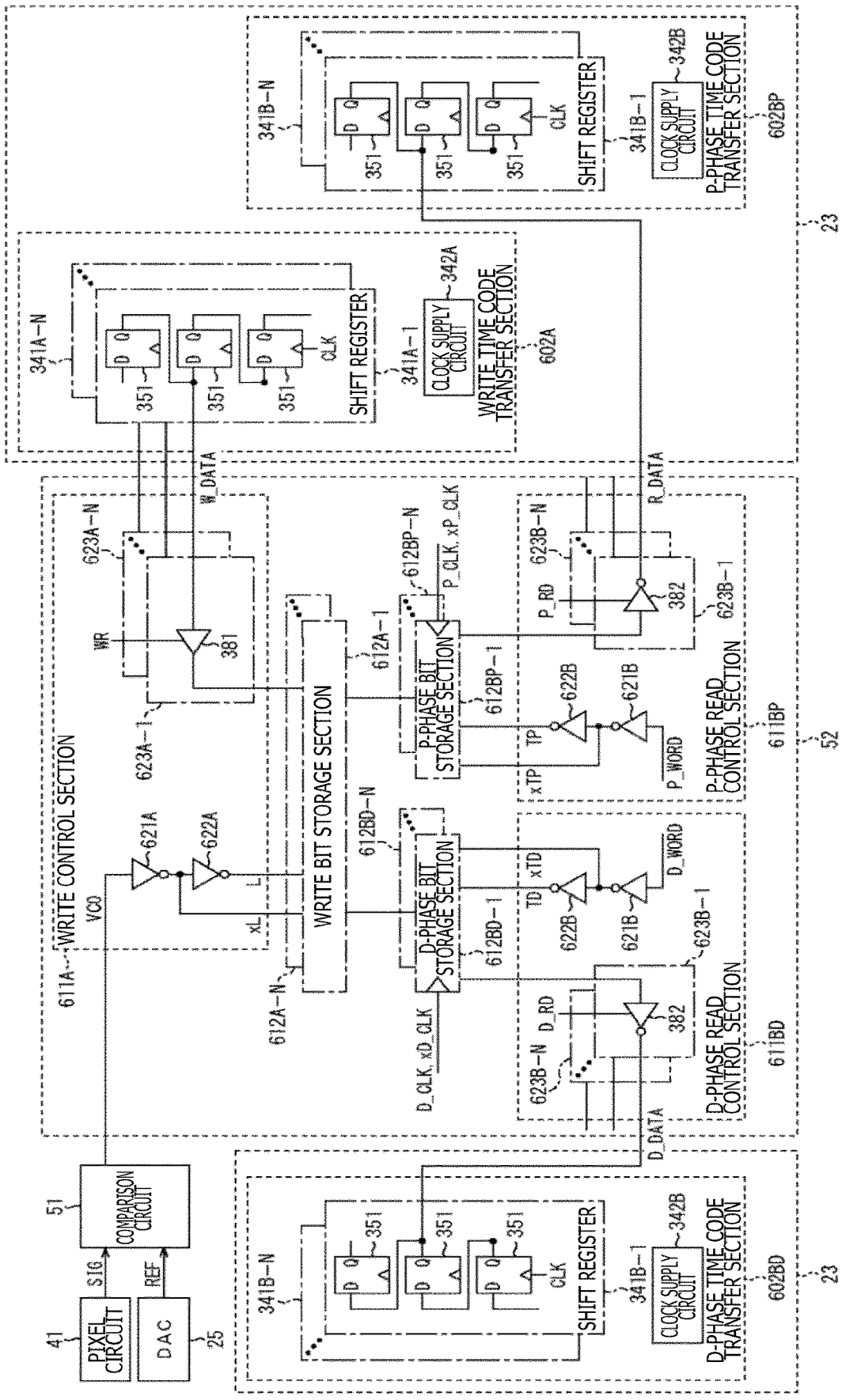
FIG. 22 is a circuit diagram depicting a sixth configuration example of the time code transfer section and the data storage section.

FIG. 22 is a circuit diagram depicting a sixth configuration example of the time code transfer section 23 and the data storage section 52.

The sixth configuration in FIG. 22 is provided when the read bit storage sections 612B-1 to 612B-N and the read control section 611B in the data storage section 52 of the fifth configuration in FIG. 19 are separated for use with P-phase data and D-phase data.

That is, in the sixth configuration in FIG. 22, the read bit storage sections 612B-1 to 612B-N and the read control section 611B in the data storage section 52 of the fifth configuration in FIG. 19 are replaced with P-phase bit storage sections 612BP-1 to 612BP-N for use with P-phase data, a P-phase read control section 611BP, D-phase bit storage sections 612BD-1 to 612BD-N for use with D-phase data, and a D-phase read control section 611BD.

Also in the time code transfer section 23, the read time code transfer section 602B for use in time code reading in the fifth configuration in FIG. 19 is replaced with a P-phase time code transfer section 602BP for use with P-phase data and a D-phase time code transfer section 602BD for use with D-phase data. In this configuration, the time code transfer section 23 has a total of three time code transfer paths including the write time code transfer section 602A. FIG. 22 depicts the time code transfer section 23 separated into the left and right parts for want of space.

The rest of the sixth configuration in FIG. 22 is similar to the fifth configuration in FIG. 19.

Figure 23:
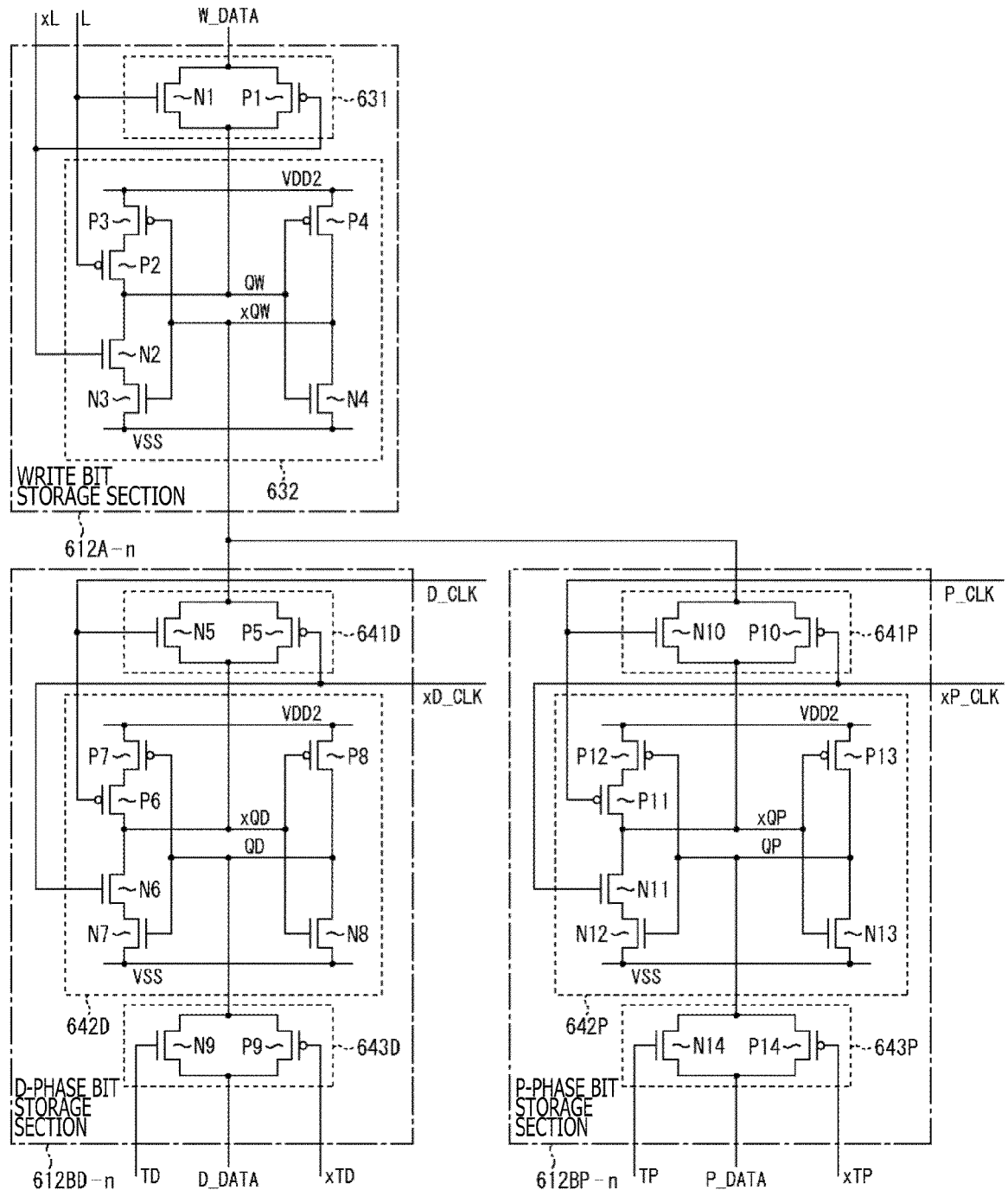
FIG. 23 is a circuit diagram depicting a detailed configuration example of the write bit storage section and the read bit storage section in FIG. 22.

FIG. 23 depicts a detailed configuration example of the write bit storage section 612A-n, P-phase bit storage section 612BP-n, and D-phase bit storage section 612BD-n in FIG. 22.

The write bit storage section 612A-n has the same configuration as that depicted in FIG. 20 and thus will not be discussed further.

The P-phase bit storage section 612BP-n and D-phase bit storage section 612BD-n each have the same configuration as that of the read bit storage section 612B-n depicted in FIG. 20, the configuration being devised for use with P-phase data and for use with D-phase data.

Specifically, the D-phase bit storage section 612BD-n includes the same PMOS transistors P5 to P9 and the same NMOS transistors N5 to N9 as those in the read bit storage section 612B-n in FIG. 20, as well as a transfer gate 641D, a latch storage section 642D, and a transfer gate 643D as those in the transfer gate 641, the latch storage section 642, and the transfer gate 643 for use with D-phase data.

The P-phase bit storage section 612BP-n includes PMOS transistors P10 to P14 and NMOS transistors N10 to N14 corresponding to the PMOS transistors P5 to P9 and the NMOS transistors N5 to N9 in the read bit storage section 612B-n in FIG. 20. The P-phase bit storage section 612BP-n also includes, for use with P-phase data, a transfer gate 641P, a latch storage section 642P, and a transfer gate 643P corresponding to the transfer gate 641, latch storage section 642, and transfer gate 643 in the read bit storage section 612B-n in FIG. 20.

The workings of the P-phase bit storage section 612BP-n and of the D-phase bit storage section 612BD-n are the same as those of the read bit storage section 612B-n depicted in FIG. 20, except that the workings are separately executed for P-phase data and D-phase data.

Figure 24:
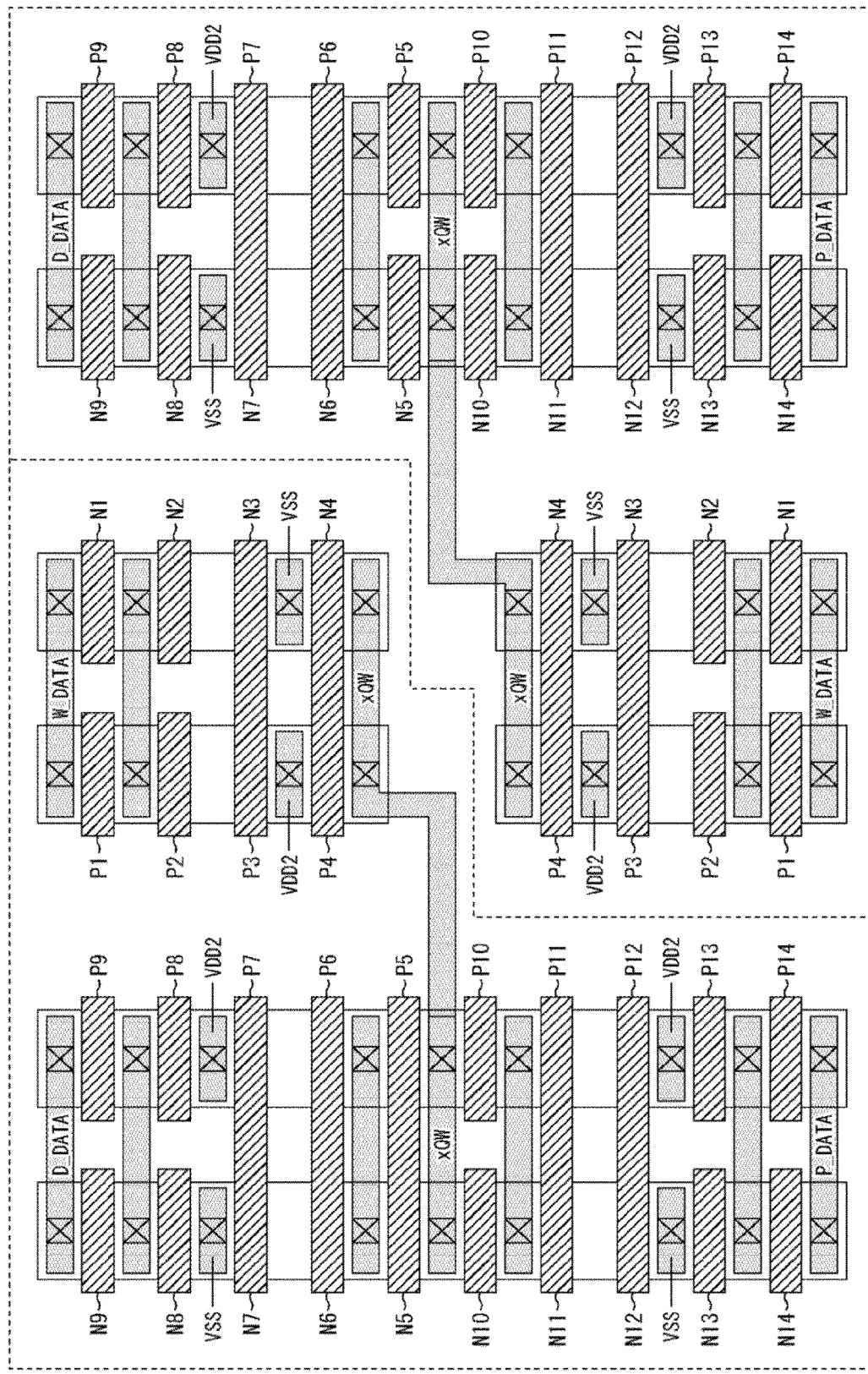
FIG. 24 is a schematic diagram depicting a transistor arrangement example of the write bit storage section and the read bit storage section in FIG. 22.

FIG. 24 depicts a transistor arrangement example of the write bit storage section 612A-n, P-phase bit storage section 612BP-n, and D-phase bit storage sections 612BD-n in FIG. 23.

In FIG. 24, each of the regions enclosed by broken lines corresponds to a single write bit storage section 612A-n, a single P-phase bit storage section 612BP-n, and a single D-phase bit storage sections 612BD-n. Thus in FIG. 24, two write bit storage sections 612A-n, two P-phase bit storage sections 612BP-n, and two D-phase bit storage sections 612BD-n are arranged adjacent to each other. The lines for transmitting the write time code W_DATA and the read time codes P_DATA and D_DATA are shared by another adjacent cluster U.

The differences of the time code transfer section 23 and data storage section 52 between the fifth configuration and the sixth configuration are explained below with reference to FIG. 25.

Subfigure A in FIG. 25 again depicts the time code transfer operation in the fifth configuration as illustrated in Subfigure D in FIG. 21.

Figure 25:
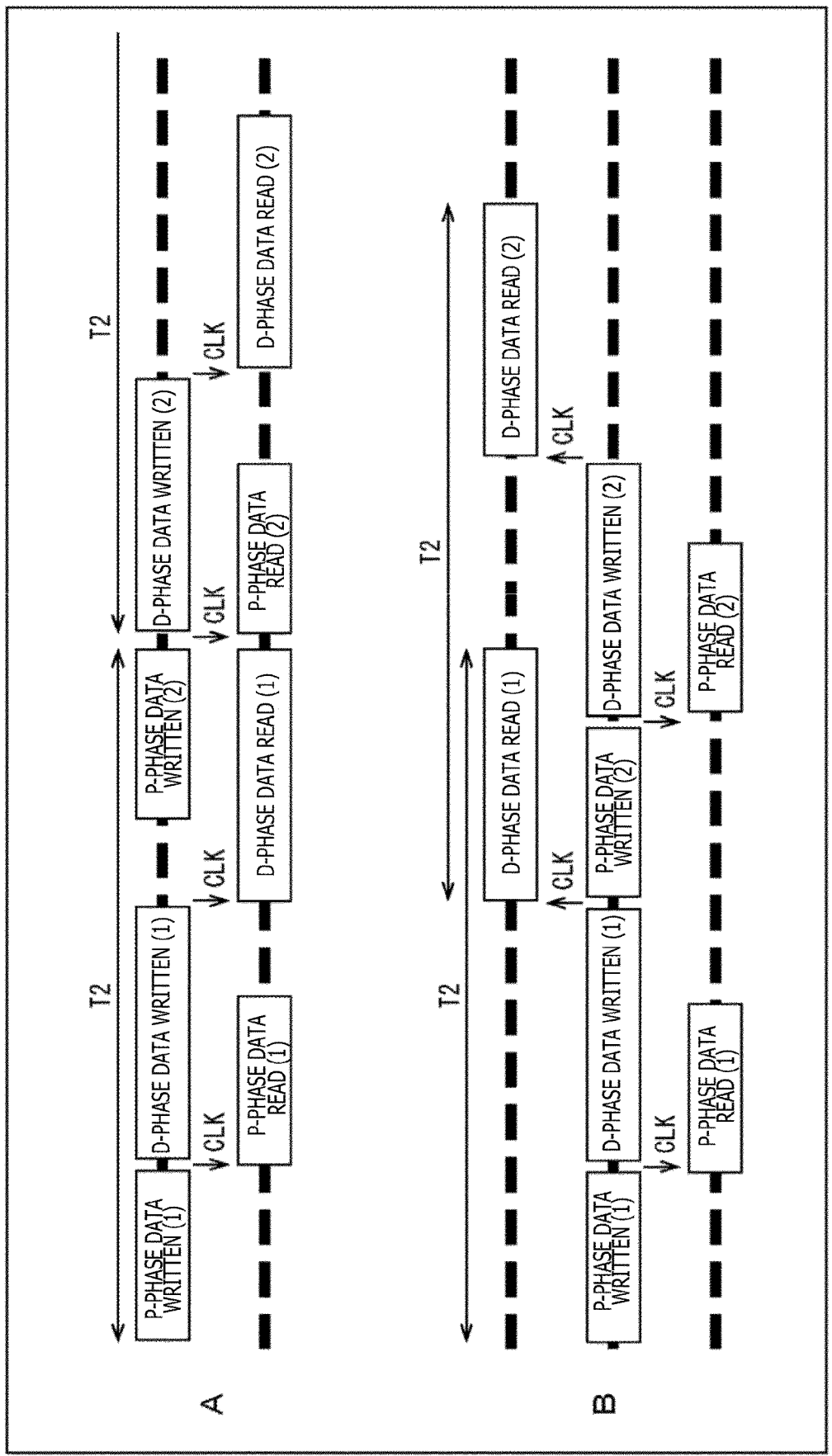
FIG. 25 is a schematic diagram explaining differences between the fifth configuration and the sixth configuration.

Subfigure B in FIG. 25 depicts the time code transfer operation in the sixth configuration.

For example, suppose that upon completion of the writing (2) of P-phase data, the read operation of P-phase data is desired to be immediately started by transferring the time code to the other time code transfer path. However, at this point in the case of the fifth configuration, it is necessary to wait for the reading (1) of D-phase data to be completed before the time code can be transferred, as illustrated in Subfigure A in FIG. 25.

In the case of the sixth configuration, by contrast, upon completion of the writing (2) of P-phase data, the read operation can be immediately started by transferring the time code to the time code transfer path for P-phase data regardless of the reading (1) of D-phase data, for example. That is because the time code transfer path for reading D-phase data is different from the time code transfer path for reading P-phase data as depicted in Subfigure B in FIG. 25. As a result, the operation to read the time code for D-phase data and the operation to read the time code for P-phase data partially overlap for a period of time.

Consequently, while the time required from the time P-phase data is written to a single pixel until the time D-phase data is completely read therefrom amounts to the time T2, the partial overlap between the write and read operations shortens the imaging time for a single image. The sixth configuration thus permits imaging at still higher speeds than the fifth configuration.

Figure 26:
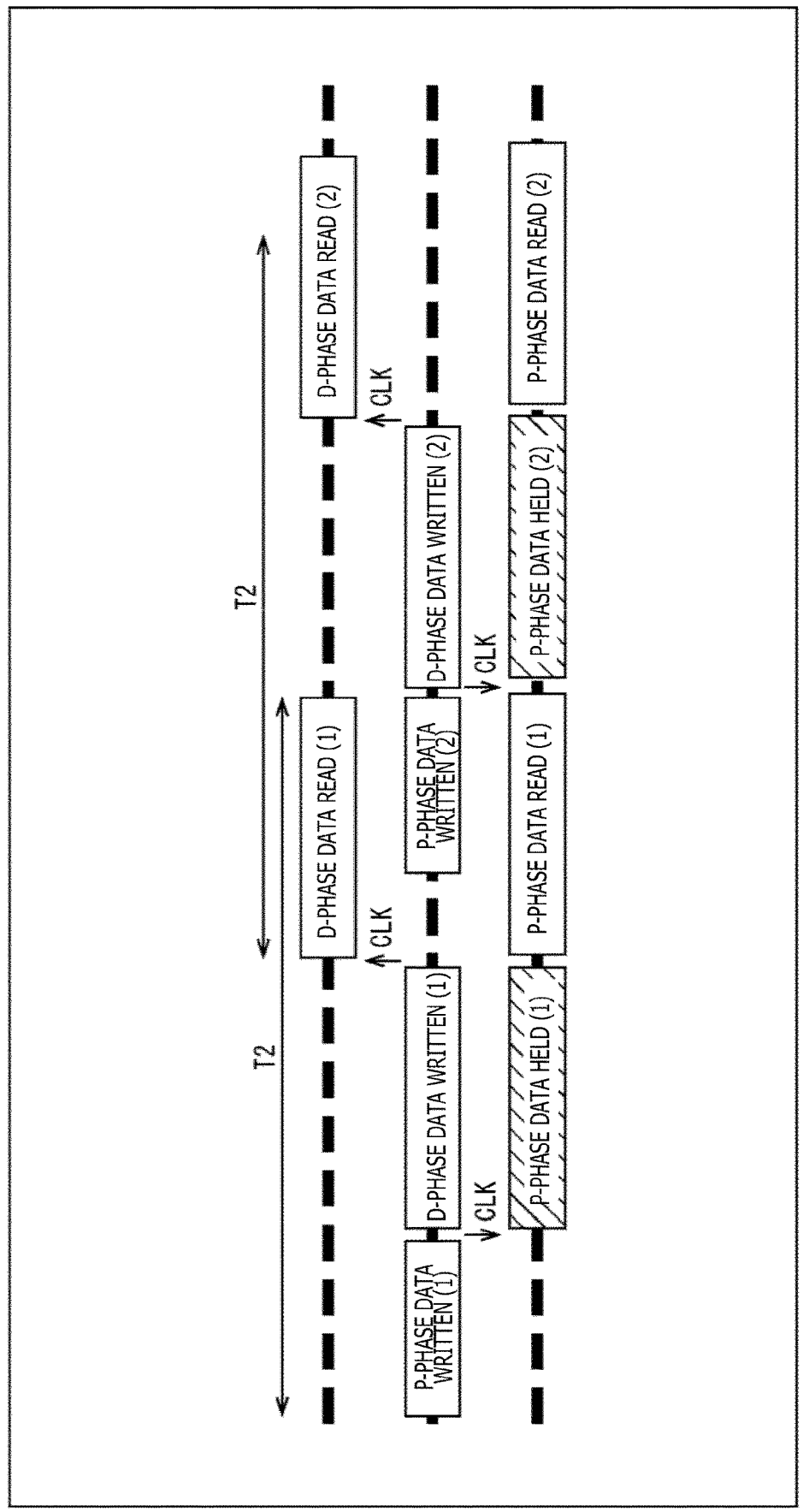
FIG. 26 is a schematic diagram explaining other drive characteristics of the sixth configuration.

The sixth configuration also enables the operation illustrated in FIG. 26.

In Subfigure B in FIG. 25, upon completion of the writing (1) of P-phase data, for example, the P-phase read control section 611BP immediately starts the reading (1) of P-phase data by transferring the time code to the P-phase data time code transfer path indicated at the bottom.

In FIG. 26, by contrast, upon completion of the writing (1) of P-phase data, for example, the P-phase read control section 611BP waits for the reading (1) of D-phase data to be started by the P-phase bit storage sections 612BP-1 to 612BP-N. In synchronism with the timing at which the reading (1) of D-phase data is started, the P-phase read control section 611BP starts the reading (1) of P-phase data. Thus the P-phase read control section 611BP controls the read timing in a manner causing the P-phase data and D-phase data of the same pixel to be transferred in parallel.

In the driving illustrated in Subfigure B in FIG. 25, it is necessary for the output section 28 to have a frame memory in which to store temporarily the P-phase data for carrying out CDS processing. In the driving depicted in FIG. 26, by contrast, the P-phase data and D-phase data of the same pixel are transferred simultaneously so as to let CDS processing be executed without delay. This eliminates the need for the frame memory in which to store P-phase data temporarily.

However, it is to be noted that in the driving such as that depicted in FIG. 26, the transfer of P-phase data via the P-phase time code transfer section 602BP (time code transfer path) and the transfer of D-phase data via the D-phase time code transfer section 602BD (time code transfer path) are performed at (approximately) the same timing. This can cause an increase in operating current, which in turn can incur a drop in power supply voltage.

Figure 27:
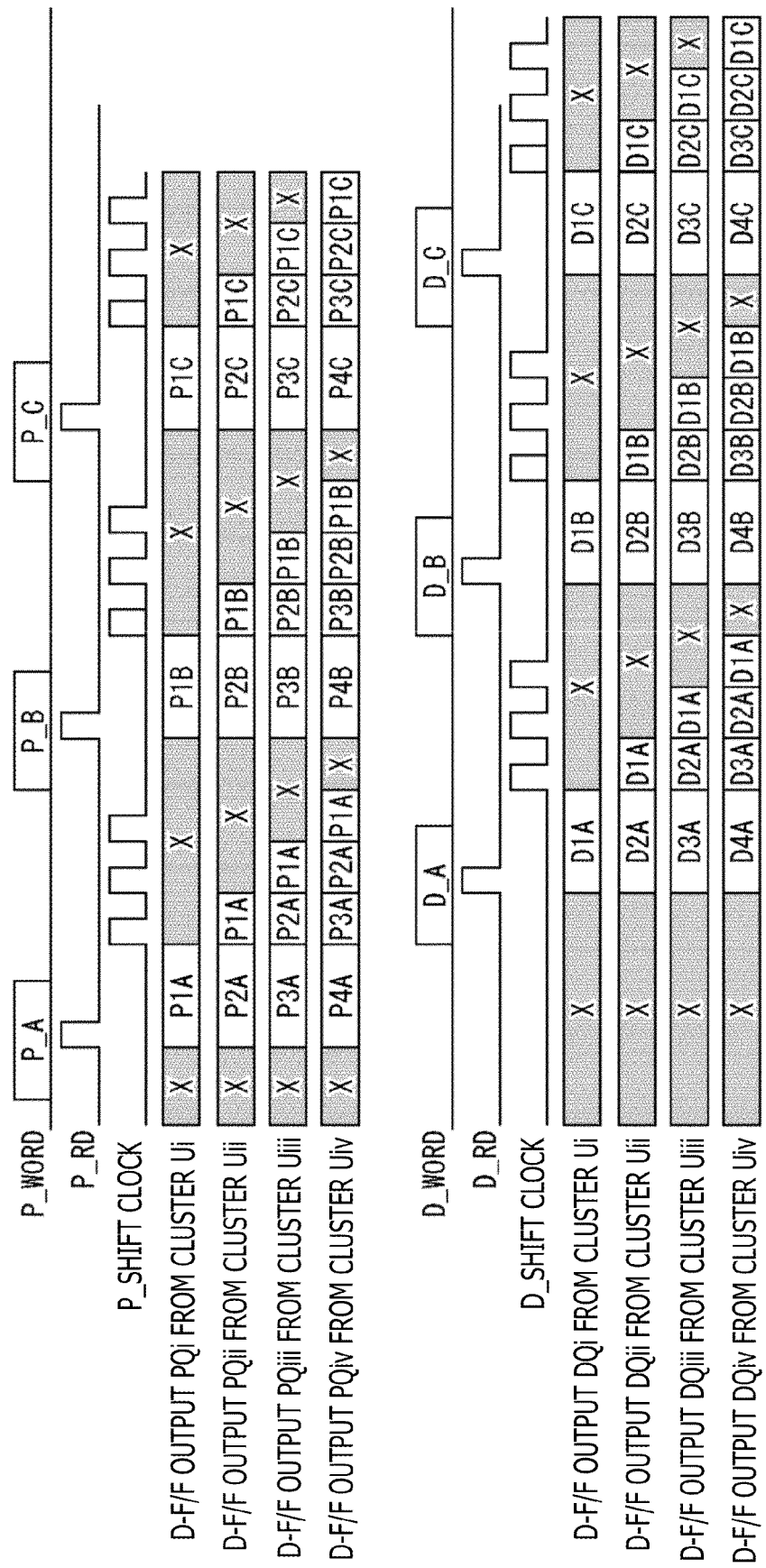
FIG. 27 is a schematic diagram explaining data transfers of a P-phase time code transfer section and a D-phase code transfer section.

Thus the time code transfer section 23 carries out the transfer of P-phase data and the transfer of D-phase data as illustrated in FIG. 27.

The upper half of FIG. 27 depicts the timing of the transfer of P-phase data via the P-phase time code transfer section 602BP (time code transfer path). The lower half of FIG. 27 illustrates the timing of the transfer of D-phase data via the D-phase time code transfer section 602BD (time code transfer path).

The flow of data transfers via the P-phase time code transfer section 602BP and the flow of data transfers via the D-phase time code transfer section 602BD are the same as that in FIG. 14 and thus will not be discussed further. It is assumed that the conditions such as the number of clusters U arrayed in the column direction and the number of pixels in each cluster U are also similar to the conditions in FIG. 14.

The time code transfer section 23 causes the P-phase time code transfer section 602BP and the D-phase time code transfer section 602BD to execute shift clock operations in a complementary manner. More specifically, while the D-phase time code transfer section 602BD is performing a D-phase data transfer operation by shift lock, the P-phase read control section 611BP stores the time code of P-phase data (A/D converted pixel data) into the D-F/Fs 351 in the P-phase time code transfer section 602BP on the basis of a read control signal P-RD. Also, while the P-phase time code transfer section 602BP is carrying out a P-phase data transfer operation by shift clock, the D-phase read control section 611BD stores the time code of D-phase data (A/D converted pixel data) into the D-F/Fs 351 in the D-phase time code transfer section 602BD on the basis of a read control signal D-RD.

When the transfer of P-phase data and the transfer of D-phase data are performed in a complementary manner as described above, the P-phase time code transfer section 602BP and the D-phase time code transfer section 602BD operate with a time difference therebetween. This suppresses the increase in operating current.

Note that the complementary time code transfer operations explained above may also be carried out by multiple time code transfer sections 23 in the above-described first to fifth configurations. For example, the solid-state imaging apparatus 1 adopting the fifth configuration depicted in FIG. 19 may cause the read time code transfer sections 602B in adjacent time code transfer sections 23 inside the pixel array section 22 to execute shift clock operations in a complementary manner.

<11. Seventh Configuration Example of the Data Storage Section and the Time Code Transfer Section>

Figure 28:
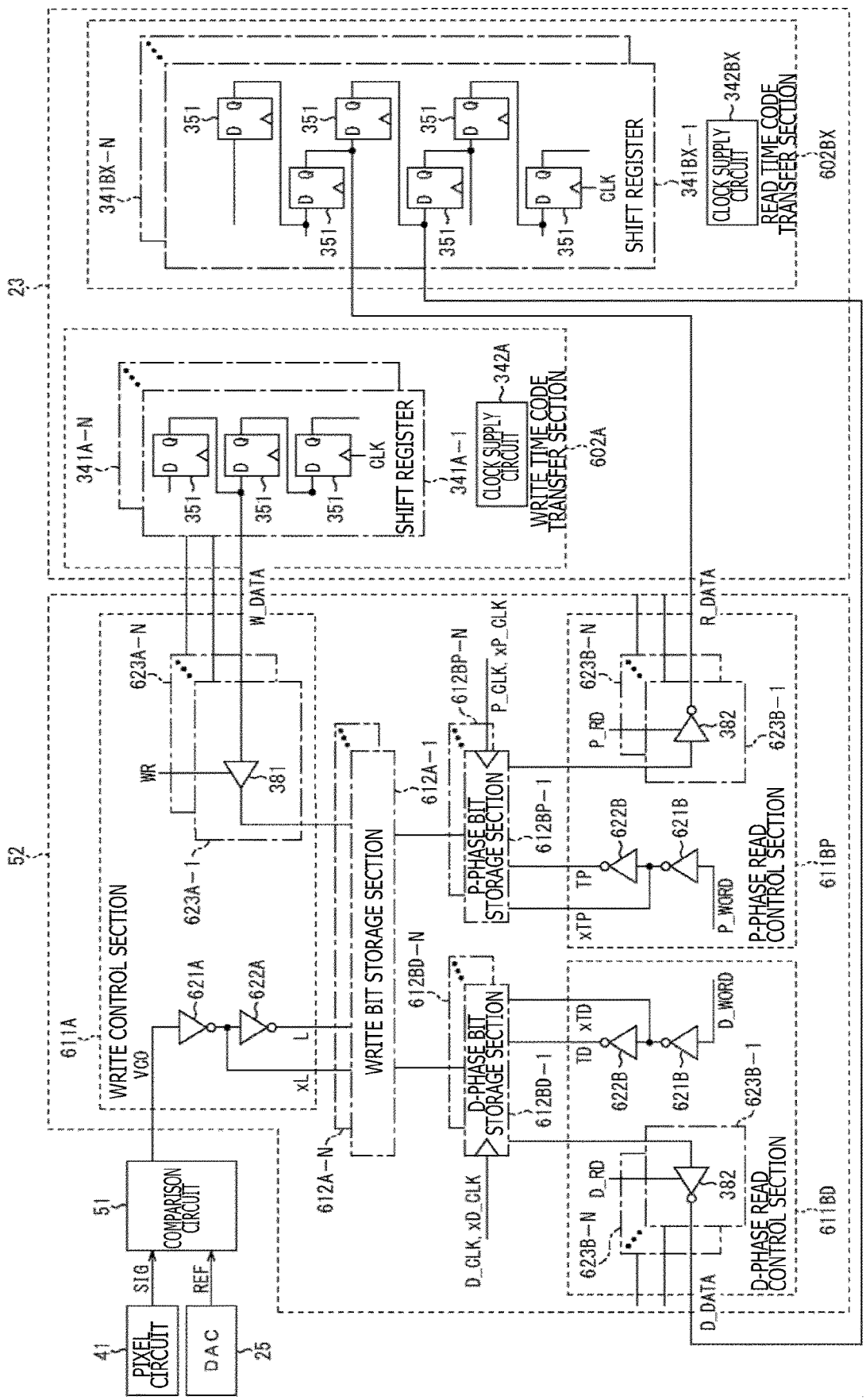
FIG. 28 is a circuit diagram depicting a seventh configuration example of the time code transfer section and the data storage section.

FIG. 28 is a circuit diagram depicting a seventh configuration example of the time code transfer section 23 and the data storage section 52.

The seventh configuration in FIG. 28 is in common with the sixth configuration in FIG. 22 with regard to the data storage section 52 but is different from the sixth configuration with respect to the time code transfer section 23.

Whereas the time code transfer section 23 in the sixth configuration in FIG. 22 includes the write time code transfer section 602A, P-phase time code transfer section 602BP, and D-phase time code transfer section 602BD, the time code transfer section 23 in the seventh configuration in FIG. 28 includes a write time code transfer section 602A and a read time code transfer section 602BX.

In other words, the P-phase time code transfer section 602BP and the D-phase time code transfer section 602BD in the sixth configuration are integrated into the read time code transfer section 602BX. The read time code transfer section 602BX includes N shift registers 341BX-1 to 341BX-N and a clock supply circuit 342BX.

However, compared with the P-phase read control section 611BP and D-phase read control section 611BD in the sixth configuration, the read time code transfer section 602BX has a different number of D-F/Fs 351 in each shift register 341.

Specifically, the number of D-F/Fs 351 in the shift register 341BX of the read time code transfer section 602BX is twice the number of D-F/Fs 351 in the shift register 341B of the P-phase read control section 611BP and D-phase read control section 611BD in the sixth configuration. The P-phase read control section 611BP and the D-phase read control section 611BD are connected with the D-F/Fs 351 in the shift register 341BX in such a manner that P-phase data and D-phase data of the same pixel are alternately transferred. In other words, a D-F/F 351 adjacent to the D-F/F 351 connected with the time code output circuit 623B in the P-phase read control section 611B is connected with the time code output circuit 623B in the D-phase read control section 611BD.

The seventh configuration described above causes the read time code transfer section 602BX to transfer P-phase data and D-phase data alternately. This allows the output section 28 to perform CDS processing without delay, with no need for a frame memory in which to temporarily store P-phase data.

From the viewpoint of circuit area, the seventh configuration is advantageous in cases where the P-phase time code transfer section 602BP for use with P-phase data and the D-phase time code transfer section 602BD for use with D-phase data are difficult to arrange in a similar manner to the sixth configuration in FIG. 22.

<12. Multiple-Substrate Configuration: Case 1>

The above explanation assumed that the solid-state imaging apparatus 1 is formed on a single semiconductor substrate 11. Alternatively, the solid-state imaging apparatus 1 may have its circuits formed in a manner distributed on multiple semiconductor substrates 11.

Figure 29:
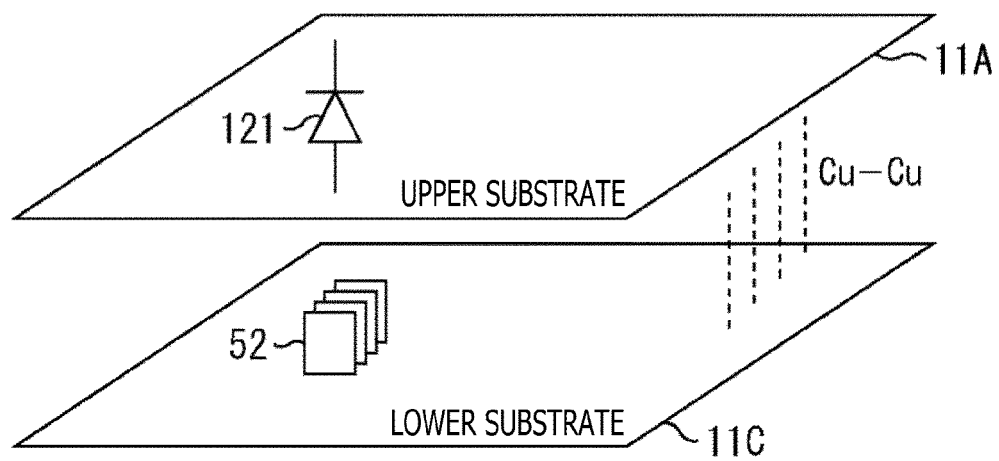
FIG. 29 is a conceptual diagram depicting how two semiconductor substrates are stacked one on top of the other to constitute the solid-state imaging apparatus.

FIG. 29 is a conceptual diagram depicting how two semiconductor substrates, i.e., an upper substrate 11A and a lower substrate 11C, are stacked one on top of the other to constitute the solid-state imaging apparatus 1.

On the upper substrate 11A, at least a pixel circuit 41 including a photodiode 121 is formed. On the lower substrate 11B, at least a data storage section 52 for storing time codes and a time code transfer section 23 are formed. The upper substrate 11A and the lower substrate 11C are bonded with each other by metal bonding such as Cu—Cu bonding.

Figure 30:
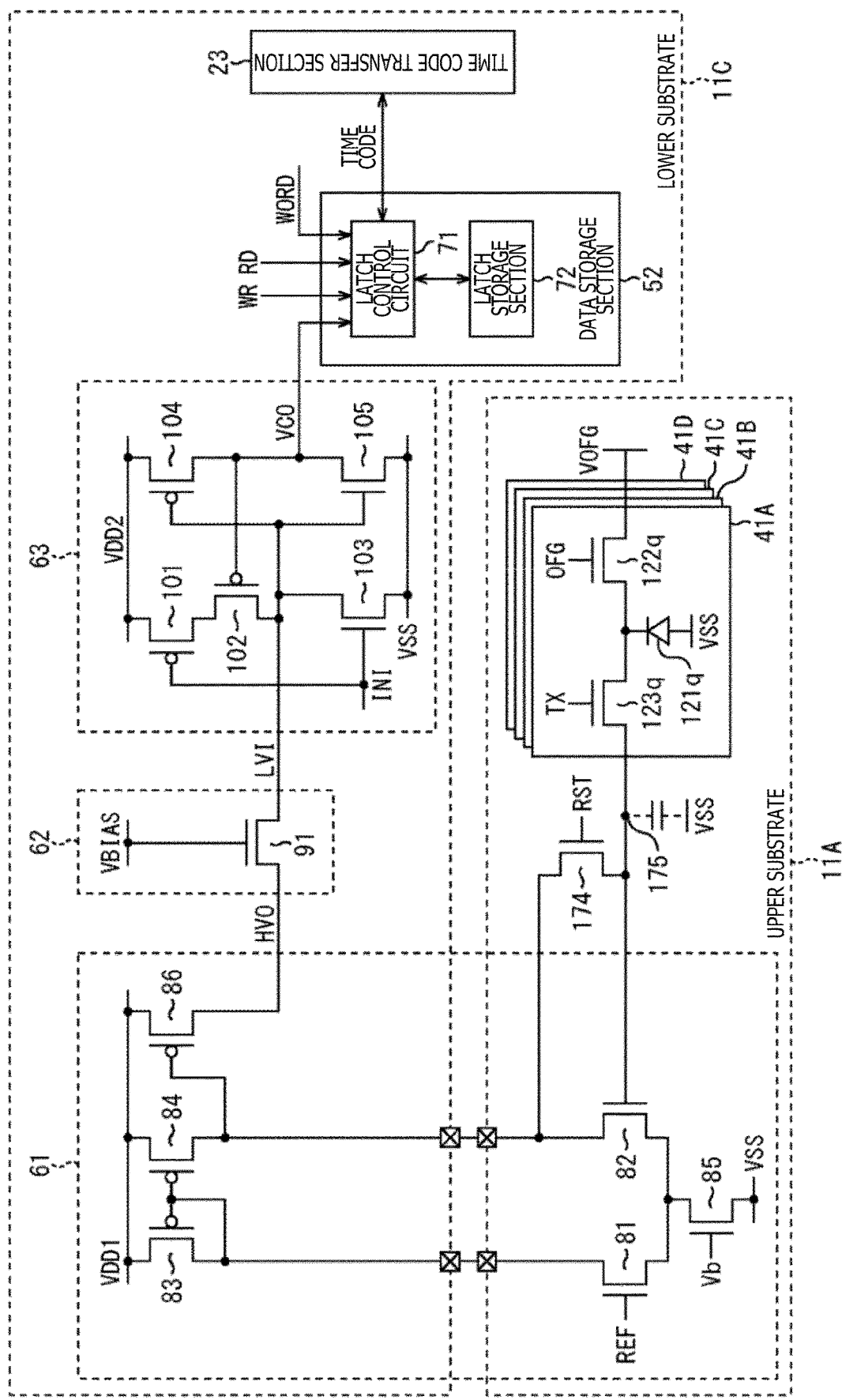
FIG. 30 is a circuit diagram depicting a circuit configuration example in the case where two semiconductor substrates are used to constitute the solid-state imaging apparatus.

FIG. 30 depicts a typical circuit configuration formed on each of the upper substrate 11A and lower substrate 11C.

On the upper substrate 11A, the pixel circuit 41 and a circuit of transistors 81, 82 and 85 of the differential input circuit 61 in the ADC 42 are formed. On the lower substrate 11C, the circuits of the ADC 42 excluding the transistors 81, 82 and 85 and the time code transfer section 23 are formed.

<13. Multiple-Substrate Configuration: Case 2>

Whereas FIGS. 29 and 30 depict examples in which two semiconductor substrate 11 include the solid-state imaging apparatus 1, three semiconductor substrates may be used alternatively to constitute the solid-state imaging apparatus 1.

Figure 31:
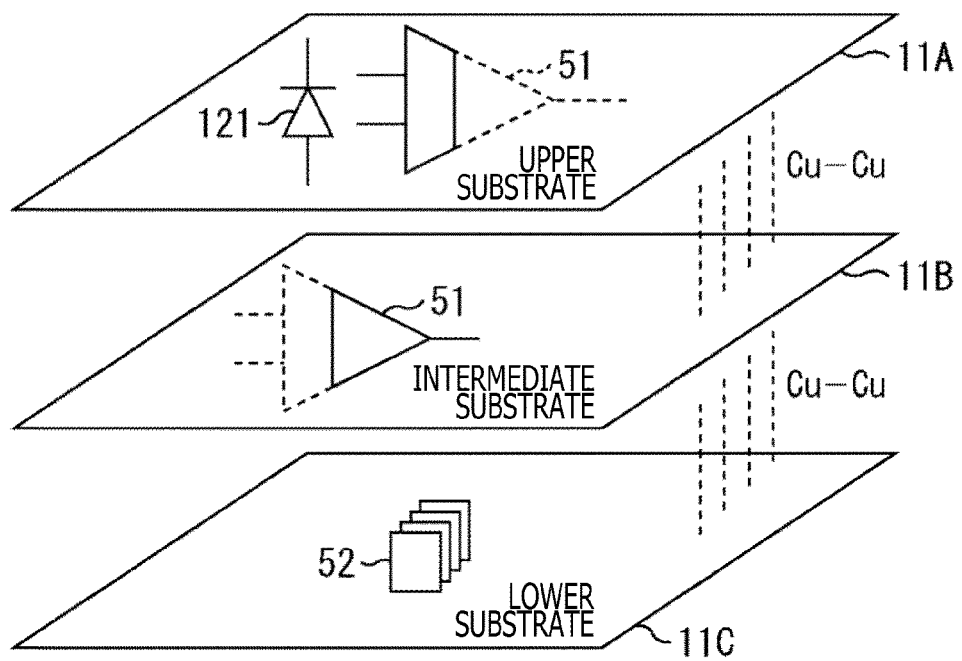
FIG. 31 is a conceptual diagram depicting how three semiconductor substrates are stacked one on top of the other to constitute the solid-state imaging apparatus.

FIG. 31 is a conceptual diagram depicting how three semiconductor substrates, i.e., an upper substrate 11A, an intermediate substrate 11B, and a lower substrate 11C, are stacked one on top of the other to form the solid-state imaging apparatus 1.

On the upper substrate 11A, the pixel circuit 41 including the photodiode 121 and at least part of the circuits of the comparison circuit 51 are formed. On the lower substrate 11C, at least the data storage section 52 for storing time codes and the time code transfer section 23 are formed. On the intermediate substrate 11B, the rest of the circuits of the comparison circuit 51 not arranged on the upper substrate 11A are formed. The upper substrate 11A and the intermediate substrate 11B are bonded with each other by metal bonding such as Cu—Cu bonding, and so are the intermediate substrate 11B and the lower substrate 11C bonded together in like manner.

Figure 32:
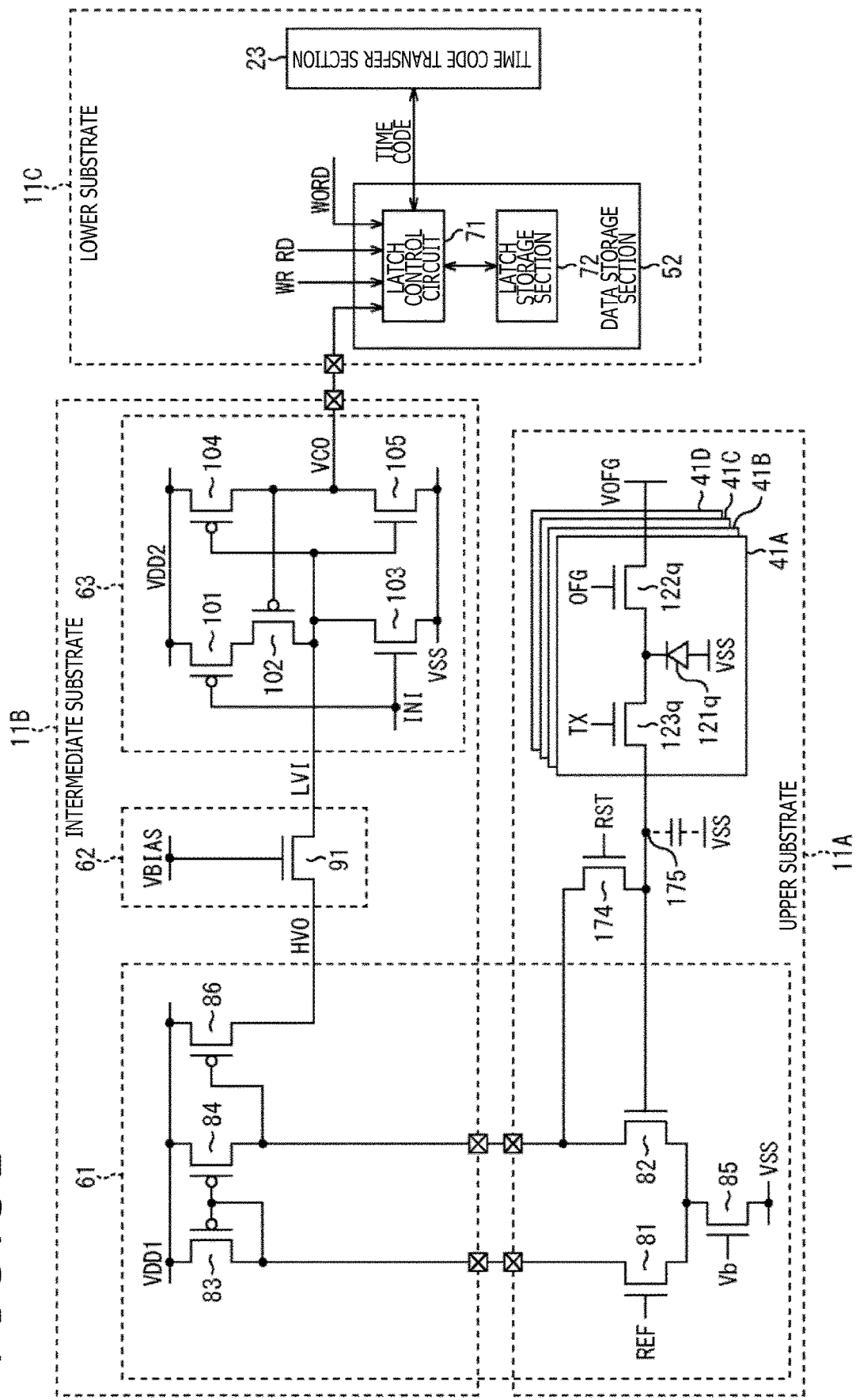
FIG. 32 is a circuit diagram depicting a circuit configuration example in the case where three semiconductor substrates are used to constitute the solid-state imaging apparatus.

FIG. 32 depicts a circuit configuration example in the case where three semiconductor substrates 11 are used to constitute the solid-state imaging apparatus 1.

In the example of FIG. 32, the circuits arranged on the upper substrate 11A are the same as those on the upper substrate 11A illustrated in FIG. 30. The rest of the circuits of the comparison circuit 51 are arranged on the intermediate substrate 11B. The data storage section 52 and the time code transfer section 23 are arranged on the lower substrate 11C.

<14. Example of Application to Electronic Equipment>

The present disclosure is not limited in application to the solid-state imaging apparatus. That is, the disclosure is applicable to all types of electronic equipment using the solid-state imaging apparatus in its image capture section (photoelectric conversion section), such as imaging apparatuses including digital still cameras and video cameras, portable terminal devices having an imaging function, and photocopiers using the solid-state imaging apparatus in their image capture section. The solid-state imaging apparatus may be formed as a single chip or in the form of a module having an imaging function that integrates both the imaging section and the signal processing section or the optical assembly in a package.

FIG. 33 is a block diagram depicting a configuration example of an imaging apparatus as electronic equipment embodying the present disclosure.

An imaging apparatus 800 in FIG. 33 includes an optical section 801 having a group of lenses, a solid-state imaging apparatus (imaging device) 802 that adopts the configuration of the solid-state imaging apparatus 1 in FIG. 1, and a DSP (Digital Signal Processor) circuit 803 as a camera signal processing circuit. The imaging apparatus 800 also includes a frame memory 804, a display section 805, a recording section 806, an operation section 807, and a power supply section 808. The DSP circuit 803, frame memory 804, display section 805, recording section 806, operation section 807, and power supply section 808 are interconnected via a bus line 809.

The optical section 801 captures incident light (image light) from an object and forms its image on the imaging plane of the solid-state imaging apparatus 802. The solid-state imaging apparatus 802 converts to an electrical signal the intensity of the incident light of which the image is formed on the imaging plane by the optical section 801, the electrical signal being output as a pixel signal. Used here as the solid-state imaging apparatus 802 may be the solid-state imaging apparatus 1 in FIG. 1, i.e., the solid-state imaging apparatus including the comparison circuit 51 that improves the determination speed at the time of subjecting the pixel signal to A/D conversion while reducing power consumption, and the time code transfer section 23 that achieves high-speed operations.

The display section 805 may be a panel type display apparatus such as a liquid crystal display panel or an organic EL (Electro Luminescence) panel. The display section 805 displays moving or still images captured by the solid-state imaging apparatus 802. The recording section 806 records the imaging or still images captured by the solid-state imaging apparatus 802 to recording media such as a hard disk or a semiconductor memory.

When operated by the user, the operation section 807 issues operation commands regarding diverse functions possessed by the imaging apparatus 800. The power supply section 808 supplies varying operating power, as needed, to the DSP circuit 803, frame memory 804, display section 805, recording section 806, and operation section 807 that are power supply targets.

As described above, when the solid-state imaging apparatus 1 adopting any one of the configurations discussed above is used as the solid-state imaging apparatus 802, the determination speed for A/D conversion is improved, and the apparatus is operated at high speeds. This translates into imaging at high speeds and reduced power consumption of the imaging apparatus 800 such as video cameras, digital still cameras, or the camera module intended for mobile devices such as mobile phones.

It was explained above that the comparison circuit 51 and the ADC 42 are components incorporated in the solid-state imaging apparatus 1. Alternatively, these components may each be procured as an individually marketed product (comparator, A/D converter).

The present disclosure may be applied not only to the solid-state imaging apparatus but also to all types of semiconductor devices furnished with other integrated semiconductor circuits.

The embodiments of the present disclosure are not limited to those discussed above. The embodiments may be modified, altered, or improved in diverse fashion within the scope and spirit of the present disclosure.

It was explained that the circuit configurations of the above embodiments are electrically charged with electrons. Alternatively, according to the present disclosure, circuit configurations may be devised to be electrically charged with positive holes. Each of the above-described circuit configurations can also be implemented even when transistor polarities are reversed therein (between NMOS transistors and PMOS transistors). In this case, the control signals input to the transistors are switched between the high and low levels.

It was explained that in each of the above embodiments, the reference signal REF is a slope signal of which the level (voltage) drops monotonously over time. Alternatively, the reference signal REF may be a slope signal whose level (voltage) increases monotonously over time.

It was explained that in each of the embodiments above, a single ADC 42 is shared by four pixels 21 in cases where the sharing scheme is adopted. Alternatively, some other number (e.g., 8) of pixels 21 may share each ADC 42.

As another alternative, suitable combinations of some or all of the above-described embodiments may each be adopted as an embodiment of the disclosure. It is also possible to implement an embodiment by suitably combining other embodiments of the present disclosure than those discussed above.

In FIG. 1, the time code generation section 26 is arranged in the upper part of the drawing and the output section 28 in the lower part of the drawing. Alternatively, the time code generation section 26 and the output section 28 may be alternately arranged so that the time codes may be transferred in a vertically reverse direction between the clusters U adjacent to each other in the horizontal direction. For example, for a horizontally odd-numbered cluster U counted from the DAC 25, the time code generation section 26 is arranged in the upper part and the output section 28 in the lower part so that the time codes may be transferred from top to bottom. For a horizontally even-numbered cluster U counted from the DAC 25, the time code generation section 26 is arranged in the lower part and the output section 28 in the upper part so that the time codes may be transferred from bottom to top. These arrangements prevent the circuits of the time code generation sections 26 and of the output sections 28 from being locally congested.

Note that the advantageous effects stated in this description are only examples and are not limitative of the present disclosure. There may be additional advantageous effects derived from and not covered by this description.

Note that the present disclosure may be implemented preferably in the following configurations:

(1)

A solid-state imaging apparatus including:
an A/D converter; and
multiple time code transfer sections,
in which the A/D converter includes
a differential input circuit configured to operate on a first power supply voltage and to output a signal when a voltage of a pixel signal is higher than a voltage of a reference signal,
a positive feedback circuit configured to operate on a second power supply voltage lower than the first power supply voltage and to accelerate a transition rate at which a comparison result signal indicative of the result of a comparison in voltage between the pixel signal and the reference signal is inverted, on a basis of the output signal from the differential input circuit,
a voltage conversion circuit configured to convert the output signal from the differential input circuit into a signal corresponding to the second power supply voltage, and
a data storage section configured to store a time code at the time the comparison result signal is inverted, and
the multiple time code transfer sections each include a shift register configured to transfer the time code.

(2)

The solid-state imaging apparatus as stated in paragraph (1) above, in which the multiple time code transfer sections include a write time code transfer section configured to transfer the time code to be written to the data storage section, and a read time code transfer section configured to transfer the time code read from the data storage section.

(3)

The solid-state imaging apparatus as stated in paragraph (2) above, in which the multiple time code transfer sections include the multiple read time code transfer sections.

(4)

The solid-state imaging apparatus as stated in paragraph (3) above, in which the multiple read time code transfer sections include a P-phase time code transfer section configured to transfer the time code for use with P-phase data read from the data storage section, and a D-phase time code transfer section configured to transfer the time code for use with D-phase data read from the data storage section.

(5)

The solid-state imaging apparatus as stated in paragraph (4) above,
in which the data storage section includes a P-phase data storage section configured to store the time code for use with P-phase data, and a D-phase data storage section configured to store the time code for use with D-phase data;
the P-phase time code transfer section transfers the time code for use with P-phase data written in the P-phase data storage section; and
the D-phase time code transfer section transfers the time code for use with D-phase data written in the D-phase data storage section.

(6)

The solid-state imaging apparatus as stated in paragraph (5) above, in which the P-phase time code transfer section transfers the time code for use with P-phase data written in the P-phase data storage section at a same timing as that of the D-phase time code transfer section transferring the time code for use with D-phase data.

(7)

The solid-state imaging apparatus as stated in paragraph (5) above, in which the P-phase time code transfer section executes shift clock on the shift registers in a manner complementary to the D-phase time code transfer section executing shift clock on the shift registers.

(8)

The solid-state imaging apparatus as stated in paragraph (2) above, in which the read time code transfer section alternately transfers the time code for use with P-phase data and the time code for use with D-phase data.

(9)

The solid-state imaging apparatus as stated in paragraph (1) above, in which the multiple time code transfer sections include a P-phase time code transfer configured to transfer the time code for use with P-phase data, and a D-phase tie code transfer section configured to transfer the time code for use with D-phase data.

(10)

The solid-state imaging apparatus as stated in any one of paragraphs (2) to (6) above, in which the data storage section includes a write data storage section configured to store the time code supplied from the write time code transfer section, and a read data storage section configured to store the time code to be supplied to the read time code transfer section.

(11)

The solid-state imaging apparatus as stated in any one of paragraphs (2) to (6) above, in which the data storage section includes a write data storage section configured to store the time code supplied from the write time code transfer section, a P-phase data storage section configured to store the time code for use with P-phase data, and a D-phase data storage section configured to store the time code for use with D-phase data.

(12)

The solid-state imaging apparatus as stated in paragraph (1) above, in which the data storage section includes a P-phase data storage section configured to store the time code for use with P-phase data, and a D-phase data storage section configured to store the time code for use with D-phase data.

(13)

The solid-state imaging apparatus as stated in paragraph (12) above, further including:

a bidirectional buffer configured to switch a write operation and a read operation of the time code on the data storage section.

(14)

The solid-state imaging apparatus as stated in any one of paragraphs (1) to (13) above, in which the shift register includes multiple D-F/Fs each brought into a high-impedance state when an input clock signal has a predetermined value.

(15)

The solid-state imaging apparatus as stated in any one of paragraphs (1) to (14) above, in which the A/D converter is shared by multiple pixels.

(16)

The solid-state imaging apparatus as stated in any one of paragraphs (1) to (14) above, in which the A/D converter is arranged for each pixel.

(17)

The solid-state imaging apparatus as stated in any one of paragraphs (1) to (16) above, further including:

multiple semiconductor substrates.

(18)

A method for driving a solid-state imaging apparatus that has an A/D converter and multiple time code transfer sections, the A/D converter including a differential input circuit configured to operate on a first power supply voltage, a positive feedback circuit configured to operate on a second power supply voltage lower than the first power supply voltage, a comparator having a voltage conversion circuit, and a data storage section, the multiple time code transfer sections each including a shift register, the method including:

causing the differential input circuit to output a signal when a voltage of a pixel signal is higher than a voltage of a reference signal;

causing the voltage conversion circuit to convert the output signal from the differential input circuit into a signal corresponding to the second power supply voltage;

causing the positive feedback circuit to accelerate a transition rate at which a comparison result signal indicative of the result of a comparison in voltage between the pixel signal and the reference signal is inverted, on a basis of the output signal of the differential input circuit converted by the voltage conversion circuit;

causing the data storage section to store a time code at the time the comparison result signal is inverted; and causing each of the multiple time code transfer sections to transfer the time code.

(19)

Electronic equipment including:

a solid-state imaging apparatus having an A/D converter and multiple time code transfer sections, in which the A/D converter includes a differential input circuit configured to operate on a first power supply voltage and to output a signal when a voltage of a pixel signal is higher than a voltage of a reference signal, a positive feedback circuit configured to operate on a second power supply voltage lower than the first power supply voltage and to accelerate a transition rate at which a comparison result signal indicative of the result of a comparison in voltage between the pixel signal and the reference signal is inverted, on a basis of the output signal from the differential input circuit, a voltage conversion circuit configured to convert the output signal from the differential input circuit into a signal corresponding to the second power supply voltage, and a data storage section configured to store a time code at the time the comparison result signal is inverted, and the multiple time code transfer sections each include a shift register configured to transfer the time code.

REFERENCE SIGNS LIST

1 Solid-state imaging apparatus, 21 Pixel, 22 Pixel array section, 23 Time code transfer section, 26 Time code generation section, 28 Output section, 41 Pixel circuit, 42 ADC, 51 Comparison circuit, 52 Data storage section, 61 Differential input circuit, 62 Voltage conversion circuit, 63 Positive feedback circuit, 71 Latch control circuit, 72 Latch storage section, 81 to 86, 91 Transistor, 101 to 105 Transistor, 242P-1 to 242P-N P-phase bit storage section, 242D-1 to 242D-N D-phase bit storage section, 341 Shift resister, 342 Clock supply circuit, 351 D-F/F, 371 Bidirectional buffer circuit, 601P P-phase time code transfer section, 601D D-phase time code transfer section, 602A Write time code transfer section, 602B Read time code transfer section, 602BP P-phase time code transfer section, 602BD D-phase time code transfer section, 612A-1 to 612A-N Write bit storage section, 612B-1 to 612B-N Read bit storage section, 612BP-1 to 612BP-N P-phase bit storage section, 612BD-1 to 612BD-N D-phase bit storage section, 800 Imaging apparatus, 802 Solid-state imaging apparatus

What is claimed is:

1. A solid-state imaging apparatus comprising:
an analog-digital ("A/D") convertor including:
   a differential input circuit configured to operate on a first power supply voltage and to output a signal when a voltage of a pixel signal is higher than a voltage of a reference signal,
   a positive feedback circuit configured to operate on a second power supply voltage lower than the first power supply voltage and to accelerate a transition rate at which a comparison result signal indicative of a result of a comparison in voltage between the pixel signal and the reference signal is inverted on a basis of the signal output from the differential input circuit,
   a voltage conversion circuit configured to convert the signal output from the differential input circuit into a signal corresponding to the second power supply voltage, and
   a data storage section configured to store a time code at a time the comparison result signal is inverted; and
a plurality of time code transfer sections, wherein each of time code transfer section includes:
   a shift register configured to transfer the time code,
   a write time code transfer section configured to transfer the time code to the data storage section, and
   a read time code transfer section configured to transfer the time code from the data storage section.

2. The solid-state imaging apparatus according to claim 1, wherein each read time code transfer section includes a P-phase time code transfer section configured to transfer the time code for use with P-phase data read from the data storage section and a D-phase time code transfer section configured to transfer the time code for use with D-phase data read from the data storage section.

3. The solid-state imaging apparatus according to claim 2, wherein:
   the data storage section includes a P-phase data storage section configured to store the time code for use with P-phase data and a D-phase data storage section configured to store the time code for use with D-phase data;
   the P-phase time code transfer section transfers the time code for use with P-phase data written in the P-phase data storage section; and
   the D-phase time code transfer section transfers the time code for use with D-phase data written in the D-phase data storage section.

4. The solid-state imaging apparatus according to claim 3, wherein the P-phase time code transfer section transfers the time code for use with P-phase data written in the P-phase data storage section at a same timing as that of the D-phase time code transfer section transferring the time code for use with D-phase data.

5. The solid-state imaging apparatus according to claim 3, wherein the P-phase time code transfer section executes shift clock on the shift registers in a manner complementary to the D-phase time code transfer section executing shift clock on the shift registers.

6. The solid-state imaging apparatus according to claim 1, wherein the read time code transfer section alternately transfers the time code for use with P-phase data and the time code for use with D-phase data.

7. The solid-state imaging apparatus according to claim 1, wherein each time code transfer section includes a P-phase time code transfer configured to transfer the time code for use with P-phase data and a D-phase time code transfer section configured to transfer the time code for use with D-phase data.

8. The solid-state imaging apparatus according to claim 1, wherein the data storage section includes a write data storage section configured to store the time code supplied from the write time code transfer section, and a read data storage section configured to store the time code to be supplied to the read time code transfer section.

9. The solid-state imaging apparatus according to claim 1, wherein the data storage section includes a write data storage section configured to store the time code supplied from the write time code transfer section, a P-phase data storage section configured to store the time code for use with P-phase data, and a D-phase data storage section configured to store the time code for use with D-phase data.

10. The solid-state imaging apparatus according to claim 1, wherein the data storage section includes a P-phase data storage section configured to store the time code for use with P-phase data and a D-phase data storage section configured to store the time code for use with D-phase data.

11. The solid-state imaging apparatus according to claim 10, further comprising:
   a bidirectional buffer configured to switch a write operation and a read operation of the time code on the data storage section.

12. The solid-state imaging apparatus according to claim 1, wherein each shift register includes a plurality of D-F/Fs each brought into a high-impedance state when an input clock signal has a predetermined value.

13. The solid-state imaging apparatus according to claim 1, wherein the A/D converter is shared by a plurality of pixels.

14. The solid-state imaging apparatus according to claim 13, wherein the A/D converter is arranged for each pixel.

15. The solid-state imaging apparatus according to claim 1, further comprising:
   a plurality of semiconductor substrates.

16. A method for driving a solid-state imaging apparatus comprising:
an analog-digital ("A/D") converter including:
   a differential input circuit configured to operate on a first power supply voltage,
   a positive feedback circuit configured to operate on a second power supply voltage lower than the first power supply voltage,
   a comparator having a voltage conversion circuit, and
   a data storage section, and
a plurality of time code transfer sections each including a shift register,
the method comprising:
   causing the differential input circuit to output a signal when a voltage of a pixel signal is higher than a voltage of a reference signal;
   causing the voltage conversion circuit to convert the signal output from the differential input circuit into a signal corresponding to the second power supply voltage;
   causing the positive feedback circuit to accelerate a transition rate at which a comparison result signal indicative of a result of a comparison in voltage between the pixel signal and the reference signal is inverted, inverted on a basis of the signal output by the differential input circuit converted by the voltage conversion circuit;

causing the data storage section to store a time code at a time the comparison result signal is inverted; and causing each of the plurality of time code transfer sections to transfer the time code, wherein each time code transfer section includes:
  a shift register configured to transfer the time code,
  a write time code transfer section configured to transfer the time code to the data storage section, and
  a read time code transfer section configured to transfer the time code from the data storage section.

17. Electronic equipment comprising:
a solid-state imaging apparatus comprising:
  an analog-digital ("A/D") convertor including:
    a differential input circuit configured to operate on a first power supply voltage and to output a signal when a voltage of a pixel signal is higher than a voltage of a reference signal,
    a positive feedback circuit configured to operate on a second power supply voltage lower than the first power supply voltage and to accelerate a transition rate at which a comparison result signal indicative of a result of a comparison in voltage between the pixel signal and the reference signal is inverted on a basis of the signal output from the differential input circuit,
    a voltage conversion circuit configured to convert the output signal output from the differential input circuit into a signal corresponding to the second power supply voltage, and
    a data storage section configured to store a time code at a time the comparison result signal is inverted, and
  a plurality of time code transfer sections, wherein each time code transfer includes:
    a shift register configured to transfer the time code
    a write time code transfer section configured to transfer the time code to the data storage section, and
    a read time code transfer section configured to transfer the time code from the data storage section.

18. The electronic equipment of claim 17, wherein each read time code transfer section includes a P-phase time code transfer section configured to transfer the time code for use with P-phase data read from the data storage section.

19. The electronic equipment of claim 18, wherein each read time code transfer section further includes a D-phase time code transfer section configured to transfer the time code for use with D-phase data read from the data storage section.

20. The electronic equipment of claim 19, wherein the data storage section includes a P-phase data storage section configured to store the time code for use with P-phase data and a D-phase data storage section configured to store the time code for use with D-phase data.

* * * * *